US009153699B2

(12) United States Patent
Yamazaki

(10) Patent No.: US 9,153,699 B2
(45) Date of Patent: Oct. 6, 2015

(54) THIN FILM TRANSISTOR WITH MULTIPLE OXIDE SEMICONDUCTOR LAYERS

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 156 days.

(21) Appl. No.: 13/916,167

(22) Filed: Jun. 12, 2013

(65) Prior Publication Data
US 2013/0334533 A1 Dec. 19, 2013

(30) Foreign Application Priority Data

Jun. 15, 2012 (JP) .................................. 2012-136438
Jun. 22, 2012 (JP) .................................. 2012-141373

(51) Int. Cl.
H01L 29/78 (2006.01)
H01L 29/786 (2006.01)
(52) U.S. Cl.
CPC .......... H01L 29/7869 (2013.01); H01L 29/786 (2013.01)
(58) Field of Classification Search
CPC ......... H01L 29/786; H01L 29/7869–29/78696
USPC .................. 257/E51.005–E51.006; 438/149, 438/151–155, 162
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Masaya Nakayama et al.; "17a-TL-8 Effect of GaO Layer on IGZO-TFT Channel"; Extended Abstracts (The 57th Spring Meeting 2010), The Japan Society of Applied Physics and Related Societies; Mar. 17, 2010; p. 21-008, with English translation.

(Continued)

*Primary Examiner* — Laura Menz
*Assistant Examiner* — Maliheh Malek
(74) *Attorney, Agent, or Firm* — Fish & Richardson P.C.

(57) ABSTRACT

A transistor having high field-effect mobility is provided. In order that an oxide semiconductor layer through which carriers flow is not in contact with a gate insulating film, a buried channel structure in which the oxide semiconductor layer through which carriers flow is separated from the gate insulating film is employed. Specifically, an oxide semiconductor layer having high conductivity is provided between two oxide semiconductor layers. Further, an impurity element is added to the oxide semiconductor layer in a self-aligned manner so that the resistance of a region in contact with an electrode layer is reduced. Further, the oxide semiconductor layer in contact with the gate insulating layer has a larger thickness than the oxide semiconductor layer having high conductivity.

20 Claims, 23 Drawing Sheets

(56) References Cited

U.S. PATENT DOCUMENTS

| | | | |
|---|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,855,379 B2 | 12/2010 | Hayashi et al. |
| 7,923,722 B2 | 4/2011 | Ryu et al. |
| 7,960,727 B2 * | 6/2011 | Nakahara et al. | 257/43 |
| 7,994,500 B2 | 8/2011 | Kim et al. |
| 8,058,645 B2 * | 11/2011 | Jeong et al. | 257/43 |
| 8,088,652 B2 | 1/2012 | Hayashi et al. |
| 8,148,779 B2 | 4/2012 | Jeong et al. |
| 8,188,480 B2 * | 5/2012 | Itai | 257/72 |
| 8,202,365 B2 | 6/2012 | Umeda et al. |
| 8,203,143 B2 | 6/2012 | Imai |
| 8,274,078 B2 | 9/2012 | Itagaki et al. |
| 8,421,083 B2 | 4/2013 | Yamazaki et al. |
| 8,426,851 B2 * | 4/2013 | Morosawa et al. | 257/43 |
| 8,471,256 B2 | 6/2013 | Yamazaki et al. |
| 8,502,221 B2 | 8/2013 | Yamazaki |
| 8,530,285 B2 | 9/2013 | Yamazaki et al. |
| 8,901,552 B2 * | 12/2014 | Yamazaki et al. | 257/43 |
| 8,916,866 B2 * | 12/2014 | Godo et al. | 257/43 |
| 8,952,381 B2 * | 2/2015 | Yamazaki | 257/43 |
| 2001/0046027 A1 | 11/2001 | Tai et al. |
| 2002/0056838 A1 | 5/2002 | Ogawa |
| 2002/0096684 A1 * | 7/2002 | Brandes et al. | 257/77 |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 * | 12/2008 | Ryu et al. | 257/43 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2010/0044701 A1 | 2/2010 | Sano et al. |
| 2010/0065844 A1 | 3/2010 | Tokunaga |
| 2010/0084651 A1 * | 4/2010 | Yamazaki et al. | 257/43 |
| 2010/0092800 A1 | 4/2010 | Itagaki et al. |
| 2010/0102313 A1 * | 4/2010 | Miyairi et al. | 257/43 |
| 2010/0109002 A1 | 5/2010 | Itagaki et al. |
| 2010/0117074 A1 * | 5/2010 | Yamazaki et al. | 257/43 |
| 2010/0163868 A1 * | 7/2010 | Yamazaki et al. | 257/43 |
| 2010/0176383 A1 | 7/2010 | Park et al. |
| 2010/0181565 A1 * | 7/2010 | Sakata et al. | 257/43 |
| 2010/0301326 A1 * | 12/2010 | Miyairi et al. | 257/43 |
| 2010/0301329 A1 | 12/2010 | Asano et al. |
| 2010/0320458 A1 | 12/2010 | Umeda et al. |
| 2010/0320459 A1 | 12/2010 | Umeda et al. |
| 2010/0330738 A1 * | 12/2010 | Uchiyama et al. | 438/104 |
| 2011/0024751 A1 | 2/2011 | Yamazaki et al. |
| 2011/0037068 A1 * | 2/2011 | Yamazaki et al. | 257/43 |
| 2011/0073856 A1 * | 3/2011 | Sato et al. | 257/43 |
| 2011/0090204 A1 | 4/2011 | Yamazaki et al. |
| 2011/0127522 A1 * | 6/2011 | Yamazaki | 257/43 |
| 2011/0127524 A1 | 6/2011 | Yamazaki et al. |
| 2011/0127579 A1 * | 6/2011 | Yamazaki | 257/192 |
| 2011/0133177 A1 * | 6/2011 | Suzawa et al. | 257/43 |
| 2011/0140095 A1 * | 6/2011 | Kim et al. | 257/43 |
| 2011/0140096 A1 * | 6/2011 | Kim et al. | 257/43 |
| 2011/0140100 A1 | 6/2011 | Takata et al. |
| 2011/0156026 A1 | 6/2011 | Yamazaki et al. |
| 2011/0175082 A1 * | 7/2011 | Kim et al. | 257/43 |
| 2011/0193083 A1 | 8/2011 | Kim et al. |
| 2011/0215328 A1 | 9/2011 | Morosawa et al. |
| 2011/0240990 A1 | 10/2011 | Yamazaki |
| 2011/0240991 A1 | 10/2011 | Yamazaki |
| 2011/0248246 A1 | 10/2011 | Ogita et al. |
| 2012/0032163 A1 * | 2/2012 | Yamazaki | 257/43 |
| 2012/0043542 A1 * | 2/2012 | Yanagisawa | 257/57 |
| 2012/0052624 A1 * | 3/2012 | Yamazaki | 438/104 |
| 2012/0061662 A1 | 3/2012 | Yamazaki et al. |
| 2012/0119205 A1 | 5/2012 | Taniguchi et al. |
| 2012/0132903 A1 * | 5/2012 | Yamazaki et al. | 257/43 |
| 2012/0149147 A1 | 6/2012 | Yamazaki et al. |
| 2012/0153278 A1 | 6/2012 | Jeong et al. |
| 2012/0175609 A1 * | 7/2012 | Yamazaki | 257/43 |

(56) References Cited

U.S. PATENT DOCUMENTS

| | | | |
|---|---|---|---|
| 2012/0175610 A1* | 7/2012 | Yamazaki | 257/43 |
| 2012/0178224 A1* | 7/2012 | Yamazaki | 438/151 |
| 2012/0305913 A1* | 12/2012 | Yamazaki et al. | 257/43 |
| 2012/0319102 A1* | 12/2012 | Yamazaki et al. | 257/43 |
| 2012/0319114 A1* | 12/2012 | Yamazaki et al. | 257/57 |
| 2012/0319183 A1* | 12/2012 | Yamazaki et al. | 257/288 |
| 2013/0002312 A1* | 1/2013 | Yamazaki et al. | 327/109 |
| 2013/0009209 A1* | 1/2013 | Yamazaki | 257/192 |
| 2013/0009219 A1* | 1/2013 | Yamazaki et al. | 257/288 |
| 2013/0009220 A1* | 1/2013 | Yamazaki et al. | 257/288 |
| 2013/0015437 A1* | 1/2013 | Yamazaki | 257/43 |
| 2013/0020571 A1 | 1/2013 | Yamazaki et al. | |
| 2013/0063675 A1* | 3/2013 | Misaki | 349/46 |
| 2013/0161608 A1 | 6/2013 | Yamazaki | |
| 2013/0270549 A1* | 10/2013 | Okazaki et al. | 257/43 |
| 2013/0270552 A1 | 10/2013 | Yamazaki et al. | |
| 2013/0299824 A1* | 11/2013 | Akimoto et al. | 257/43 |
| 2013/0320330 A1* | 12/2013 | Yamazaki | 257/43 |
| 2013/0320334 A1* | 12/2013 | Yamazaki et al. | 257/43 |
| 2013/0320337 A1* | 12/2013 | Yamazaki et al. | 257/43 |
| 2013/0334523 A1 | 12/2013 | Yamazaki | |
| 2014/0001465 A1 | 1/2014 | Yamazaki | |
| 2014/0004656 A1 | 1/2014 | Sasagawa et al. | |
| 2014/0008647 A1* | 1/2014 | Yamazaki | 257/43 |
| 2014/0021464 A1 | 1/2014 | Ting et al. | |
| 2014/0042438 A1* | 2/2014 | Yamazaki | 257/43 |
| 2014/0131696 A1* | 5/2014 | Ono et al. | 257/40 |
| 2014/0151691 A1* | 6/2014 | Matsubayashi et al. | 257/43 |
| 2014/0225105 A1* | 8/2014 | Tanaka et al. | 257/43 |
| 2014/0252345 A1* | 9/2014 | Tsubuku et al. | 257/43 |
| 2014/0307194 A1* | 10/2014 | Suzumura et al. | 349/43 |
| 2015/0115263 A1* | 4/2015 | Yamazaki et al. | 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2009-231613 A | 10/2009 |
| JP | 2010-016347 A | 1/2010 |
| JP | 4415062 B1 | 2/2010 |
| JP | 2010-067954 A | 3/2010 |
| JP | 2010-073881 A | 4/2010 |
| JP | 2010-177431 A | 8/2010 |
| JP | 4571221 B1 | 10/2010 |
| JP | 2011-155249 A | 8/2011 |
| JP | 2012-160679 A | 8/2012 |
| WO | 2004/114391 A1 | 12/2004 |
| WO | 2008/133345 A1 | 11/2008 |

OTHER PUBLICATIONS

Arokia Nathan et al.; "Amorphous Oxide TFTs: Progress and Issues"; SID Digest '12 : SID International Symposium Digest of Technical Papers; Jun. 3, 2012; pp. 1-4.

Asakuma, N et al., "Crystallization and Reduction of SOL-GEL-Derived Zinc Oxide Films by Irradiation With Ultraviolet Lamp," Journal of SOL-GEL Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and

(56) References Cited

OTHER PUBLICATIONS

Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

(56) References Cited

OTHER PUBLICATIONS

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

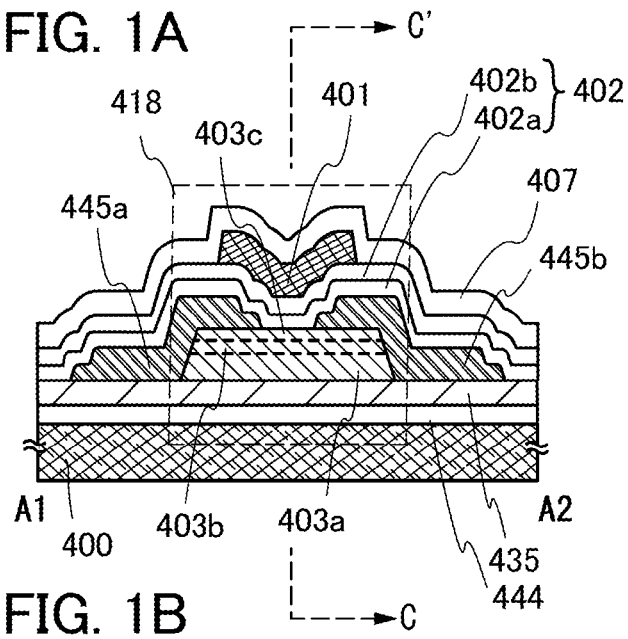
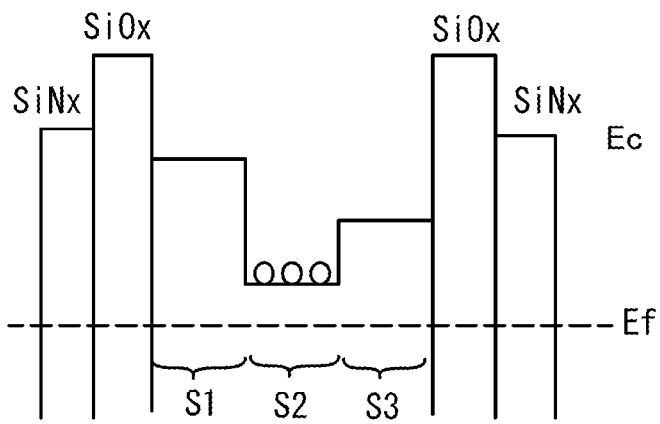
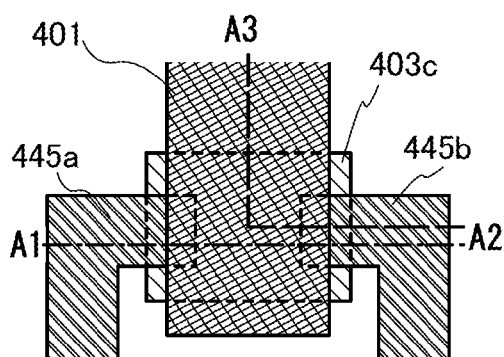
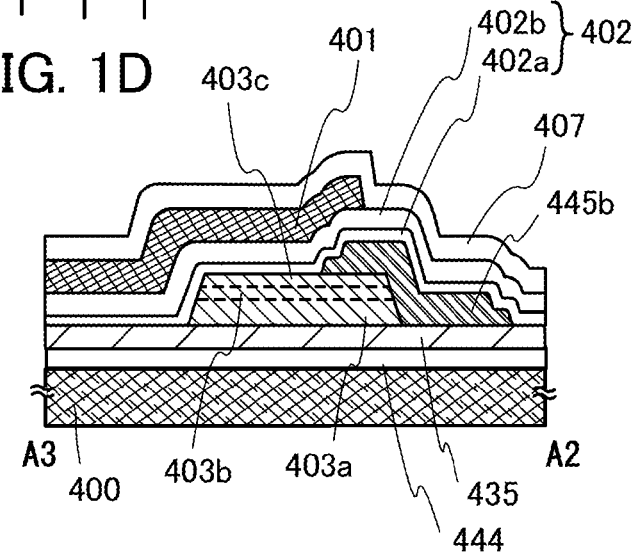
FIG. 1A
FIG. 1B
FIG. 1C
FIG. 1D

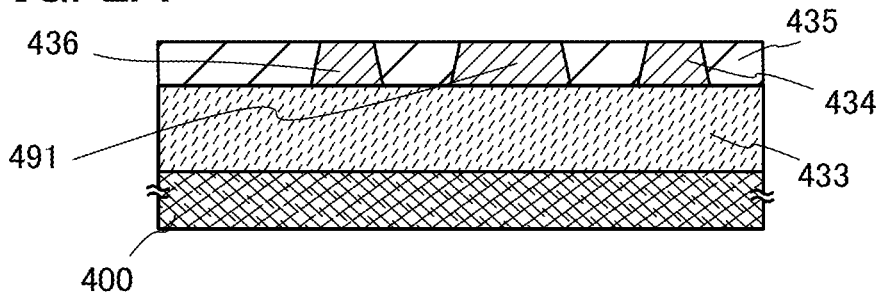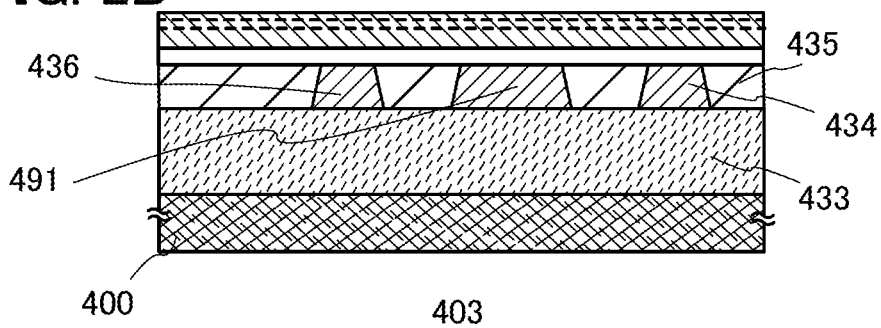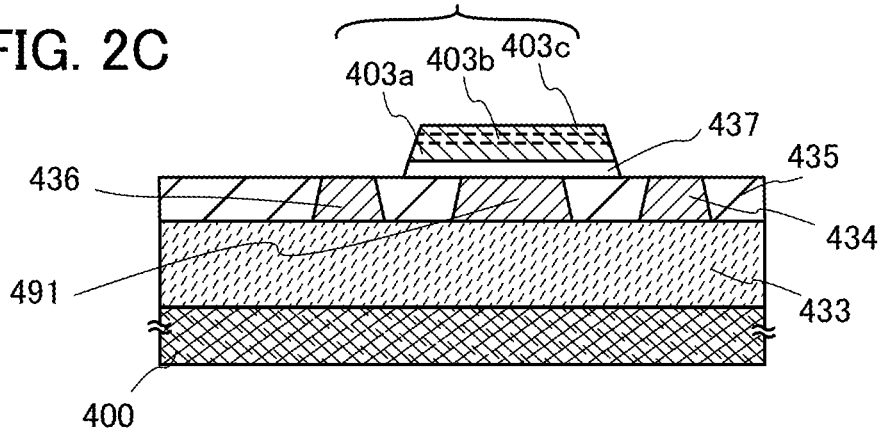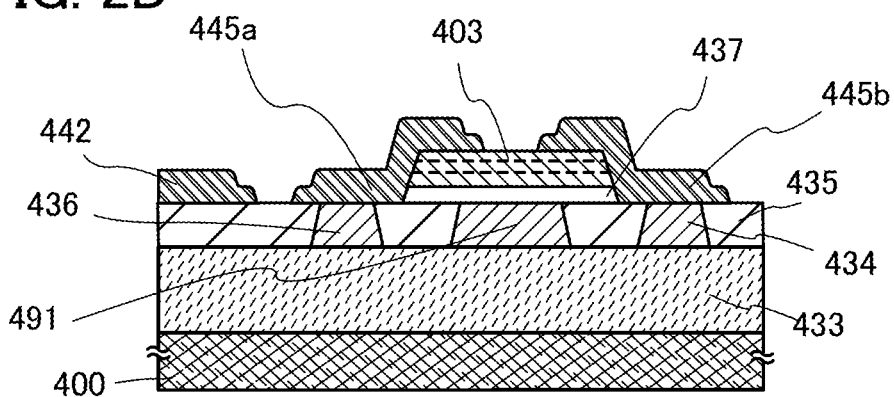

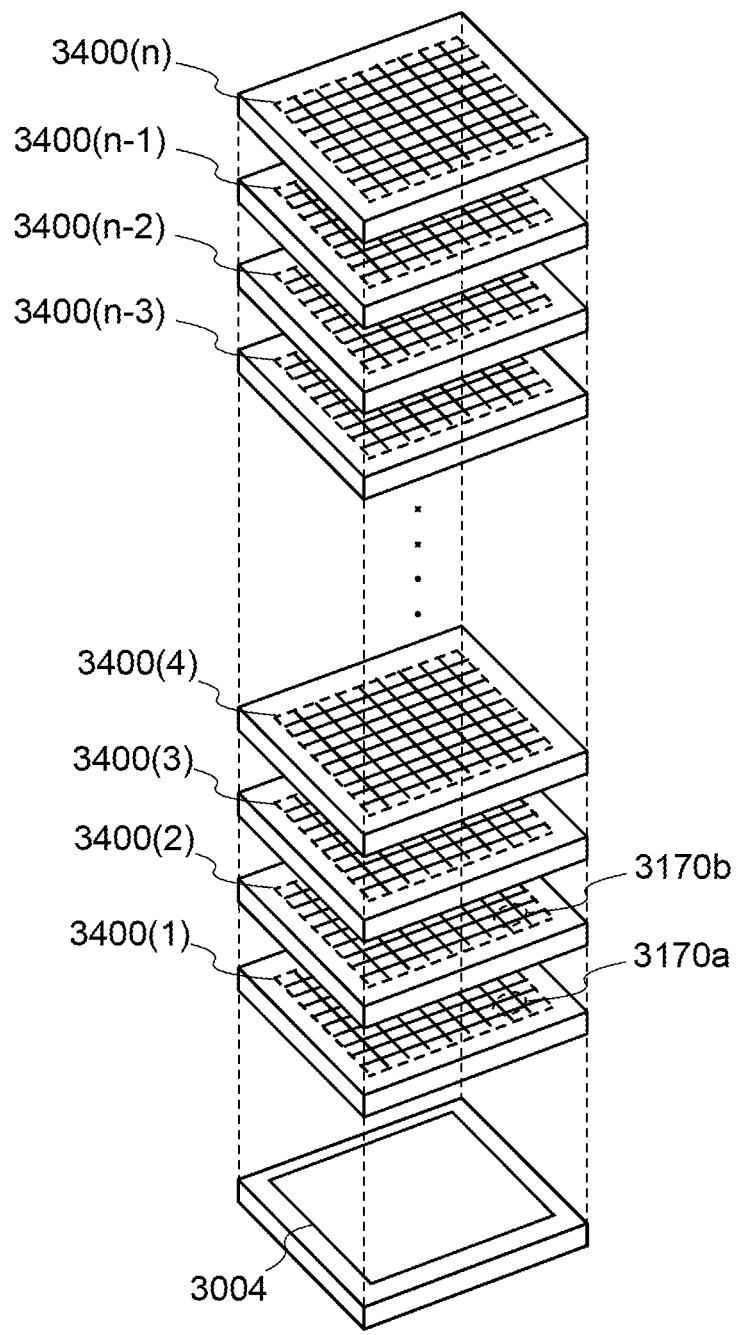

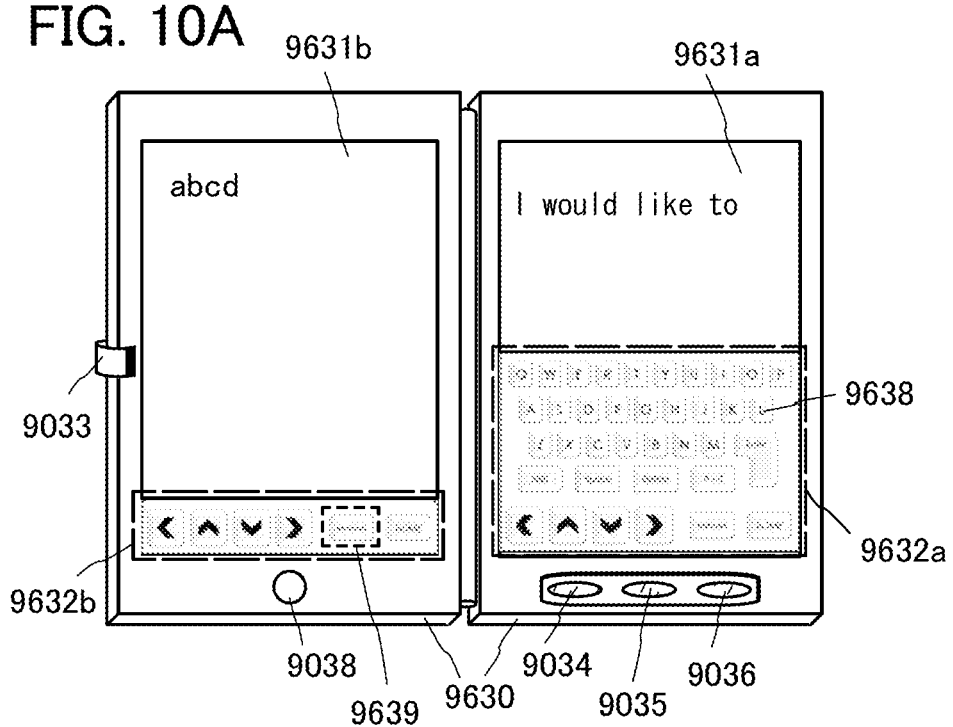
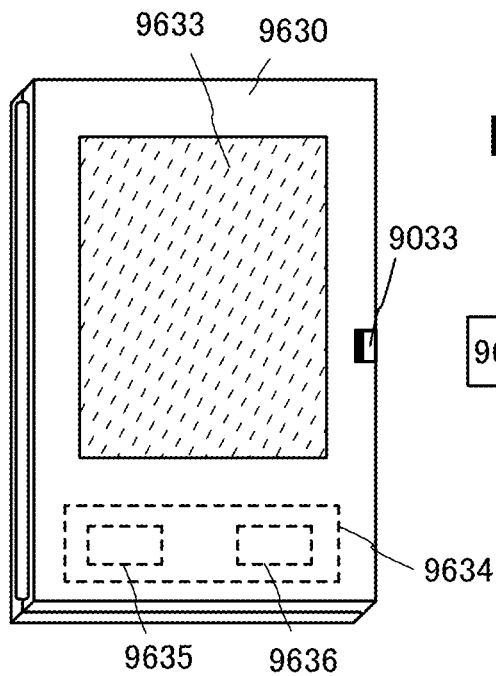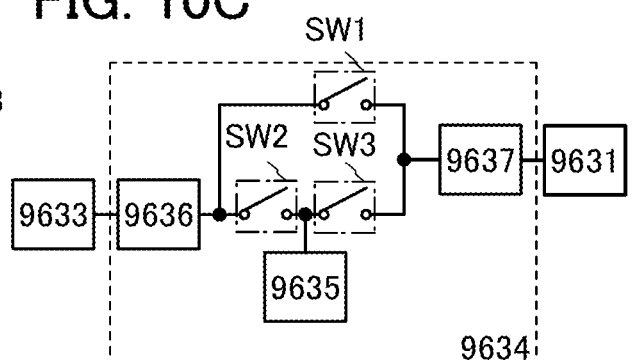

Outermost surface is (Ga or Zn) O plane

THIN FILM TRANSISTOR WITH MULTIPLE OXIDE SEMICONDUCTOR LAYERS

BACKGROUND OF THE INVENTION

1. Field of the Invention

The present invention relates to a semiconductor device including an oxide semiconductor and a manufacturing method thereof.

In this specification, a semiconductor device generally means a device which can function by utilizing semiconductor characteristics, and an electrooptic device, a semiconductor circuit, and electronic equipment are all semiconductor devices.

2. Description of the Related Art

In recent years, semiconductor devices have been developed to be used mainly for an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, or a memory is mounted on a circuit board, for example, a printed wiring board, to be used as one of components of a variety of electronic devices.

A technique for manufacturing a transistor by using an oxide semiconductor film for a channel formation region, or the like has been attracting attention. Examples of such a transistor include a transistor in which zinc oxide (ZnO) is used as an oxide semiconductor film and a transistor in which $InGaO_3(ZnO)_m$ is used as an oxide semiconductor film.

Patent Document 1 discloses a three-layer structure in which a first multi-component oxide semiconductor layer is provided over a substrate, a one-component oxide semiconductor layer is stacked over the first multi-component oxide semiconductor layer, and a second multi-component oxide semiconductor layer is stacked over the one-component oxide semiconductor layer.

Non-Patent Document 1 discloses a transistor having a stack of oxide semiconductors.

REFERENCE

Patent Document

[Patent Document 1] Japanese Published Patent Application No. 2011-155249

Non-Patent Document

[Non-Patent Document 1] Arokia Nathan et al., "Amorphous Oxide TFTs: Progress and issues", SID 2012 Digest pp. 1-4.

SUMMARY OF THE INVENTION

The electrical characteristics of a transistor including an oxide semiconductor layer are varied by influence of an insulating film in contact with the oxide semiconductor layer, that is, by an interface state between the oxide semiconductor layer and the insulating film.

For example, in the case where an insulating film containing silicon is used as the insulating film, when the oxide semiconductor layer is deposited on the silicon oxide film by a sputtering method, silicon might enter the oxide semiconductor layer at the time of the sputtering. In the structure of Non-Patent Document 1, an oxide semiconductor functioning as a channel is in contact with silicon oxide, and thus silicon, which is a constituent atom of the silicon oxide film, might enter the channel, as an impurity. When an impurity such as silicon enters the oxide semiconductor layer, the field-effect mobility of the transistor might decrease.

Further, when a silicon nitride film is used as the insulating film, many carriers flow through the interface between the silicon nitride film and the oxide semiconductor layer, and thus it is difficult to obtain transistor characteristics.

An object of one embodiment of the present invention is to provide a structure of a transistor having high field-effect mobility.

Thus, in order that an oxide semiconductor layer through which carriers flow is not in contact with a gate insulating film containing silicon, a buried channel structure in which the oxide semiconductor layer through which carriers flow is separated from the gate insulating film containing silicon is employed. Further, in the case where an oxide semiconductor layer is provided over a base insulating film and a gate insulating film is provided over the oxide semiconductor layer, in order that the oxide semiconductor layer through which carriers flow is not in contact with the base insulating film containing silicon, it is preferable to employ a buried channel structure in which the oxide semiconductor layer through which carriers flow is separated from the base insulating film containing silicon.

Specifically, as illustrated in FIG. 1A, a first oxide semiconductor film 403a, a second oxide semiconductor film 403b, and a third oxide semiconductor film 403c are stacked in this order, and the second oxide semiconductor film 403b is made to an n-type in order that a conduction band offset (Ec) in an energy band diagram (schematic diagram) illustrated in FIG. 1B is greater than or equal to 0.05 eV and preferably greater than or equal to 0.1 eV. The energy band diagram in FIG. 1B is an energy band which corresponds to a portion between C and C' in FIG. 1A. Note that the energy band diagram illustrated in FIG. 1B is mealy an example and thus does not limit the present invention. Any structure of the energy band diagram may be employed as long as the energy level of the bottom of the conduction band in a second oxide semiconductor layer S2 is lower than those of the bottoms of the conduction band in a first oxide semiconductor layer S1 and a third oxide semiconductor layer S3.

As a way to make the second oxide semiconductor layer S2 an n-type, the second oxide semiconductor layer S2 is deposited by a sputtering method in a mixed atmosphere containing nitrogen or dinitrogen monoxide. As another way to make the second oxide semiconductor layer S2 an n-type, deposition is performed using a sputtering target containing a very small amount of boron or phosphorus so that the second oxide semiconductor layer S2 contains boron or phosphorus.

As a material of the first oxide semiconductor layer S1, a material which can be represented as $M1_aM2_bM3_cO_x$ (a is a real number greater than or equal to 0 and less than or equal to 2, b is a real number greater than 0 and less than or equal to 5, c is a real number greater than or equal to 0 and less than or equal to 5, and x is an arbitrary real number) is used. Ga, Mg, Hf, Al, Zr, Sn, or the like can be used as the constituent element M2 to function as a stabilizer for reducing the number of oxygen vacancies in an oxide semiconductor. As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained. As the constituent element M1, indium or the like is used. As the constituent element M3, zinc or the like is used.

Typically, for the first oxide semiconductor layer S1, a gallium oxide film, a gallium zinc oxide film, or a material film in which the content of the constituent element M2 is higher than the content of the constituent element M1 is used. For example, an In—Ga—Zn-based oxide film which is deposited using a sputtering target having any of atomic ratios of In:Ga:Zn=1:3:2, In:Ga:Zn=1:4:2, and In:Ga:Zn=1:5:4 is used. In forming the first oxide semiconductor layer, deposition is preferably performed by a sputtering method in a mixed atmosphere containing more oxygen than a rare gas and more preferably in an oxygen atmosphere (oxygen: 100%), and the resulting oxide semiconductor layer can also be referred to as a first I-type oxide semiconductor layer. The first I-type oxide semiconductor layer is a highly purified oxide semiconductor layer that contains impurities other than the main components of the oxide semiconductor layer as little as possible and is an I-type (intrinsic) oxide semiconductor or close thereto. In such an oxide semiconductor layer, the Fermi level (Ef) can be at the same level as the intrinsic Fermi level (Ei).

For the second oxide semiconductor layer S2, a material which can be represented as $M4_dM5_eM6_fO_x$ (d is a real number greater than 0 and less than or equal to 5, e is a real number greater than or equal to 0 and less than or equal to 3, f is a real number greater than 0 and less than or equal to 5, and x is an arbitrary positive number) is used. Ga, Mg, Hf, Al, Zr, Sn, or the like can be used as the constituent element M5 to function as a stabilizer for reducing the number of oxygen vacancies in an oxide semiconductor. As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained. As the constituent element M4, indium or the like is used. As the constituent element M6, zinc or the like is used. Typically, a material film in which the content of the constituent element M4 is higher than the content of the constituent element M5 is used. For example, an In—Ga—Zn-based oxide film which is deposited using a sputtering target having an atomic ratio of In:Ga:Zn=3:1:2 is used. In forming the second oxide semiconductor layer, deposition is preferably performed by a sputtering method in a mixed atmosphere containing nitrogen or a mixed atmosphere containing dinitrogen monoxide, and the resulting oxide semiconductor layer is also referred to as an N-type oxide semiconductor layer. Note that the N-type oxide semiconductor layer has higher carrier density and higher conductivity σ than the first I-type oxide semiconductor layer.

For the third oxide semiconductor layer S3, a material which can be represented as $M7_gM8_hM9_iO_x$ (g is a real number greater than or equal to 0 and less than or equal to 2, h is a real number greater than 0 and less than or equal to 5, i is a real number greater than or equal to 0 and less than or equal to 5, and x is an arbitrary real number) is used. Ga, Mg, Hf, Al, Zr, Sn, or the like can be used as the constituent element M8 to function as a stabilizer for reducing the number of oxygen vacancies in an oxide semiconductor. As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained. As the constituent element M7, indium or the like is used. As the constituent element M9, zinc or the like is used. Typically, a material film in which the content of the constituent element M7 is substantially equal to the content of the constituent element M8 is used. For example, an In—Ga—Zn-based oxide film which is deposited using a sputtering target having an atomic ratio of In:Ga:Zn=1:1:1 is used. In forming the third oxide semiconductor layer, deposition is preferably performed by a sputtering method in a mixed atmosphere containing more oxygen than a rare gas and preferably in an oxygen atmosphere (oxygen: 100%), and the resulting oxide semiconductor layer can also be referred to as a second I-type oxide semiconductor layer.

Note that the materials of the first and second oxide semiconductor layers S1 and S2 may be selected so that the energy level of the bottom of the conduction band in the second oxide semiconductor layer S2 is lower than that of the bottom of the conduction band in the first oxide semiconductor layer S1, and the compositions of the above materials may be adjusted as appropriate.

Further, the materials of the second and third oxide semiconductor layers S2 and S3 may be selected so that the energy level of the bottom of the conduction band in the second oxide semiconductor layer S2 is lower than that of the bottom of the conduction band in the third oxide semiconductor layer S3, and the compositions of the above materials may be adjusted as appropriate.

The second oxide semiconductor layer S2, the S1, and the S3 have at least one common constituent element.

In the case where a transistor is formed in which the conductivity of the second oxide semiconductor layer S2 is increased using such a three-layer structure, a distance between the second oxide semiconductor layer S2 and a drain electrode, i.e., the thickness of the third oxide semiconductor layer S3 becomes dominant, so that a channel length L apparently becomes smaller in the forward direction, and an on-state current can be increased. In the reverse direction, the third oxide semiconductor layer S3 is depleted and a sufficiently small off state current can be achieved.

In a structure of one embodiment of the present invention disclosed in this specification, between two oxide semiconductor layers, an oxide semiconductor layer which has higher conductivity σ than the two oxide semiconductor layers may be provided, and an example of the structure is a transistor 418 illustrated in FIG. 1A. Note that the cross-sectional view of the transistor 418 in FIG. 1A corresponds to a structural view taken along a chain line A1-A2 in a top view in FIG. 1C. FIG. 1D illustrates a cross-sectional view taken along a dotted line A2-A3 in FIG. 1C.

A structure of one embodiment of the present invention disclosed in this specification is a semiconductor device including a first insulating layer over an insulating surface, a first oxide semiconductor layer over the first insulating layer, a second oxide semiconductor layer over the first oxide semiconductor layer, a third oxide semiconductor layer over the second oxide semiconductor layer, and a second insulating layer over the third oxide semiconductor layer. The second oxide semiconductor layer has higher conductivity than the third oxide semiconductor layer and the first oxide semiconductor layer.

In the above structure, to increase the conductivity of the second oxide semiconductor layer, the second oxide semiconductor layer is made to have a higher nitrogen concentration, boron concentration, or phosphorus concentration than the third oxide semiconductor layer and the first oxide semiconductor layer. An atmosphere containing nitrogen or dinitrogen monoxide may be used for depositing the second oxide semiconductor layer, whereby the second oxide semiconductor layer having high conductivity σ may be obtained.

In the above structure, as illustrated in FIG. 1A, the thickness of the first oxide semiconductor film 403a is set larger than that of each of the second oxide semiconductor film 403b and the third oxide semiconductor film 403c, whereby influence of diffusion of silicon or the like contained in the base film is reduced.

In the above structure, the side surface of the second oxide semiconductor layer may be covered with the third oxide semiconductor layer. The structure in which the side surface of the second oxide semiconductor layer is not in direct contact with a source electrode layer or a drain electrode layer can lead to a reduction in leakage current.

In the above structure, the first insulating layer is an insulating film containing silicon, and the second insulating layer is an insulating film containing gallium. As illustrated in FIG. 1D, an insulating film 402 formed using an insulating film containing gallium is provided to cover and be in contact with the side surface of the second oxide semiconductor film 403b, whereby leakage current can be reduced.

In the case of a top-gate transistor, a gate electrode layer is further provided over the second insulating layer in the above structure. Although the transistor 418 in FIG. 1A is a top-gate transistor, one embodiment of the present invention is not particularly limited to the top-gate transistor in FIG. 1A.

FIG. 16A illustrates another example of a top-gate transistor. To obtain a buried channel structure, specifically, the first oxide semiconductor layer S1, the second oxide semiconductor layer S2, and the third oxide semiconductor layer S3 are stacked in this order, and an oxide semiconductor material having high conductivity σ is used for a channel formation region 103b illustrated in FIG. 16B for the purpose of obtaining an energy difference greater than or equal to 0.05 eV, preferably greater than or equal to 0.1 eV in an energy band diagram (schematic diagram) in FIG. 16C. Note that the energy band diagram illustrated in FIG. 16C is mealy an example and thus does not limit the present invention. Any structure of the energy band diagram may be employed as long as the energy level of the bottom of the conduction band in the second oxide semiconductor layer S2 is lower than those of the bottoms of the conduction band in the first oxide semiconductor layer S1 and the third oxide semiconductor layer S3.

As a way to increase the conductivity σ of the second oxide semiconductor layer S2 overlapping with a gate electrode layer 101, the second oxide semiconductor layer S2 is deposited by a sputtering method in an atmosphere containing nitrogen or dinitrogen monoxide. As another way to increase the conductivity σ of the second oxide semiconductor layer S2, deposition is performed using a sputtering target containing a very small amount of boron or phosphorus so that the second oxide semiconductor layer S2 contains boron or phosphorus.

The third oxide semiconductor layer S3 is formed to overlap with the gate electrode layer 101, and low-resistance regions 104c and 108c which do not overlap with the gate electrode layer 101 are n-type. In order that the low-resistance regions 104c and 108c not overlapping with the gate electrode layer 101 are electrically connected to a source electrode layer and a drain electrode layer, the low-resistance regions 104c and 108c are preferably regions having low resistance. Further, the low-resistance regions 104c and 108c are preferably formed in a self-aligned manner using the gate electrode layer 101 as a mask.

As a way to form the low-resistance regions 104c and 108c that are n-type, the gate electrode layer 101 is used as a mask, and the low-resistance regions 104c and 108c are formed by addition of nitrogen, boron, or phosphorus in a self-aligned manner by an ion implantation method. As another way to form the low-resistance regions that are n-type, a nitride insulating film (typically, a silicon nitride film 107) is formed in contact with the third oxide semiconductor layer S3 or the third oxide semiconductor layer S3 is subjected to nitrogen plasma treatment.

Another structure of one embodiment of the present invention disclosed in this specification is a semiconductor device including a first insulating layer over an insulating surface, a first oxide semiconductor layer over the first insulating layer, a second oxide semiconductor layer over the first oxide semiconductor layer, a third oxide semiconductor layer over the second oxide semiconductor layer, a second insulating layer on and in contact with the third oxide semiconductor layer, a gate electrode layer over the second insulating layer, and a third insulating layer on and in contact with the third oxide semiconductor layer. The second oxide semiconductor layer has a smaller thickness than the first oxide semiconductor layer and the third oxide semiconductor layer.

In the above structure, a region of the third oxide semiconductor layer which is in contact with the third insulating layer has low crystallinity and has a higher nitrogen concentration than a region of the third oxide semiconductor layer which is in contact with the second insulating layer. The region of the third oxide semiconductor layer which is in contact with the second insulating layer overlaps with a channel formation region of the second oxide semiconductor layer. The third insulating layer is a silicon nitride film, and thus the region of the third oxide semiconductor layer which is in contact with the third insulating layer can have a higher nitrogen concentration than the region of the third oxide semiconductor layer which is in contact with the second insulating layer. To further reduce resistance, phosphorus, boron, or nitrogen may be added to the region of the third oxide semiconductor layer which is in contact with the second insulating layer by an ion implantation method using the gate electrode layer as a mask. The third oxide semiconductor layer is preferably formed using a film having a crystalline structure. The region of the third oxide semiconductor layer which overlaps with the gate electrode layer has a crystalline structure and the region of the third oxide semiconductor layer to which phosphorus, boron, or nitrogen is added by an ion implantation method is a region having low crystallinity.

In the above structure, the third insulating layer may be provided as a sidewall provided on a side surface of the gate electrode layer.

In the above structure, to prevent generation of a parasitic channel, a taper angle formed by an end surface of the first oxide semiconductor layer and a surface of the first insulating layer is preferably greater than or equal to 10° and less than or equal to 60°. A taper angle formed by an end surface of the second oxide semiconductor layer and the surface of the first insulating layer is preferably greater than or equal to 10° and less than or equal to 60°. A taper angle formed by an end surface of the third oxide semiconductor layer and the surface of the first insulating layer is preferably greater than or equal to 10° and less than or equal to 60°.

In the above structure, the side surface of the second oxide semiconductor layer may be covered with the third oxide semiconductor layer. The structure in which the side surface of the second oxide semiconductor layer is not in direct contact with the source electrode layer or the drain electrode layer can lead to a reduction in leakage current.

In the case of a dual-gate transistor in which gate electrode layers are provided over and below the oxide semiconductor layers, the first gate electrode layer is provided between the insulating surface and the first insulating layer, and the second gate electrode layer is provided over the second insulating layer.

Each of the oxide semiconductor layers is deposited under the following conditions: a sputtering target which is polycrystalline and whose relative density (filling rate) is high is used; the sputtering target in deposition is sufficiently cooled to a room temperature; the temperature of a surface where the oxide semiconductor layer is to be deposited of a substrate where the oxide semiconductor layer is to be deposited (a deposition-target substrate) is increased to a room temperature or higher; and an atmosphere in a deposition chamber hardly contains moisture or hydrogen.

The higher density of the sputtering target is more preferable. When the density of the sputtering target is increased, the density of a film to be deposited can also be increased. Specifically, the relative density (filling rate) of the sputtering target is higher than or equal to 90% and lower than or equal to 100%, preferably higher than or equal to 95%, more preferably higher than or equal to 99.9%. Note that the relative density of the sputtering target refers to a ratio between the density of the sputtering target and the density of a material free of porosity having the same composition as the sputtering target.

The sputtering target is preferably sintered in an inert gas atmosphere (a nitrogen or rare gas atmosphere), in vacuum, or in a high-pressure atmosphere. As a sintering method, an atmospheric sintering method, a pressure sintering method, or the like is used as appropriate. A polycrystalline target obtained by any of these methods is used as a sputtering target. As the pressure sintering method, a hot pressing method, a hot isostatic pressing (HIP) method, a discharge plasma sintering method, or an impact method is preferably used. Although the maximum temperature at which sintering is performed is selected depending on the sintering temperature of the sputtering target material, it is preferably set to approximately 1000° C. to 2000° C., or more preferably, 1200° C. to 1500° C. Although the holding time of the maximum temperature is selected depending on the sputtering target material, 0.5 hours to 3 hours is preferable.

In the case where an In—Ga—Zn-base oxide film is deposited, a sputtering target having any of atomic ratios of In:Ga:Zn=3:1:2, In:Ga:Zn=1:1:1, and In:Ga:Zn=1:3:2 is used as the sputtering target.

Reduction of impurities remaining in the deposition chamber is also important for forming a dense film. The back pressure (ultimate vacuum: degree of vacuum before introducing a reaction gas) in a deposition chamber is set to be lower than or equal to $5 \times 10^{-3}$ Pa, preferably $6 \times 10^{-5}$ Pa, and pressure in deposition is set to be lower than 2 Pa, preferably lower than or equal to 0.4 Pa. When the back pressure is set to be low, impurities in the deposition chamber are reduced.

Reduction of impurities in a gas to be introduced in the deposition chamber, i.e., a gas to be used in deposition, is also important for forming a dense film. Further, it is important to increase the proportion of oxygen contained in a deposition gas and optimize power. By increasing the proportion of oxygen (the upper limit: 100% oxygen) contained in the deposition gas and optimizing the power, plasma damage in deposition can be alleviated. Thus, a dense film is easily formed.

Deposition of the oxide semiconductor film is preferably performed while a quadrupole mass analyzer (hereinafter also referred to as Q-mass) is operated continuously in order that the amount of moisture in the deposition chamber, or the like is monitored by the Q-mass before or in deposition.

The oxide semiconductor film is in a single crystal state, a polycrystalline (also referred to as polycrystal) state, an amorphous state, or the like.

When the temperature of a deposition-target substrate, which is an example of deposition conditions, is set to be higher than or equal to 200° C., a dense oxide semiconductor film including a crystal part, i.e., a c-axis aligned crystalline oxide semiconductor (CAAC-OS) film can be obtained.

First, the CAAC-OS film is described.

The CAAC-OS film is one of oxide semiconductor films including a plurality of crystal parts, and most of each crystal part fits inside a cube whose one side is less than 100 nm. Thus, there is a case where a crystal part included in the CAAC-OS film fits a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the crystal parts included in the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depends on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° is derived from the (311) plane of a $ZnGa_2O_4$ crystal; such a peak indicates that a $ZnGa_2O_4$ crystal is included in part of the CAAC-OS film including the $InGaZnO_4$ crystal. It is preferable that in the CAAC-OS film, a peak of 2θ appear at around 31° and a peak of 2θ do not appear at around 36°.

The CAAC-OS film is an oxide semiconductor film having a low impurity concentration. The impurity is any of elements which are not the main components of the oxide semiconductor film and includes hydrogen, carbon, silicon, a transition metal element, and the like. In particular, an element (e.g., silicon) which has higher bonding strength with oxygen than a metal element included in the oxide semiconductor film causes disorder of atomic arrangement in the oxide semiconductor film because the element deprives the oxide semiconductor film of oxygen, thereby reducing crystallinity. Further, a heavy metal such as iron or nickel, argon, carbon dioxide, and the like have a large atomic radius (or molecular radius); therefore, when any of such elements is contained in the oxide semiconductor film, the element causes disorder of the atomic arrangement of the oxide semiconductor film, thereby reducing crystallinity. Note that the impurity contained in the oxide semiconductor film might become a carrier trap or a source of carriers.

The CAAC-OS film is an oxide semiconductor film having a low density of defect states. For example, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus has a low carrier density in some cases. Thus, in some cases, a transistor including the oxide semiconductor film in a channel formation region rarely has a negative threshold voltage (is rarely normally-on). A highly purified intrinsic or substantially highly purified intrinsic oxide semiconductor film has few carrier traps. Accordingly, the transistor including the oxide semiconductor film has little variation in electrical characteristics and high reliability. A charge trapped by the carrier traps in the oxide semiconductor film takes a long time to be released. The trapped charge may behave like a fixed charge. Thus, the transistor including the oxide semiconductor film with a high impurity concentration and a high density of defect states has unstable electrical characteristics in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by deposition using a sputtering target or by performing treatment for crystallization such as heat treatment after deposition.

During deposition, fine sputtering particles fly from a sputtering target, and a film is formed so that the sputtering particles adhere onto the deposition-target substrate. When the temperature of the substrate is higher than or equal to 200° C., the sputtering particles are rearranged because the substrate is heated. Thus, a dense film is formed.

A phenomenon in the deposition is described in detail using FIGS. 12A to 12C, FIGS. 13A and 13B, and FIGS. 14A to 14C.

When ions collide with the surface of the sputtering target, the crystal region included in the sputtering target is cleaved along an a-b plane, and sputtered particles whose top and bottom surfaces are each aligned with a layer parallel to the a-b plane (flat-plate-like sputtered particle or pellet-like sputtered particle) are separated from the sputtering target. Assuming that the crystalline particle which is sputtered from a surface of a sputtering target 2002 and released has c-axis alignment and is a flat-plate-like sputtered particle 2001 as illustrated in FIG. 12A, a schematic model diagram in FIG. 12B can be obtained. The flat-plate-like sputtered particle is preferably in a state illustrated in FIG. 12C, i.e., is preferably the one with an outermost surface of a (Ga or Zn)O plane.

When the oxygen flow rate is high and the pressure in a chamber 2003 is high during deposition, as illustrated in FIG. 13A, oxygen ions are attached onto the flat-plate-like sputtered particle and the sputtered particle can have a large amount of oxygen on its surface. Another flat-plate-like sputtered particle is stacked thereover before the attached oxygen is released; therefore, as illustrated in FIG. 14C, a large amount of oxygen can be contained in the film. The oxygen adsorbed on the surface contributes to a reduction in the number of oxygen vacancies in the oxide semiconductor film.

To form an oxide semiconductor film having a crystalline region with c-axis alignment, it is preferable to increase the substrate temperature at the deposition. However, when the substrate temperature is higher than 350° C., the oxygen adsorbed on the surface might be released as illustrated in FIG. 13B. Therefore, when the substrate temperature is set to higher than or equal to 150° C. and lower than or equal to 350° C. and preferably higher than or equal to 160° C. and lower than or equal to 230° C. and only an oxygen gas is used as a deposition gas, an oxide semiconductor film having a crystalline region with c-axis alignment, i.e., a CAAC-OS film, can be obtained.

FIG. 14A is a model of a process in the deposition, in which one flat-plate-like sputtered particle reaches a surface of a substrate 2000 to be stabilized. As illustrated in FIG. 14A, the flat-plate-like sputtered particle reaches the substrate surface while keeping its crystalline state, whereby formation of a CAAC-OS film is facilitated. Further, when flat-plate-like sputtered particles are stacked as illustrated in FIG. 14B, formation of a CAAC-OS film is facilitated. Note that the CAAC-OS film is a film which contains a large amount of oxygen and has a reduced number of oxygen vacancies as illustrated in FIG. 14C.

In the CAAC-OS film over the substrate 2000, a series of about 2 to 20 indium atoms exist in a lateral direction to form a layer including indium atoms. Note that in some cases, the layer has a series of 20 or more indium atoms; for example, the layer may have a series of 2 to 50 indium atoms, 2 to 100 indium atoms, or 2 to 500 indium atoms in a lateral direction.

Layers including indium atoms overlap with each other. The number of layers is greater than or equal to 1 and less than or equal to 20, greater than or equal to 1 and less than or equal to 10, or greater than or equal to 1 and less than or equal to 4.

As described above, a stack of the layers including indium atoms often appears to be a cluster including several indium atoms in a lateral direction and several layers in a longitudinal direction. This is because each of the sputtering particles has a flat-plate-like shape.

By increasing the temperature of the deposition-target substrate, migration of sputtering particles is likely to occur on a substrate surface. With this effect, a flat-plate-like sputtered particle reaches the substrate surface, moves slightly, and then is attached to the substrate surface with a flat plane (a-b plane) of the sputtered particle facing toward the substrate surface. Therefore, an oxide semiconductor film having a crystal region which is c-axis-aligned perpendicularly to the surface of the oxide semiconductor film is easily formed.

Further, heat treatment at a temperature of higher than or equal to 200° C. may be performed after the deposition of the oxide semiconductor film, so that a denser film is obtained. However, in that case, oxygen vacancies might be generated when impurity elements (e.g., hydrogen and water) in the oxide semiconductor film are reduced. Therefore, before the heat treatment is performed, an insulating layer containing excess oxygen is preferably provided over or below the oxide semiconductor film, in which case oxygen vacancies in the oxide semiconductor film can be reduced by the heat treatment.

An oxide semiconductor film shortly after deposition is made dense; thus, a dense film which is thin and close to single crystal can be obtained. Since oxygen, hydrogen, or the like hardly diffuses within the film, a semiconductor device including a dense oxide semiconductor film can achieve improvement in reliability.

It is preferable that a CAAC-OS film be used for at least the second oxide semiconductor layer and the channel formation region overlapping with the gate electrode layer be formed with the CAAC-OS film. In the case where a CAAC-OS film is used for the first oxide semiconductor layer, since the first oxide semiconductor layer has the same crystal structure as the second oxide semiconductor layer, the number of levels can be small at the interface thereof, so that high field-effect mobility can be achieved. Further, it is preferable that the second oxide semiconductor layer be formed on and in contact with the first oxide semiconductor layer that is a CAAC-OS film because the second oxide semiconductor layer formed over the first oxide semiconductor layer is easily crystallized using the first oxide semiconductor layer as a crystal seed, so that the first and second oxide semiconductor layers can have the same crystal structure.

A transistor having high field-effect mobility can be obtained.

BRIEF DESCRIPTION OF THE DRAWINGS

FIGS. 1A to 1D are schematic views illustrating one embodiment of the present invention.

FIGS. 2A to 2D are cross-sectional views illustrating manufacturing steps of one embodiment of the present invention.

FIG. 8 is a perspective view illustrating one embodiment of a semiconductor device.

FIGS. 10A to 10C illustrate an electronic appliance.

DETAILED DESCRIPTION OF THE INVENTION

Figure 3A:
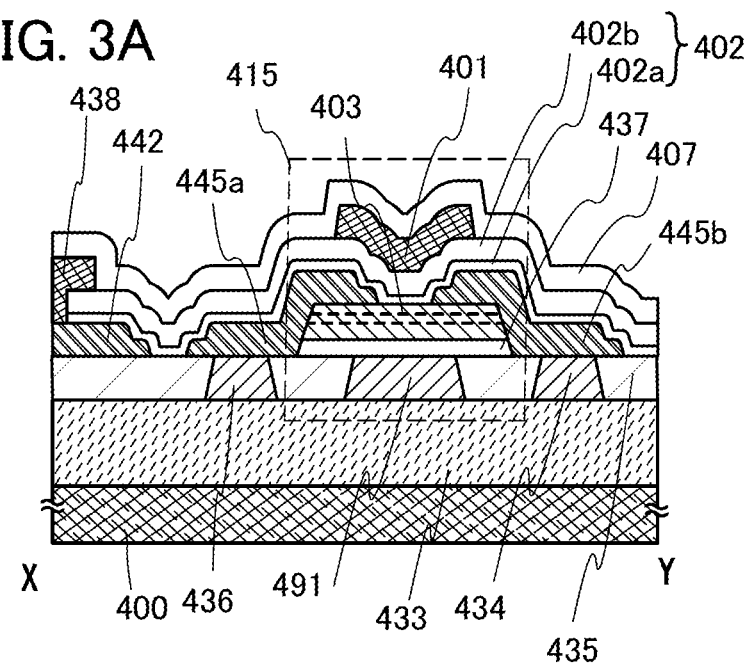
FIGS. 3A and 3B are a cross-sectional view and a top view illustrating one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

In this embodiment, one embodiment of a semiconductor device and one embodiment of a method for manufacturing the semiconductor device will be described with reference to FIGS. 2A to 2D. In this embodiment, an example of a method for manufacturing a transistor including an oxide semiconductor film is described.

First, an insulating film 433 is formed over a substrate 400 having an insulating surface and a conductive film is formed thereover by a sputtering method, an evaporation method, or the like. The conductive film is etched so that a conductive layer 491 and wiring layers 434 and 436 are formed.

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

For example, the insulating film 433 can be formed using one or more insulating films selected from the following: an oxide insulating film of silicon oxide, gallium oxide, hafnium oxide, yttrium oxide, aluminum oxide, or the like; a nitride insulating film of silicon nitride, aluminum nitride, or the like; an oxynitride insulating film of silicon oxynitride, aluminum oxynitride, or the like; or a nitride oxide insulating film of silicon nitride oxide or the like. Note that "silicon nitride oxide" refers to the one that contains more nitrogen than oxygen and "silicon oxynitride" refers to the one that contains more oxygen than nitrogen. Here, for example, silicon oxynitride refers to the one that contains oxygen, nitrogen, and silicon at concentrations ranging from 50 atomic % to 70 atomic %, 0.5 atomic % to 15 atomic %, and 25 atomic % to 35 atomic %, respectively. In the case where a substrate which is provided with a semiconductor element is used, a silicon nitride film which is deposited by a plasma chemical vapor deposition (CVD) method using a mixed gas of silane ($SiH_4$) and nitrogen ($N_2$) as a supply gas is preferably used as the insulating film 433. This silicon nitride film also functions as a barrier film and prevents hydrogen or a hydrogen compound from entering an oxide semiconductor layer to be formed later, thereby improving the reliability of the semiconductor device. A silicon nitride film deposited by a plasma CVD method using a mixed gas of silane ($SiH_4$), nitrogen ($N_2$), and ammonia ($NH_3$) as a supply gas includes fewer defects than the silicon nitride film deposited using a mixed gas of silane ($SiH_4$) and nitrogen ($N_2$) as a supply gas. When the silicon nitride film deposited using a mixed gas of silane ($SiH_4$), nitrogen ($N_2$), and ammonia ($NH_3$) is formed to a thickness greater than or equal to 300 nm and less than or equal to 400 nm, an ESD resistance can be 300 V or higher. Therefore, when a stack in which a silicon nitride film which is deposited using a mixed gas of silane ($SiH_4$) and nitrogen ($N_2$) as a supply gas is stacked over the silicon nitride film which is deposited to a thickness greater than or equal to 300 nm and less than or equal to 400 nm using a mixed gas of silane ($SiH_4$), nitrogen ($N_2$), and ammonia ($NH_3$) is used as the insulating film 433, a barrier film having a high ESD resistance can be achieved.

The conductive layer 491 and the wiring layers 434 and 436 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the conductive layer 491 and the wiring layers 434 and 436. The conductive layer 491 and the wiring layers 434 and 436 may have a single-layer structure or a stacked-layer structure.

The conductive layer 491 and the wiring layers 434 and 436 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the conductive layer 491 and the wiring layers 434 and 436 have a stacked structure of the above conductive material and the above metal material.

In order to obtain a normally-off switching element, it is preferable that the threshold voltage of the transistor is made positive by using a material having a work function of 5 eV (electron volts) or higher, preferably 5.5 eV or higher, for a gate electrode layer. Specifically, a material which includes an In—N bond and has a specific resistivity of $1\times10^{-1}$ Ω·cm to $1\times10^{-4}$ Ω·cm, preferably $5\times10^{-2}$ Ω·cm to $1\times10^{-4}$ Ω·cm, is used for the gate electrode layer. Examples of the material are an In—Ga—Zn-based oxide film containing nitrogen, an In—Sn—O film containing nitrogen, an In—Ga—O film containing nitrogen, an In—Zn—O film containing nitrogen, an In—O film containing nitrogen, and a metal nitride film (e.g., an InN film).

Next, an oxide insulating film is formed over the conductive layer 491 and the wiring layers 434 and 436. The oxide insulating film has a projecting portion reflecting the shape of the conductive layer 491 on its surface.

The oxide insulating film can be formed by a plasma CVD method, a sputtering method, or the like using any of silicon oxide, silicon oxynitride, aluminum oxide, aluminum oxynitride, hafnium oxide, gallium oxide, gallium oxide zinc, and zinc oxide, or a mixed material thereof. The oxide insulating film may have either a single-layer structure or a stacked-layer structure.

Then, polishing treatment (e.g., chemical mechanical polishing (CMP)) is performed, whereby an oxide insulating film 435 which is planarized is formed and top surfaces of the wiring layers 434 and 436 and a top surface of the conductive layer 491 are exposed. After the CMP treatment, cleaning is performed and heat treatment for removing moisture attached on the substrate is performed. A cross-sectional view of a structure obtained after this step corresponds to FIG. 2A.

After the planarization and the heat treatment, an insulating film 437 and a stack 403 of oxide semiconductor films are formed. A cross-sectional view of a structure obtained after this step corresponds to FIG. 2B.

Then, patterning is performed using one mask and the insulating film 437 and the stack 403 of oxide semiconductor films are selectively etched. A cross-sectional view of a structure obtained after this step corresponds to FIG. 2C. It is preferable that the insulating film 437 and the stack 403 of oxide semiconductor films be formed successively without being exposed to the air because interfaces of the films can be prevented from being contaminated by an impurity.

The insulating film 437 is formed by a plasma CVD method or a sputtering method. In the case where a plasma CVD method is used, it is particularly preferable to use a plasma CVD method in which plasma is generated utilizing electric-field energy of a microwave and a source gas for the insulating film is excited by the plasma, and the excited source gas is reacted on a surface of an object to deposit a reactant (also referred to as a microwave plasma CVD method). The insulating film formed by a plasma CVD method using a microwave is a dense film, and therefore, the insulating film 437 obtained by processing the insulating film is also a dense film. The insulating film 437 has a thickness greater than or equal to 5 nm and less than or equal to 300 nm.

The insulating film 437 can be formed using a single layer or a stack of layers selected from the following films: an oxide insulating film of silicon oxide, gallium oxide, hafnium oxide, yttrium oxide, aluminum oxide, or the like; an oxynitride insulating film of silicon oxynitride, aluminum oxynitride, or the like; or a nitride oxide insulating film of silicon nitride oxide or the like.

In this embodiment, the stack 403 of oxide semiconductor films has a three-layer structure in which the first oxide semiconductor film 403a, the second oxide semiconductor film 403b, and the third oxide semiconductor film 403c are stacked in this order, as illustrated in FIG. 2C.

For each of the oxide semiconductor films, a two-component metal oxide such as an In—Mg-based oxide or an In—Ga-based oxide, a three-component metal oxide such as an In—Ga—Zn-based oxide (also referred to as IGZO), an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, or an In—Sn—Hf—Zn-based oxide can be used.

As the first oxide semiconductor film 403a, a material film which can be represented as $M1_aM2_bM3_cO_x$ (a is a real number greater than or equal to 0 and less than or equal to 2, b is a real number greater than 0 and less than or equal to 5, c is a real number greater than or equal to 0 and less than or equal to 5, and x is an arbitrary real number) is used. In this embodiment, an In—Ga—Zn-based oxide film which is deposited using a sputtering target having an atomic ratio of In:Ga:Zn=1:1:1 and has a thickness greater than or equal to 5 nm and less than or equal to 15 nm is used. Further, the first oxide semiconductor film 403a may have an amorphous structure but is preferably a CAAC-OS film. Note that the first oxide semiconductor film 403a can be referred to as a first I-type oxide semiconductor layer.

As the second oxide semiconductor film 403b, a material film which can be represented as $M4_dM5_eM6_fO_x$ (d is a real number greater than 0 and less than or equal to 5, e is a real number greater than or equal to 0 and less than or equal to 3, f is a real number greater than 0 and less than or equal to 5, and x is an arbitrary positive number) is used. In this embodiment, an In—Ga—Zn-based oxide film is deposited to a thickness greater than or equal to 5 nm and less than or equal to 30 nm by a sputtering method using a sputtering target having an atomic ratio of In:Ga:Zn=3:1:2 in a mixed atmosphere containing oxygen and nitrogen or a mixed atmosphere containing a rare gas, oxygen, and nitrogen. Further, it is preferable that the second oxide semiconductor film 403b be a CAAC-OS film. Note that the second oxide semiconductor film 403b can be referred to as an N-type oxide semiconductor layer.

As the third oxide semiconductor film 403c, a material film which can be represented as $M7_gM8_hM9_iO_x$ (g is a real number greater than or equal to 0 and less than or equal to 2, h is a real number greater than 0 and less than or equal to 5, i is a real number greater than or equal to 0 and less than or equal to 5, and x is an arbitrary real number) is used. In this embodiment, an In—Ga—Zn-based oxide semiconductor film which is deposited by a sputtering method using a sputtering target having an atomic ratio of In:Ga:Zn=1:3:2 and has a thickness greater than or equal to 5 nm and less than or equal to 30 nm is used. Note that the third oxide semiconductor film 403c can be referred to as a second I-type oxide semiconductor layer. Further, the third oxide semiconductor film 403c may have an amorphous structure but is preferably a CAAC-OS film. The third oxide semiconductor film 403c is in contact with a source electrode layer and a drain electrode layer, whereby the threshold voltage is determined.

With such a stacked-layer structure, a structure in which the second oxide semiconductor film 403b through which carriers flow is not in contact with the insulating film containing silicon is obtained.

Polycrystalline targets are used as the sputtering targets for forming the first oxide semiconductor film 403a and the second oxide semiconductor film 403b so that the first oxide semiconductor film 403a and the second oxide semiconductor film 403b are CAAC-OS films. Further, when a sputtering target having a composition which easily causes crystallization is used for forming the first oxide semiconductor film 403a, the second oxide semiconductor film 403b in contact with the first oxide semiconductor film 403a can also be crystallized. The number of levels at an interface between the first oxide semiconductor film 403a and the second oxide semiconductor film 403b is small, and thus high field-effect mobility can be achieved. It is preferable that the thicknesses and compositions are adjusted so that carriers flow only through the second oxide semiconductor film 403b.

When the insulating film 437 and the first oxide semiconductor film 403a are deposited successively without being exposed to the air, impurity contamination of an interface between the insulating film 437 and the first oxide semiconductor film 403a can be prevented; when the second oxide semiconductor film 403b and the third oxide semiconductor film 403c are deposited successively without being exposed to the air, impurity contamination of an interface between the second oxide semiconductor film 403b and the third oxide semiconductor film 403c can be prevented. The third oxide semiconductor film 403c also functions as a protective film that protects the second oxide semiconductor film 403b from exposure to the air in etching or the like in a later step.

Figure 15:
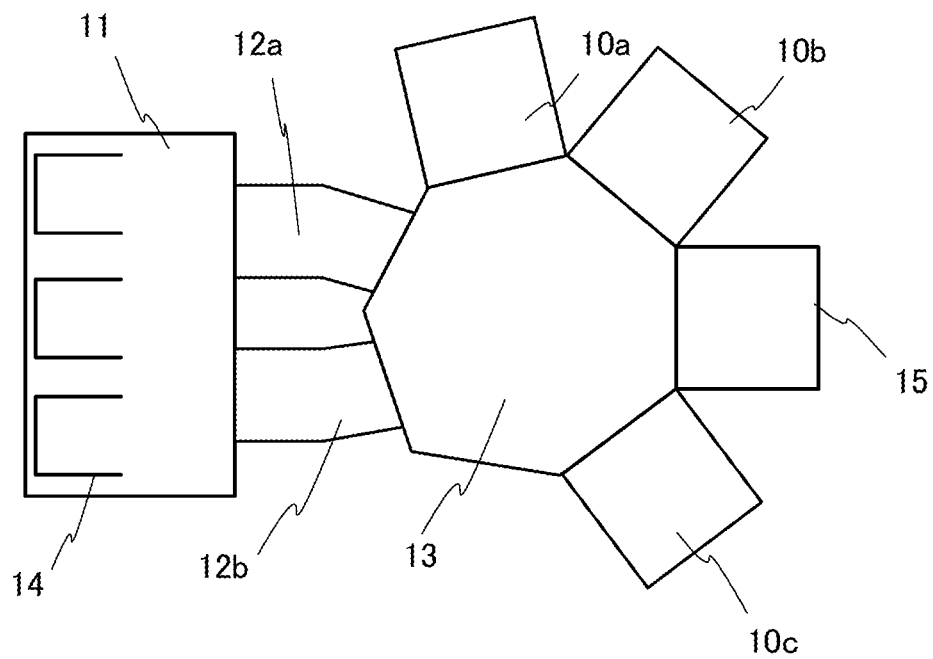
FIG. 15 is a top view illustrating an example of an apparatus for manufacturing a semiconductor device.

In the case where steps for stacking the first oxide semiconductor film 403a, the second oxide semiconductor film 403b, and the third oxide semiconductor film 403c in this order are performed successively without exposure to the air, a manufacturing apparatus a top view of which is illustrated in FIG. 15 may be used.

The manufacturing apparatus illustrated in FIG. 15 is single wafer multi-chamber equipment, which includes three sputtering devices 10a, 10b, and 10c, a substrate supply chamber 11 provided with three cassette ports 14 for holding a process substrate, load lock chambers 12a and 12b, a transfer chamber 13, a substrate heating chamber 15, and the like. Note that a transfer robot for transferring a substrate to be treated is provided in each of the substrate supply chamber 11 and the transfer chamber 13. The atmospheres of the sputtering devices 10a, 10b, and 10c, the transfer chamber 13, and the substrate heating chamber 15 are preferably controlled so as to hardly contain hydrogen and moisture (i.e., as an inert atmosphere, a reduced pressure atmosphere, or a dry air atmosphere). For example, a preferable atmosphere is a dry nitrogen atmosphere in which the dew point of moisture is −40° C. or lower, preferably −50° C. or lower. An example of a procedure of the manufacturing steps with use of the manufacturing apparatus illustrated in FIG. 15 is as follows. The process substrate is transferred from the substrate supply chamber 11 to the substrate heating chamber 15 through the load lock chamber 12a and the transfer chamber 13; moisture attached to the process substrate is removed by vacuum baking in the substrate heating chamber 15; the process substrate is transferred to the sputtering device 10c through the transfer chamber 13; and the first oxide semiconductor film 403a is deposited in the sputtering device 10c. Then, the process substrate is transferred to the sputtering device 10a through the transfer chamber 13 without exposure to air, and the second oxide semiconductor film 403b is deposited in the sputtering device 10a. Then, the process substrate is transferred to the sputtering device 10b through the transfer chamber 13, and the third oxide semiconductor film 403c is deposited in the sputtering device 10b. If needed, the process substrate is transferred to the substrate heating chamber 15 through the transfer chamber 13 without exposure to air and heat treatment is performed. As described above, with use of the manufacturing apparatus illustrated in FIG. 15, a manufacturing process can proceed without exposure to air. Further, with of the sputtering devices in the manufacturing apparatus in FIG. 15, a process performed without exposure to the air can be achieved by change of the sputtering target. As the sputtering devices in the manufacturing apparatus in FIG. 15, a parallel plate sputtering device, an ion beam sputtering device, a facing-target sputtering device, or the like may be used. In a facing-target type sputtering device, an object surface is separated from plasma and thus damage in deposition is small; therefore, a CAAC-OS film having high crystallinity can be formed.

In order that the second oxide semiconductor film 403b through which carriers flow is not in contact with the insulating film containing silicon, top and bottom interfaces of the second oxide semiconductor film 403b are protected with the first oxide semiconductor film 403a and third oxide semiconductor film 403c so that an impurity such as silicon does not enter the second oxide semiconductor film 403b and the interfaces thereof; accordingly, high field-effect mobility is achieved.

After the insulating film 437 and the stack 403 of oxide semiconductor films are formed, a conductive film is formed. This conductive film is selectively etched, so that electrode layers 445a and 445b and a conductive layer 442 are formed. A cross-sectional view of a structure obtained after this step corresponds to FIG. 2D. By performing etching plural times at this time, electrodes which have projecting regions in their bottom edge portions when seen in cross-section are formed. The electrode layers 445a and 445b having the projecting regions in the bottom edge portions function as a source electrode layer and a drain electrode layer of the transistor. The electrode layer 445a is provided on and in contact with the wiring layer 436 and the electrode layer 445b is provided on and in contact with the wiring layer 434.

A distance between the electrode layers 445a and 445b corresponds to a channel length L of the transistor. In order that the channel length L of the transistor is less than 50 nm, for example, approximately 20 nm, it is preferable that a resist be subjected to light exposure using an electron beam and the developed mask be preferably used as an etching mask of the conductive film. At a higher acceleration voltage, an electron beam can provide a more precise pattern. The use of multiple electron beams can shorten the process time per substrate. In an electron beam writing apparatus capable of electron beam irradiation, the acceleration voltage is preferably in the range from 5 kV to 50 kV, for example. The current intensity is preferably in the range from $5 \times 10^{-12}$ A to $1 \times 10^{-11}$ A. The minimum beam size is preferably 2 nm or less. The minimum possible pattern line width is preferably 8 nm or less. Under the above conditions, a pattern with a width of, for example, 30 nm or less, preferably 20 nm or less, more preferably 8 nm or less, can be obtained.

The insulating film 402 is provided over the electrode layers 445a and 445b and the conductive layer 442 and also provided over the stack 403 of oxide semiconductor films. A material of the insulating film 402 can be a silicon oxide film, a gallium oxide film, a gallium oxide zinc film, a $Ga_2O_3$ $(Gd_2O_3)$ film, a zinc oxide film, an aluminum oxide film, a silicon nitride film, a silicon oxynitride film, an aluminum oxynitride film, or a silicon nitride oxide film. As another material of the insulating film 402, an In—Ga—Zn-based oxide film having an insulating property can be given. The In—Ga—Zn-based oxide film having an insulating property may be formed under the following conditions: a sputtering target having an atomic ratio of In:Ga:Zn=1:3:2 is used, the substrate temperature is room temperature, and an argon gas or a mixed gas of argon and oxygen are used as sputtering gases.

It is preferable that the insulating film 402 include a region containing oxygen in a proportion higher than that of the stoichiometric composition (an oxygen-excess region). This is because, when an insulating layer in contact with the stack 403 of oxide semiconductor films includes an oxygen-excess region, oxygen can be supplied to the stack 403 of oxide semiconductor films, release of oxygen from the stack 403 of oxide semiconductor films can be prevented, and oxygen vacancies can be filled. In order to provide the oxygen-excess region in the insulating film 402, the insulating film 402 is formed in an oxygen atmosphere, for example. Alternatively, oxygen may be introduced into the deposited insulating film 402 to provide the oxygen-excess region therein. Further, as illustrated in FIG. 3A, the insulating film 402 preferably has a stacked-layer structure of a first insulating film 402a and a second insulating film 402b. The stacked-layer structure is formed in such a manner that, over an insulating film including a region containing excess oxygen (oxygen-excess region), a silicon oxide film or a silicon oxynitride film is formed on a condition where a high frequency power higher than or equal to 0.17 W/cm² and lower than or equal to 0.5 W/cm², preferably higher than or equal to 0.26 W/cm² and lower than or equal to 0.35 W/cm², is supplied. Specifically, the silicon oxynitride film is formed in conditions where silane ($SiH_4$) and dinitrogen monoxide ($N_2O$) are supplied as source gases at 160 sccm and 4000 sccm, respectively; the pressure of a treatment chamber is adjusted to 200 Pa; and a power of 1500 W is supplied with a high-frequency power supply of 27.12 MHz. Further, the substrate temperature at which the silicon oxynitride film is formed is set to 220° C.

Next, the insulating film 402 is selectively etched to form an opening reaching the conductive layer 442. After that, a conductive film is formed and selectively etched, whereby an electrode layer 438 which is electrically connected to the conductive layer 442 is formed and a gate electrode layer 401 is formed over the stack 403 of oxide semiconductor films with the insulating film 402 positioned therebetween. Then, an insulating film 407 functioning as a barrier film is provided to cover the gate electrode layer 401 and the electrode layer 438.

As the insulating film 407, it is preferable to use a silicon nitride film which is deposited by a plasma CVD method in which a mixed gas of silane ($SiH_4$) and nitrogen ($N_2$) is supplied. This silicon nitride film functions as a barrier film and prevents hydrogen or a hydrogen compound from entering an oxide semiconductor layer to be formed later, thereby improving the reliability of the semiconductor device.

The gate electrode layer 401 and the electrode layer 438 can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode layer 401 and the electrode layer 438. The gate electrode layer 401 and the electrode layer 438 each have either a single-layer structure or a stacked-layer structure.

In this embodiment, a tungsten film is used as the gate electrode layer 401 on and in contact with the insulating film 402.

Through the above process, a transistor 415 of this embodiment can be manufactured (see FIG. 3A). The transistor 415 is an example of a dual-gate transistor. FIG. 3A is a cross-sectional view of the transistor 415 in the channel length direction. In the dual-gate transistor 415, the insulating film 437 serves as a first gate insulating film and the insulating film 402 serves as a second gate insulating film.

The conductive layer 491 can function as a second gate electrode layer (also referred to as back gate) for controlling the electrical characteristics of the transistor 415. For example, by setting the potential of the conductive layer 491 to GND (or a fixed potential), the threshold voltage of the transistor 415 is increased, so that the transistor 415 can be normally off.

Further, when the conductive layer 491 and the insulating film 437 are not provided, the top-gate transistor illustrated in FIG. 1A can be manufactured. In the case where the transistor in FIG. 1A is manufactured, the same process can be used except that the insulating film 437 is not provided between the conductive layer 491 and the oxide semiconductor stack and that a nitride insulating film 444 is provided below the oxide insulating film 435; therefore, detailed description is omitted there. Alternatively, when the layout is changed, a dual-gate transistor and a top-gate transistor both can be manufactured over the same substrate without change in the number of steps.

In the transistor 418 in FIG. 1A, the nitride insulating film 444, the oxide insulating film 435, the first oxide semiconductor film 403a, the second oxide semiconductor film 403b, the third oxide semiconductor film 403c, the first insulating film 402a, and the second insulating film 402b are stacked in this order over the substrate 400, and the second oxide semiconductor film 403b is separated from the insulating film containing silicon. Further, it is preferable that a silicon nitride film be used as the nitride insulating film 444 and a silicon nitride film be used as the second insulating film 402b or a silicon nitride film be used as the insulating film 407. With such a structure, moisture and hydrogen can be prevented from entering the second oxide semiconductor film 403b from the outside; thus the reliability of the transistor is improved.

Figure 3B:
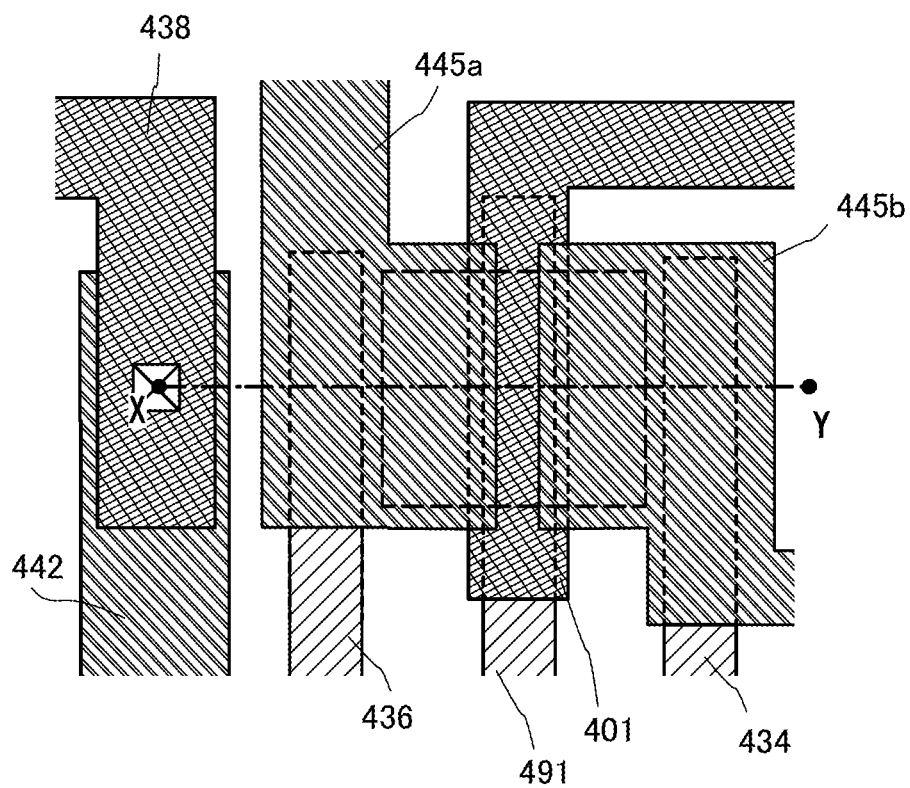

FIG. 3B is an example of a top view of the transistor 415. FIG. 3A is a cross section taken along a chain line X-Y in FIG. 3B.

Embodiment 2

In this embodiment, a structural example in FIG. 4A which is partly different from the structure of FIG. 1A and a manufacturing method thereof are described below.

First, over the substrate 400, the oxide insulating film 435 is formed. The oxide insulating film 435 can be formed by a plasma CVD method, a sputtering method, or the like, using silicon oxide, silicon oxynitride, aluminum oxide, aluminum oxynitride, hafnium oxide, gallium oxide, gallium oxide zinc, zinc oxide, or a mixed material of any of these materials. The oxide insulating film 435 may have either a single-layer structure or a stacked-layer structure. If needed, a nitride insulating film such as a silicon nitride film may be provided between the substrate 400 and the oxide insulating film 435.

Next, the first oxide semiconductor film 403a and the second oxide semiconductor film 403b are formed by patterning using the same mask, and then the third oxide semiconductor film 403c is formed. Since the third oxide semiconductor film 403c is formed using a different mask from the first and second oxide semiconductor films 403a and 403b, the third oxide semiconductor film 403c can cover the side surface of the first oxide semiconductor film 403a and the side and top surfaces of the second oxide semiconductor film 403b as illustrated in FIG. 4A. Note that in this embodiment, all of the first to third oxide semiconductor layers have an amorphous structure. However, one embodiment of the present invention is not limited thereto; it is possible that all of the first to third oxide semiconductor layers are CAAC-OS films or at least one of the first to third oxide semiconductor layers has an amorphous structure.

Subsequently, a conductive film is formed. This conductive film is selectively etched, so that the electrode layers 445a and 445b are formed.

Then, the insulating film 402 is provided over the electrode layers 445a and 445b, and is also provided over the third oxide semiconductor film 403c. As illustrated in FIG. 4B, since the side surface of the second oxide semiconductor film 403b is covered with the third oxide semiconductor film 403c, the side surface of the second oxide semiconductor film 403b is not in contact with the insulating film 402.

Next, a conductive film is formed over the insulating film 402 and selectively etched to form the gate electrode layer 401 over the third oxide semiconductor film 403c with the insulating film 402 positioned therebetween. The insulating film 407 functioning as a barrier film is provided so as to cover the gate electrode layer 401.

Figure 4A:
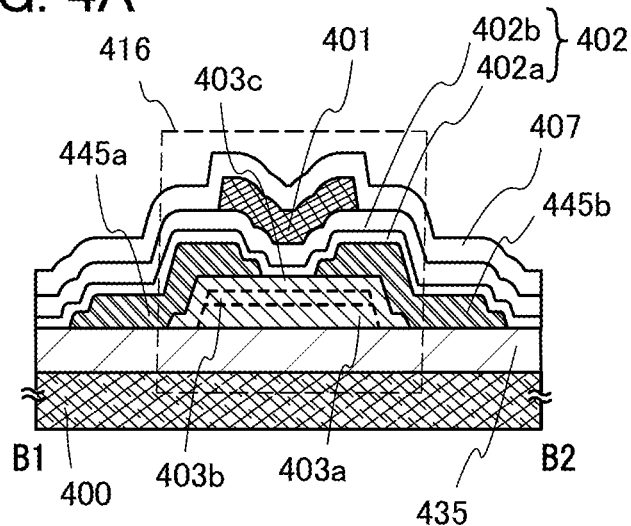
FIGS. 4A to 4C are cross-sectional views and a top view illustrating one embodiment of the present invention.
Figure 4B:
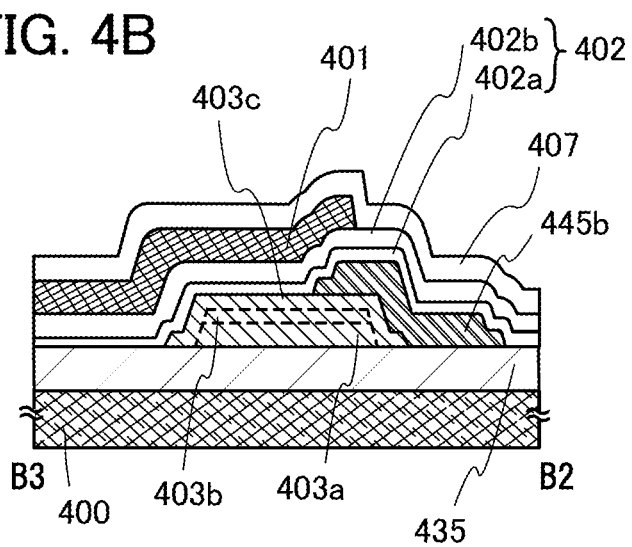
Figure 4C:
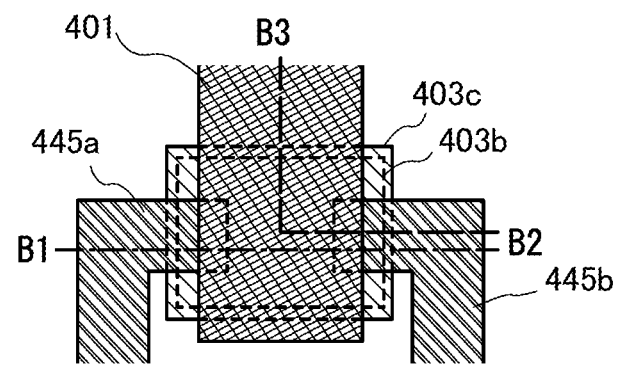

Through the above process, a transistor 416 illustrated in FIG. 4A can be manufactured. FIG. 4C is a top view. A cross section taken along a chain line B1-B2 in FIG. 4C corresponds to FIG. 4A and a cross section taken along a dotted line B2-B3 in FIG. 4C corresponds to FIG. 4B. As illustrated in FIG. 4C, the periphery of the third oxide semiconductor film 403c is positioned outside the periphery of the second oxide semiconductor film 403b.

This embodiment can be freely combined with Embodiment 1. Portions denoted by the same reference numerals as those of the drawings used in Embodiment 1 can be formed using the same material as those of Embodiment 1. Instead of the stack 403 of oxide semiconductor films described in Embodiment 1, a structure in which the third oxide semiconductor film 403c covers the side surface of the first oxide semiconductor film 403a and the side and top surfaces of the second oxide semiconductor film 403b may be employed. Since the third oxide semiconductor film 403c can be provided between the second oxide semiconductor film 403b and the electrode layer 445a, leakage current can be reduced.

Embodiment 3

In this embodiment, an example of a semiconductor device including the transistor described in Embodiment 1 is described with reference to FIGS. 5A and 5B.

Figure 5A:
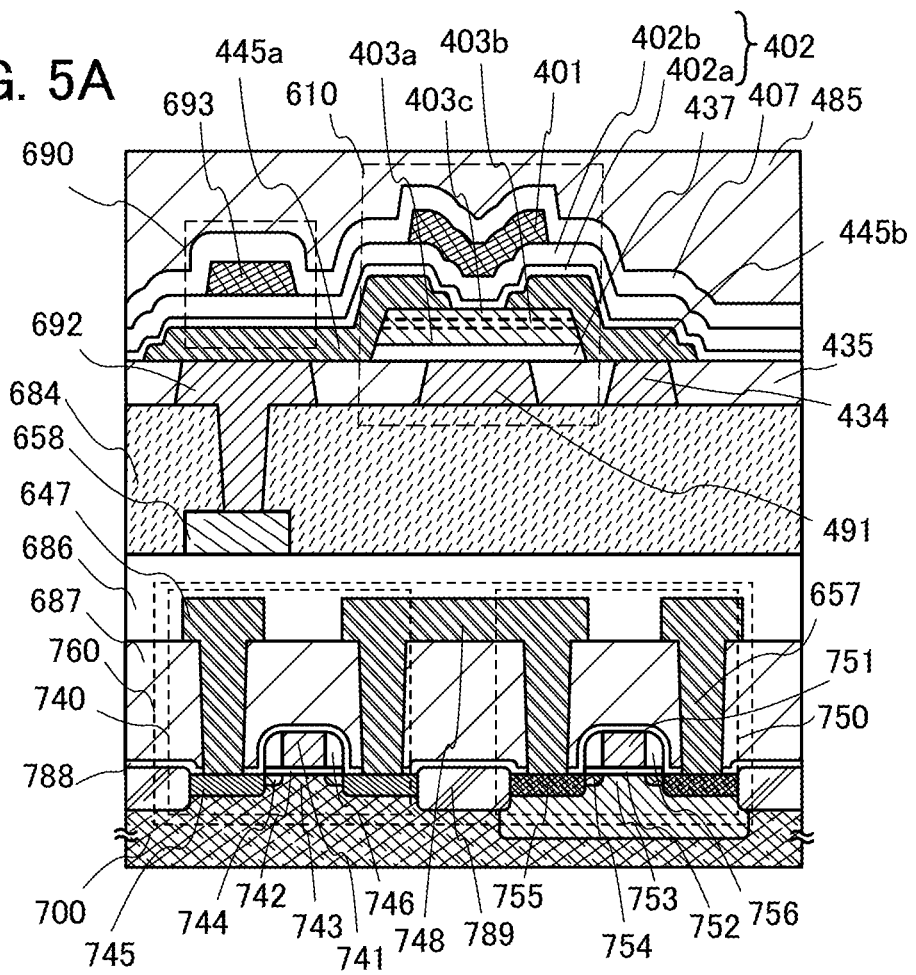
FIGS. 5A and 5B are a cross-sectional view and a circuit diagram illustrating one embodiment of a semiconductor device.
Figure 5B:
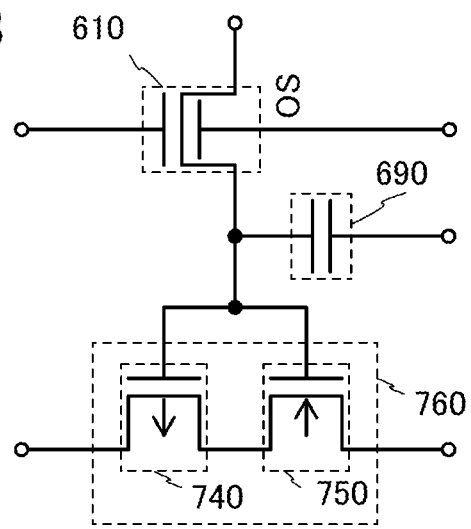

The semiconductor device illustrated in FIGS. 5A and 5B includes transistors 740 and 750 including a first semiconductor material in a lower portion, and a transistor 610 including a second semiconductor material in an upper portion. The transistor 610 has the same structure as the transistor 415 described in Embodiment 1. The same reference numerals are used for the same parts as those in FIGS. 3A and 3B. FIG. 5B is a circuit diagram of the semiconductor device in FIG. 5A.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material such as silicon can operate at high speed easily. On the other hand, a transistor including an oxide semiconductor enables charge to be held for a long time owing to its characteristics.

As a substrate used in the semiconductor device, a single crystal semiconductor substrate or a polycrystalline semiconductor substrate made of silicon or silicon carbide, a compound semiconductor substrate made of silicon germanium or the like, a silicon on insulator (SOI) substrate, or the like can be used. A channel formation region of the transistor can be formed in or over the semiconductor substrate. The semiconductor device in FIG. 5A is an example in which the channel formation region is formed in the semiconductor substrate to form a lower transistor.

In the semiconductor device in FIG. 5A, a single crystal silicon substrate is used as a substrate 700, the transistors 740 and 750 are formed using the single crystal silicon substrate, and single crystal silicon is used as the first semiconductor material. The transistor 740 is an n-channel transistor and the transistor 750 is a p-channel transistor. The transistor 740 and the transistor 750 which are electrically connected to each other form a complementary metal oxide semiconductor (CMOS) circuit 760.

In this embodiment, the single crystal silicon substrate imparting p-type conductivity is used as the substrate 700; thus, an n-well is formed by adding an impurity element imparting n-type conductivity to a region in which the p-channel transistor 750 is to be formed. A channel formation region 753 of the transistor 750 is formed in the n-well. As the impurity element imparting n-type conductivity, phosphorus (P), arsenic (As), or the like can be used.

Therefore, an impurity element imparting p-type conductivity is not added to a formation region of the transistor 740 that is the n-channel transistor; however, a p-well may be formed by adding an impurity element imparting p-type conductivity. As the impurity element imparting p-type conductivity, boron (B), aluminum (Al), gallium (Ga), or the like may be used.

Meanwhile, when a single-crystal silicon substrate imparting n-type conductivity is used, an impurity element imparting p-type conductivity may be added to form a p-well.

The transistor 740 includes a channel formation region 743, an n-type impurity region 744 functioning as a lightly doped drain (LDD) region or an extension region, an n-type impurity region 745 functioning as a source region or a drain region, a gate insulating film 742, and a gate electrode layer 741. The n-type impurity region 745 has a higher impurity concentration than the n-type impurity region 744. The side surface of the gate electrode layer 741 is provided with a sidewall insulating layer 746. With the use of the gate electrode layer 741 and the sidewall insulating layer 746 as masks, the n-type impurity region 744 and the n-type impurity region 745 which have different impurity concentrations can be formed in a self-aligned manner.

The transistor 750 includes the channel formation region 753, a p-type impurity region 754 functioning as a lightly doped drain (LDD) region or an extension region, a p-type impurity region 755 functioning as a source region or a drain region, a gate insulating film 752, and a gate electrode layer 751. The p-type impurity region 755 has a higher impurity concentration than the p-type impurity region 754. The side surface of the gate electrode layer 751 is provided with a sidewall insulating layer 756. With the use of the gate electrode layer 751 and the sidewall insulating layer 756 as masks, the p-type impurity region 754 and the p-type impurity region 755 which have different impurity concentrations can be formed in a self-aligned manner.

In the substrate 700, the transistor 740 and the transistor 750 are isolated from each other by an element isolation region 789. An insulating film 788 and an insulating film 687 are stacked over the transistor 740 and the transistor 750. A wiring layer 647 in contact with the n-type impurity region 745 through an opening in the insulating film 788 and the insulating film 687 and a wiring layer 657 in contact with the p-type impurity region 755 through an opening in the insulating film 788 and the insulating film 687 are provided over the insulating film 687. A wiring layer 748 is provided over the insulating film 687 so as to electrically connect the transistor 740 and the transistor 750. The wiring layer 748 is electrically connected to the n-type impurity region 745 through an opening in the insulating film 788 and the insulating film 687 and reaching the n-type impurity region 745. Further, the wiring layer 748 is electrically connected to the p-type impurity region 755 through an opening in the insulating film 788 and the insulating film 687 and reaching the p-type impurity region 755.

An insulating film 686 is provided over the insulating film 687, the wiring layer 647, the wiring layer 748, and the wiring layer 657. A wiring layer 658 is formed over the insulating film 686. The wiring layer 658 is electrically connected to a gate wiring through an opening in the insulating films 788, 687, and 686. The gate wiring is formed over the gate insulating film 742 or the gate insulating film 752. The gate wiring branches into the gate electrode layer 741 and the gate electrode layer 751.

The semiconductor device of this embodiment is not limited to the structure in FIG. 5A. As the transistors 740 and 750, a transistor containing silicide (salicide) or a transistor which does not include a sidewall insulating layer may be used. When a structure that contains silicide (salicide) is used, the resistance of the source region and the drain region can be further lowered and the operation speed of the semiconductor device is increased. Further, the semiconductor device can be operated at low voltage, so that power consumption of the semiconductor device can be reduced.

Next, the structures of upper elements provided over the lower transistor in the semiconductor device in FIGS. 5A and 5B are described.

An insulating film 684 is stacked over the insulating film 686 and the wiring layer 658. The conductive layer 491 and a wiring layer 692 are formed over the insulating film 684.

The oxide insulating film 435 is provided over the conductive layer 491 and the wiring layer 692. The insulating film 437 is provided over the oxide insulating film 435. The first oxide semiconductor film 403a is provided over the insulating film 437. The second oxide semiconductor film 403b which has a different composition from the first oxide semiconductor film 403a, and the third oxide semiconductor film 403c which has substantially the same composition as the first oxide semiconductor film 403a are provided over the first oxide semiconductor film 403a. Further, the electrode layer 445a which has a projecting region in its bottom edge portion and the electrode layer 445b which has a projecting region in its bottom edge portion are provided over the third oxide semiconductor film 403c. The insulating film 402 is provided on and in contact with a region of the second oxide semiconductor film 403b which does not overlap with the electrode layer 445a or the electrode layer 445b (the channel formation region), and the gate electrode layer 401 is provided thereover.

A capacitor 690 is provided over the same oxide insulating film 435 as the transistor 610 without an increase in the number of steps. In the capacitor 690, the electrode layer 445a serves as one electrode, a capacitor electrode layer 693 serves as the other electrode, and the insulating film 402 provided therebetween serves as a dielectric. The capacitor electrode layer 693 is formed in the same step as the gate electrode layer 401.

By setting the potential of the conductive layer 491 to GND (or a fixed potential), the conductive layer 491 serves as a back gate which controls the electrical characteristics of the transistor 610. The conductive layer 491 has a function of preventing static electricity. In the case where the threshold voltage of the transistor 610 is not required to be controlled by the conductive layer 491 in order to make the transistor 610 be a normally-off transistor, the conductive layer 491 is not necessarily provided. In the case where the transistor 610 is used for part of a particular circuit and a problem might be caused by providing the conductive layer 491, the conductive layer 491 is not necessarily provided in the circuit.

The wiring layer 692 is electrically connected to the wiring layer 658 through an opening in the insulating film 684. In the example in this embodiment, the insulating film 684 is subjected to planarization treatment using a CMP method.

In the semiconductor device, the insulating film 684 is provided between the lower portion and the upper portion, and functions as a barrier film to prevent impurities such as hydrogen, which cause deterioration or a change in electrical characteristics of the transistor 610 in the upper portion, from entering the upper portion from the lower portion. Thus, a fine inorganic insulating film (e.g., an aluminum oxide film or a silicon nitride film) having a good property of blocking impurities or the like is preferably used as the insulating film 684.

The insulating film 684 can be formed by using the same material as the insulating film 433 described in Embodiment 1.

In the case of using the same manufacturing method as that described in Embodiment 1, the transistor 610 can be manufactured similarly to the transistor 415. After that insulating film 407 is formed, an interlayer insulating film 485 is formed. Further, a semiconductor device having a multilayer structure in which an embedded wiring is formed in the interlayer insulating film 485 and another semiconductor element, another wiring, or the like is formed above the embedded wiring may be manufactured.

This embodiment can be freely combined with Embodiment 1 or Embodiment 2.

Embodiment 4

Figure 6A:
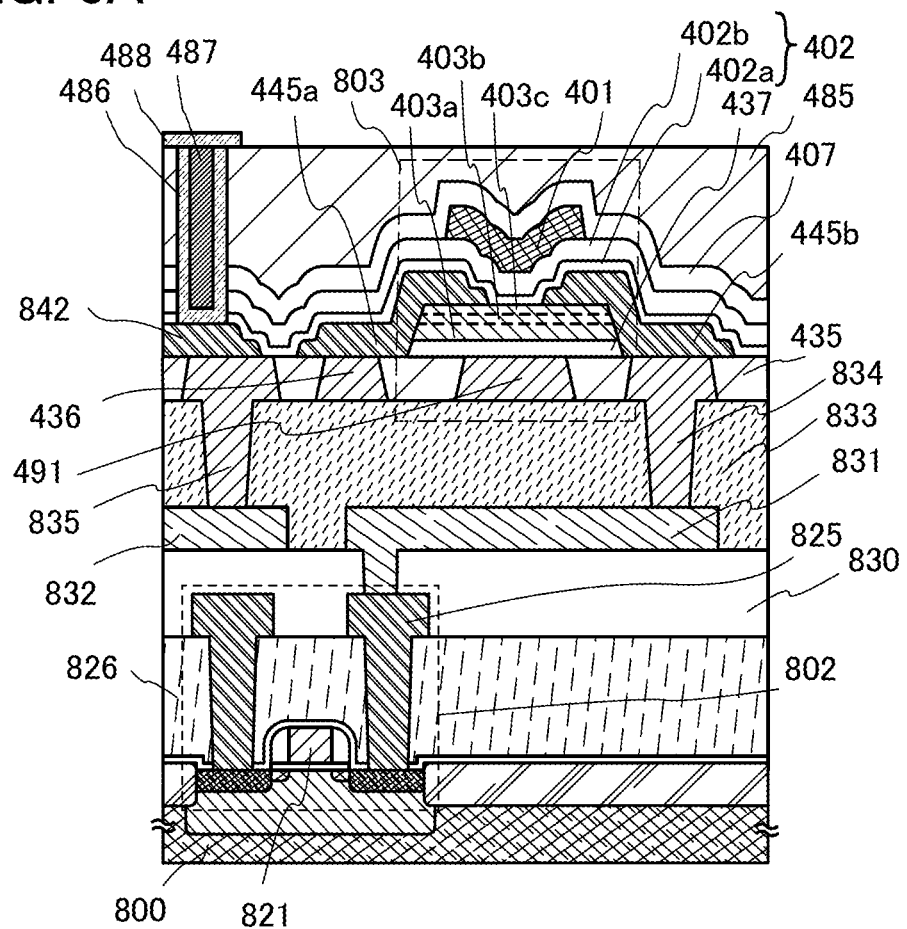
FIGS. 6A to 6C are a cross-sectional view and circuit diagrams illustrating one embodiment of a semiconductor device.
Figure 6B:
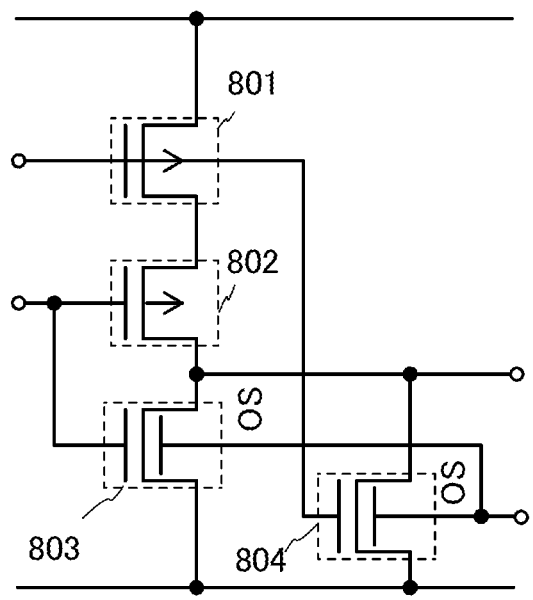
Figure 6C:
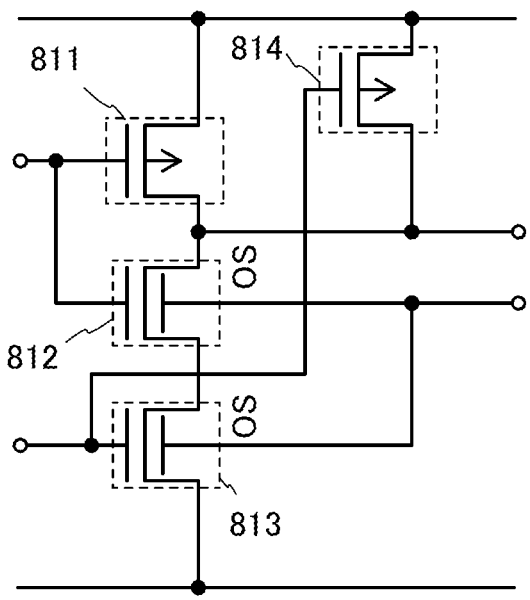

As another example of a semiconductor device including the transistor described in Embodiment 1, a cross-sectional view of a NOR circuit, which is a logic circuit, is illustrated in FIG. 6A. FIG. 6B is a circuit diagram of the NOR circuit in FIG. 6A, and FIG. 6C is a circuit diagram of a NAND circuit.

In the NOR circuit illustrated in FIGS. 6A and 6B, p-channel transistors 801 and 802 each have a structure similar to that of the transistor 750 in FIGS. 5A and 5B in that a single crystal silicon substrate is used for a channel formation region, and n-channel transistors 803 and 804 each have a structure similar to that of the transistor 610 in FIGS. 5A and 5B and that of the transistor 415 in Embodiment 1 in that an oxide semiconductor film is used for a channel formation region.

In the NOR circuit and the NAND circuit illustrated in FIGS. 6A and 6B, a conductive layer 491 for controlling electrical characteristics of the transistors is provided to overlap with gate electrode layers with oxide semiconductor films provided therebetween in the transistors 803 and 804. By controlling the potential of the conductive layer to GND, for example, the threshold voltages of the transistors 803 and 804 are increased, so that the transistors can be normally off. In the NOR circuit in this embodiment, conductive layers which are provided in the transistors 803 and 804 and can function as back gates are electrically connected to each other. However, the present invention is not limited to the structure, and the conductive layers functioning as back gates may be electrically controlled independently.

In the semiconductor device illustrated in FIG. 6A, a single crystal silicon substrate is used as a substrate 800, the transistor 802 is formed using the single crystal silicon substrate, and the transistor 803 in which stacked oxide semiconductor films are used for a channel formation region is formed over the transistor 802.

The gate electrode layer 401 of the transistor 803 is electrically connected to a wiring layer 832. The wiring layer 832 is electrically connected to a wiring layer 835. The gate electrode layer 401 of the transistor 803 is electrically connected to an embedded wiring, and the embedded wiring is electrically connected to an electrode layer 842. Note that the embedded wiring includes a first barrier metal film 486, a second barrier metal film 488, and a low-resistance conductive layer 487 surrounded by the first barrier metal film 486 and the second barrier metal film 488.

The embedded wiring is formed in such a manner that a contact hole reaching the electrode layer 842 is formed in the interlayer insulating film 485, the first barrier metal film 486 is formed, and a copper film or a copper alloy film is formed thereover so as to form the low-resistance conductive layer 487. Then, polishing is performed for planarization, and the second barrier metal film 488 is formed so as to protect the exposed low-resistance conductive layer 487.

Each of the first barrier metal film 486 and the second barrier metal film 488 may be formed using a conductive material which suppresses diffusion of copper contained in the low-resistance conductive layer 487. Examples of the conductive material are a tantalum nitride film, a molybdenum nitride film, and a tungsten nitride film.

The wiring layer 832 is provided in an opening formed in an insulating film 826 and an insulating film 830. The wiring layer 835 is provided in an opening formed in an insulating film 833. The electrode layer 842 is formed over the wiring layer 835.

An electrode layer 825 of the transistor 802 is electrically connected the electrode layer 445*b* of the transistor 803 through wiring layers 831 and 834. The wiring layer 831 is formed in an opening in the insulating film 830, and the wiring layer 834 is formed in an opening in the insulating film 833. The electrode layer 445*a* and the electrode layer 445*b* function as source and drain electrode layers of the transistor 803.

The first oxide semiconductor film 403*a* is formed on and in contact with the insulating film 437. The third oxide semiconductor film 403*c* is formed on and in contact with the second oxide semiconductor film 403*b*. With the insulating film 437 and the insulating film 402, unnecessary release of oxygen can be suppressed, and the second oxide semiconductor film 403*b* can be kept in an oxygen excess state. Thus, in the transistor 803, oxygen vacancies in the second oxide semiconductor film 403*b* and at the interface thereof can be filled efficiently. The transistor 804 has a structure and an effect which are similar to those of the transistor 803.

In the NAND circuit in FIG. 6C, p-channel transistors 811 and 814 each have a structure similar to that of the transistor 750 in FIGS. 5A and 5B, and n-channel transistors 812 and 813 each have a structure similar to that of the transistor 610 in FIGS. 5A and 5B in that an oxide semiconductor film is used for a channel formation region.

In the NAND circuit illustrated in FIG. 6C, conductive layers controlling electrical characteristics of the transistors are provided to overlap with gate electrode layers with oxide semiconductor films provided therebetween in the transistors 812 and 813. By controlling the potential of the conductive layer to GND, for example, the threshold voltages of the transistors 812 and 813 are increased, so that the transistors can be normally off. In the NAND circuit in this embodiment, the conductive layers which are provided in the transistors 812 and 813 and function as back gates are electrically connected to each other. However, the present invention is not limited to the structure, and the conductive layers functioning as back gates may be electrically controlled independently.

By applying a transistor including an oxide semiconductor for a channel formation region and having extremely small off-state current to the semiconductor device in this embodiment, power consumption of the semiconductor device can be sufficiently reduced.

A semiconductor device which is miniaturized, is highly integrated, and has stable and excellent electrical characteristics by stacking semiconductor elements including different semiconductor materials and a method for manufacturing the semiconductor device can be provided.

The NOR circuit and the NAND circuit including the transistors described in Embodiment 1 are described as examples in this embodiment; however, the present invention is not limited to the circuits, and an AND circuit, an OR circuit, or the like can be formed using the transistors described in Embodiment 1 or 2. For example, a semiconductor device (storage device) in which stored data can be held even when power is not supplied and which has an unlimited number of times of writing with the transistors described in Embodiment 1 or 2 can be manufactured.

Figure 7:
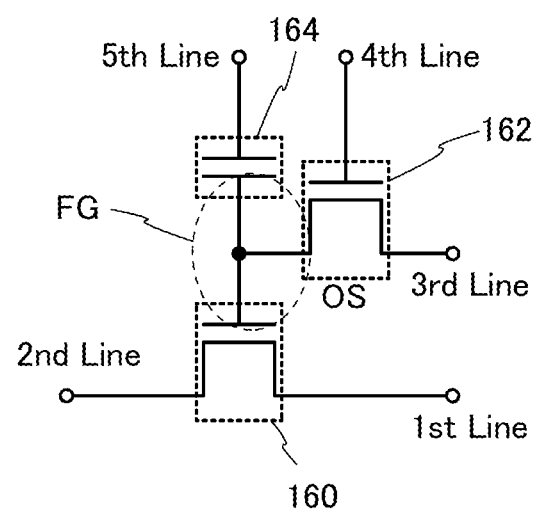
FIG. 7 is a circuit diagram illustrating one embodiment of a semiconductor device.

FIG. 7 is an example of a circuit diagram of a semiconductor device.

In FIG. 7, a first wiring (a 1st line) is electrically connected to a source electrode layer of a transistor 160. A second wiring (2nd line) is electrically connected to a drain electrode layer of the transistor 160. Any of the transistors 750 and 802 described in this embodiment can be used as the transistor 160.

A third wiring (3rd line) is electrically connected to one of a source electrode layer and a drain electrode layer of a transistor 162, and a fourth wiring (4th line) is electrically connected to a gate electrode layer of the transistor 162. A gate electrode layer of the transistor 160 and the other of the source electrode and the drain electrode of the transistor 162 are electrically connected to one electrode of the capacitor 164. A fifth wiring (5th line) and the other electrode of the capacitor 164 are electrically connected to each other.

For the transistor 162, any of the structures of the transistors 415, 416, and 417 described in Embodiment 1 or 2 can be used.

The semiconductor device having the circuit configuration in FIG. 7 utilizes a characteristic in which the potential of the gate electrode layer of the transistor 160 can be held, and thus enables data writing, holding, and reading as follows.

Writing and holding of data are described. First, the potential of the fourth wiring is set to a potential at which the transistor 162 is turned on, so that the transistor 162 is turned on. Accordingly, the potential of the third wiring is supplied to the gate electrode layer of the transistor 160 and to the capacitor 164. That is, predetermined charge is supplied to the gate electrode layer of the transistor 160 (writing). Here, charge for supply of a potential level or charge for supply of a different potential level (hereinafter referred to as a low-level charge and a high-level charge) is given. After that, the potential of the fourth wiring is set to a potential at which the transistor 162 is turned off, so that the transistor 162 is turned off. Thus, the charge given to the gate electrode layer of the transistor 160 is held (holding).

Since the off-state current of the transistor 162 is extremely small, the charge of the gate electrode layer of the transistor 160 is held for a long time.

Next, reading of data is described. By supplying an appropriate potential (a reading potential) to the fifth wiring while a predetermined potential (a constant potential) is supplied to the first wiring, the potential of the second wiring varies depending on the amount of charge held in the gate electrode layer of the transistor 160. This is because in general, when the transistor 160 is an n-channel transistor, an apparent threshold voltage $V_{th\_H}$ in the case where the high-level charge is given to the gate electrode layer of the transistor 160 is lower than an apparent threshold voltage $V_{th\_L}$ in the case where the low-level charge is given to the gate electrode layer of the transistor 160. Here, an apparent threshold voltage refers to the potential of the fifth wiring, which is needed to turn on the transistor 160. Thus, the potential of the fifth wiring is set to a potential $V_0$ which is between $V_{th\_H}$ and $V_{th\_L}$, whereby charge given to the gate electrode layer of the transistor 160 can be determined. For example, in the case where the high-level charge is given in writing, when the potential of the fifth wiring is set to $V_0$ ($>V_{th\_H}$), the transistor 160 is turned on. In the case where a low-level charge is given in writing, even when the potential of the fifth wiring is set to $V_0$ ($<V_{th\_L}$), the transistor 160 remains in an off state. Therefore, the stored data can be read by the potential of the second wiring.

Note that in the case where memory cells are arrayed to be used, only data of desired memory cells needs to be read. In the case where such reading is not performed, a potential at which the transistor 160 is turned off regardless of the state of the gate electrode layer of the transistor 160, that is, a potential smaller than $V_{th\_H}$ may be given to the fifth wiring. Alternatively, a potential at which the transistor 160 is turned on regardless of the state of the gate electrode layer, that is, a potential higher than $V_{th\_L}$ may be given to the fifth wiring.

FIG. 8 illustrates another example of one embodiment of the structure of the storage device.

FIG. 8 is a perspective view of a storage device. The storage device illustrated in FIG. 8 includes a plurality of layers of memory cell arrays (memory cell arrays 3400(1) to 3400(*n*) (n is an integer greater than or equal to 2)) each including a plurality of memory cells as memory circuits in the upper portion, and a logic circuit 3004 in the lower portion which is necessary for operating the memory cell arrays 3400(1) to 3400(*n*).

FIG. 8 illustrates the logic circuit 3004, the memory cell array 3400(1), and the memory cell array 3400(2), in which a memory cell 3170*a* and a memory cell 3170*b* are illustrated as typical examples among the plurality of memory cells included in the memory cell array 3400(1) and the memory cell array 3400(2). The memory cell 3170*a* and the memory cell 3170*b* can have a configuration similar to the circuit configuration described in this embodiment with reference to FIG. 7, for example.

A transistor in which a channel formation region is formed in an oxide semiconductor film is used as each transistor included in the memory cells 3170*a* and 3170*b*. The structure of the transistor in which the channel formation region is formed in the oxide semiconductor film is the same as the structure described in Embodiment 1; thus, the description of the structure is omitted.

The logic circuit 3004 includes a transistor in which a semiconductor material other than an oxide semiconductor is used as a channel formation region. For example, the transistor can be a transistor obtained in such a manner that an element isolation insulating layer is provided on a substrate including a semiconductor material (e.g., silicon) and a region serving as the channel formation region is formed in a region surrounded by the element isolation insulating layer. Note that the transistor may be a transistor obtained in such a manner that the channel formation region is formed in a semiconductor film such as a polycrystalline silicon film formed on an insulating surface or in a silicon film of an SOI substrate.

The memory cell arrays 3400(1) to 3400(*n*) and the logic circuit 3004 are stacked with interlayer insulating layers provided therebetween, and electrical connection or the like may be established as appropriate by an electrode or a wiring penetrating the interlayer insulating layers.

When a transistor having a channel formation region formed using an oxide semiconductor and having extremely small off-state current is applied to the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate; thus, the problem of deterioration of a gate insulating film does not occur. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

As described above, a miniaturized and highly-integrated semiconductor device having high electric characteristics and a method for manufacturing the semiconductor device can be provided.

This embodiment can be freely combined with any of Embodiment 1, Embodiment 2, and Embodiment 3.

Embodiment 5

In this embodiment, a central processing unit (CPU) in which at least one of the transistors 415, 416, 418 described in Embodiment 1 or 2 and the transistors 120, 121, 122, 123, and 130 described in Embodiment 7 or 8 is provided in part of the CPU is described as an example of a semiconductor device.

Figure 9A:
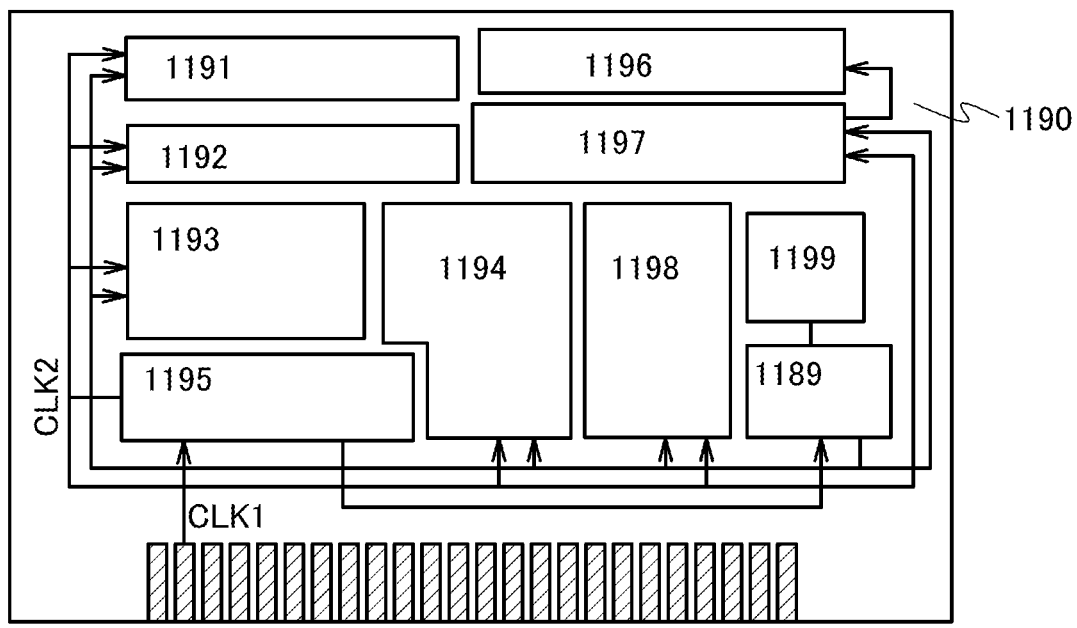
FIGS. 9A to 9C are block diagrams illustrating one embodiment of a semiconductor device.

FIG. 9A is a block diagram illustrating a specific structure of a CPU. The CPU illustrated in FIG. 9A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM interface 1189 may each be provided over a separate chip. Obviously, the CPU illustrated in FIG. 9A is only an example in which the structure is simplified, and a variety of structures is applied to an actual CPU depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 9A, a memory cell is provided in the register 1196. As the memory cell of the register 1196, the memory cell described in Embodiment 4 can be used.

In the CPU illustrated in FIG. 9A, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 9B:
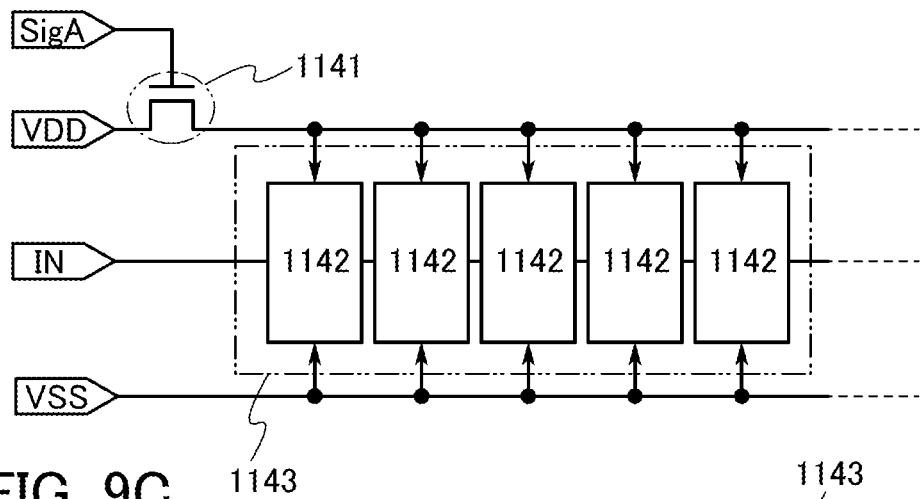
Figure 9C:
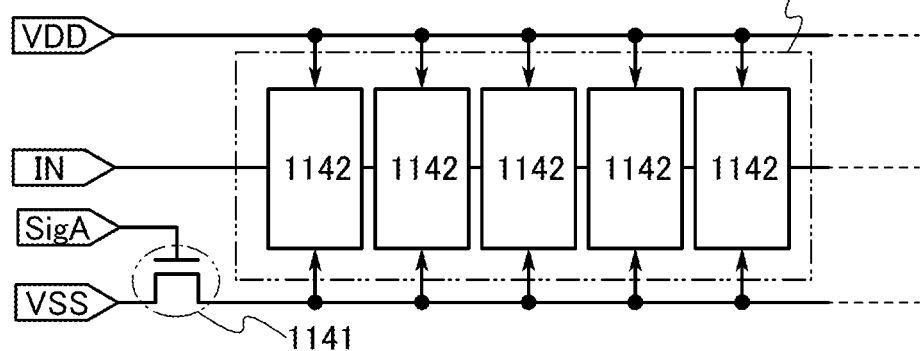

The power supply can be stopped by a switching element provided between a memory cell group and a node to which a power supply potential VDD or a power supply potential VSS is supplied, as illustrated in FIG. 9B or FIG. 9C. Circuits illustrated in FIGS. 9B and 9C are described below.

FIGS. 9B and 9C each illustrate an example of a memory circuit in which one of the transistors 415, and 416, and 418 described in Embodiment 1 or 2 and the transistors 120, 121, 122, 123, and 130 described in Embodiment 7 or 8 is used as a switching element for controlling supply of power supply potential to memory cells.

The storage device illustrated in FIG. 9B includes a switching element 1141 and a memory cell group 1143 including a plurality of memory cells 1142. Specifically, as each of the memory cells 1142, the memory cell described in Embodiment 3 can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 9B, any of the transistors 415, 416, and 418 described in Embodiment 1 or 2 is used as the switching element 1141, and the switching of the transistor is controlled by a signal SigA supplied to a gate electrode layer thereof.

Note that FIG. 9B illustrates a configuration in which the switching element 1141 includes only one transistor; however, one embodiment of the present invention is not limited thereto. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 9B, the switching element 1141 may control the supply of the low-level power supply potential VSS.

FIG. 9C illustrates an example of a storage device in which each of the memory cells 1142 included in the memory cell group 1143 is supplied with the low-level power supply potential VSS through the switching element 1141. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example in this embodiment, the transistor can also be applied to an LSI such as a digital signal processor (DSP), a custom LSI, or a field programmable gate array (FPGA).

The methods and structures described in this embodiment can be combined as appropriate with any of the methods and structures described in the other embodiments.

Embodiment 6

A semiconductor device disclosed in this specification can be applied to a variety of electronic appliances (including game machines). Examples of the electronic appliances include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, cameras such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. In addition, oil engines, moving objects driven by electric motors using power from the non-aqueous secondary batteries, and the like are also included in the category of electric appliances. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic devices are illustrated in FIGS. 10A to 10C and FIGS. 11A to 11C.

FIGS. 10A and 10B illustrate a tablet terminal that can be folded in two. FIG. 10A illustrates the tablet terminal which is open (unfolded). The tablet terminal includes a housing 9630, a display portion 9631a, a display portion 9631b, a switch 9034 for switching display modes, a power switch 9035, a switch 9036 for switching to power-saving mode, a fastener 9033, and an operation switch 9038.

In such a portable device illustrated in FIGS. 10A and 10B, an SRAM or a DRAM is used as a memory for temporarily storing image data. For example, the semiconductor device described in Embodiment 4 can be used as a memory. The semiconductor device described in the above embodiment employed for the memory element enables writing and reading of data to be performed at high speed, enables data to be retained for a long time, and enables power consumption to be sufficiently reduced. A CPU for performing image processing or arithmetic processing is used in the portable device illustrated in FIGS. 10A and 10B. As the CPU, the CPU described in Embodiment 5 can be used, in which case the CPU described in Embodiment 5 is used, power consumption of the portable device can be reduced.

A touch panel region 9632a can be provided in a part of the display portion 9631a, in which data can be input by touching displayed operation keys 9638. Note that FIG. 10A shows, as an example, that half of the area of the display portion 9631a has only a display function and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The switch 9034 for switching display modes allows switching between a landscape mode and a portrait mode, color display and black-and-white display, and the like. With the switch 9036 for switching to power-saving mode, the luminance of display can be optimized in accordance with the amount of external light at the time when the tablet is in use, which is detected with an optical sensor incorporated in the tablet. The tablet terminal may include another detection device such as a sensor for detecting orientation (e.g., a gyroscope or an acceleration sensor) in addition to the optical sensor.

Although FIG. 10A shows the example where the display area of the display portion 9631a is the same as that of the display portion 9631b, there is no particular limitation on the display portions 9631a and 9631b. They may differ in size and/or image quality. For example, one of them may be a display panel that can display higher-definition images than the other.

FIG. 10B illustrates the tablet terminal which is closed. The tablet terminal includes the housing 9630, a solar battery 9633, a charge/discharge control circuit 9634, a battery 9635, and a DC-DC converter 9636. As an example, FIG. 10B illustrates the charge/discharge control circuit 9634 including the battery 9635 and the DC-DC converter 9636.

Since the tablet terminal can be folded in two, the housing 9630 can be closed when the tablet is not in use. Thus, the display portions 9631a and 9631b can be protected, thereby providing a tablet terminal with high endurance and high reliability for long-term use.

The tablet terminal illustrated in FIGS. 10A and 10B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

The solar battery 9633, which is attached on the surface of the tablet terminal, supplies electric power to a touch panel, a display portion, an image signal processor, and the like. Note that the solar battery 9633 can be provided on one or both surfaces of the housing 9630 and the battery 9635 can be charged efficiently. When a lithium ion battery is used as the battery 9635, there is an advantage of downsizing or the like.

The structure and operation of the charge/discharge control circuit 9634 illustrated in FIG. 10B will be described with reference to a block diagram in FIG. 10C. FIG. 10C illustrates the solar battery 9633, the battery 9635, the DC-DC converter 9636, a converter 9637, switches SW1 to SW3, and the display portion 9631. The battery 9635, the DC-DC converter 9636, the converter 9637, and the switches SW1 to SW3 correspond to the charge/discharge control circuit 9634 illustrated in FIG. 10B.

First, an example of operation in the case where power is generated by the solar battery 9633 using external light is described. The voltage of power generated by the solar battery 9633 is raised or lowered by the DC-DC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

Figure 11A:
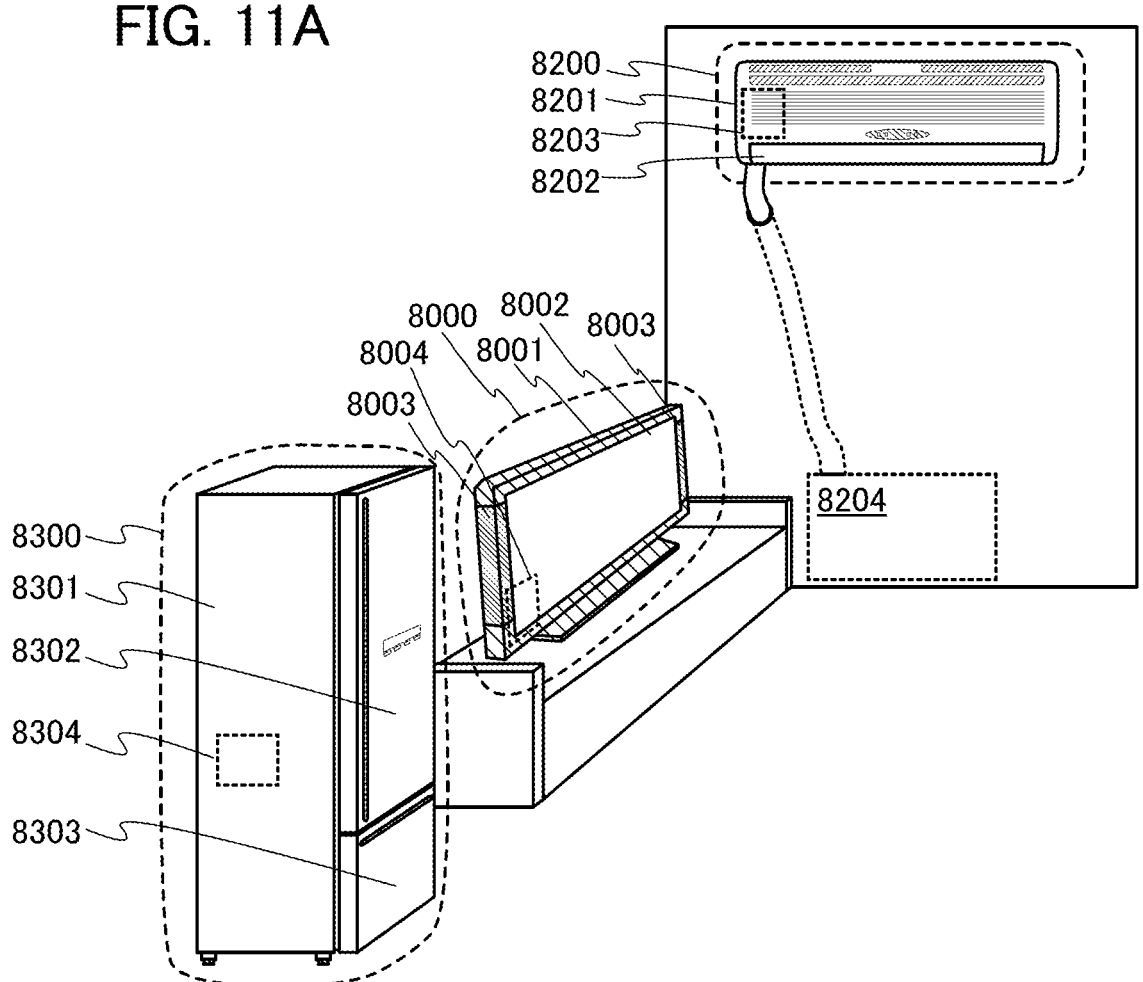
FIGS. 11A to 11C illustrate electronic appliances.

In a television set 8000 in FIG. 11A, a display portion 8002 is incorporated in a housing 8001. The display portion 8002 displays an image and a speaker portion 8003 can output sound.

A semiconductor display device such as a liquid crystal display device, a light-emitting device in which a light-emitting element such as an organic EL element is provided in each pixel, an electrophoresis display device, a digital micromirror device (DMD), or a plasma display panel (PDP) can be used for the display portion 8002.

The television set 8000 may be provided with a receiver, a modem, and the like. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing information communication or a memory. The memory described in Embodiment 4 or the CPU described in Embodiment 5 can be used in the television set 8000.

In FIG. 11A, an air conditioner which includes an indoor unit 8200 and an outdoor unit 8204 is an example of an electric appliance in which the CPU of Embodiment 5 is used. Specifically, the indoor unit 8200 includes a housing 8201, an air outlet 8202, a CPU 8203, and the like. Although the CPU 8203 is provided in the indoor unit 8200 in FIG. 11A, the CPU 8203 may be provided in the outdoor unit 8204. Alternatively, the CPU 8203 may be provided in both the indoor unit 8200 and the outdoor unit 8204. By using the CPU described in Embodiment 5 as the CPU in the air conditioner, power consumption can be reduced.

In FIG. 11A, an electric refrigerator-freezer 8300 is an example of an electric appliance which is provided with the CPU formed using an oxide semiconductor. Specifically, the electric refrigerator-freezer 8300 includes a housing 8301, a door for a refrigerator 8302, a door for a freezer 8303, a CPU 8304, and the like. In FIG. 11A, the CPU 8304 is provided in the housing 8301. When the CPU described in Embodiment 5 is used as the CPU 8304 of the electric refrigerator-freezer 8300, power consumption of the electric refrigerator-freezer 8300 can be reduced.

Figure 11B:
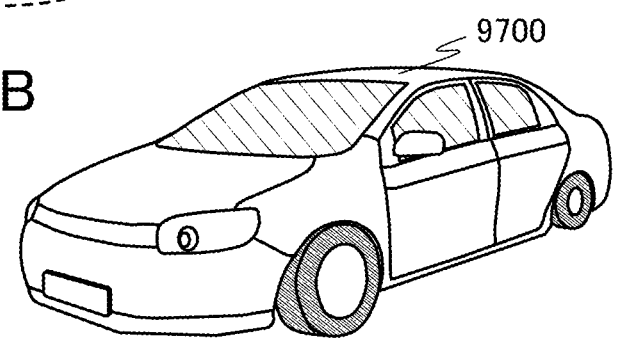
Figure 11C:
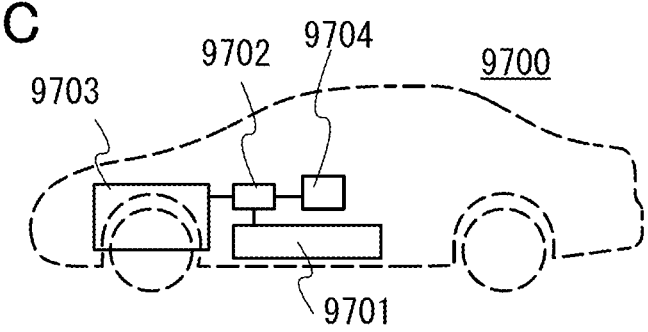
Figure 12A:
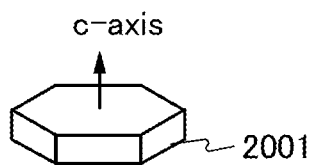
FIG. 12A is a schematic view of a flat-plate-like sputtered particle.
Figure 12B:
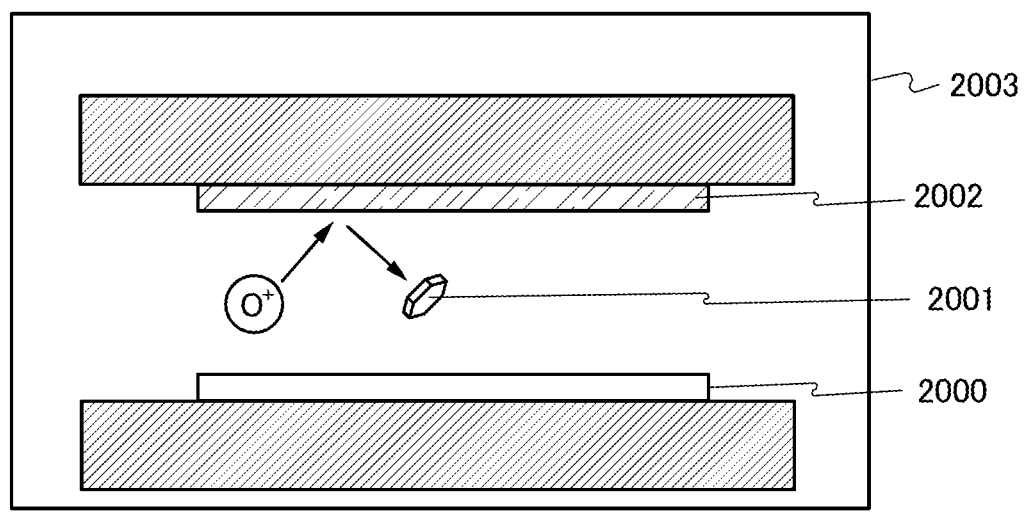
FIG. 12B is a model diagram in deposition.
Figure 12C:
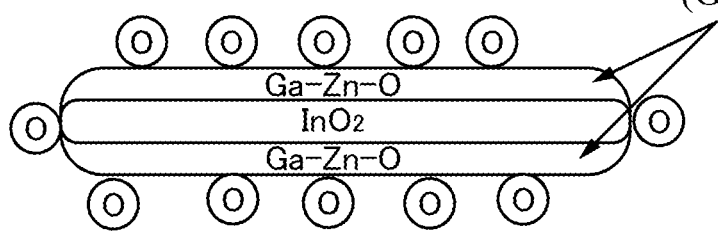
FIG. 12C is a model diagram showing the state of the flat-plate-like sputtered particle.
Figure 13A:
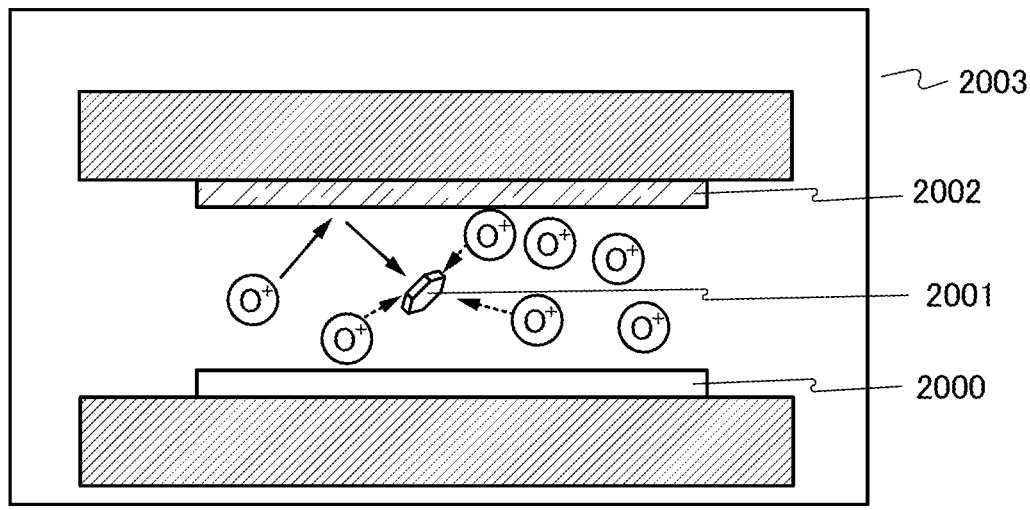
FIG. 13A is a model diagram in deposition and FIG. 13B is a model diagram showing the state where oxygen of a flat-plate-like sputtered particle is released.
Figure 13B:
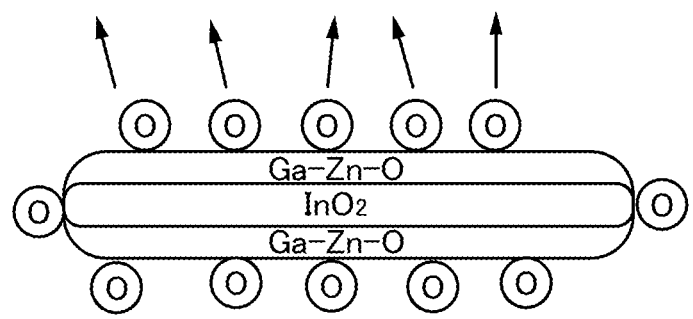
Figure 14A:
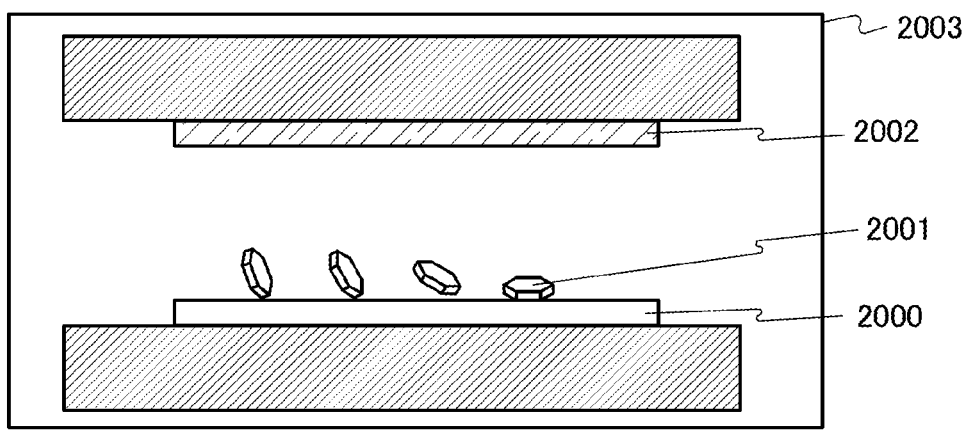
FIGS. 14A and 14B are model diagrams in deposition and FIG. 14C is a model diagram showing the state of flat-plate-like sputtered particles.
Figure 14B:
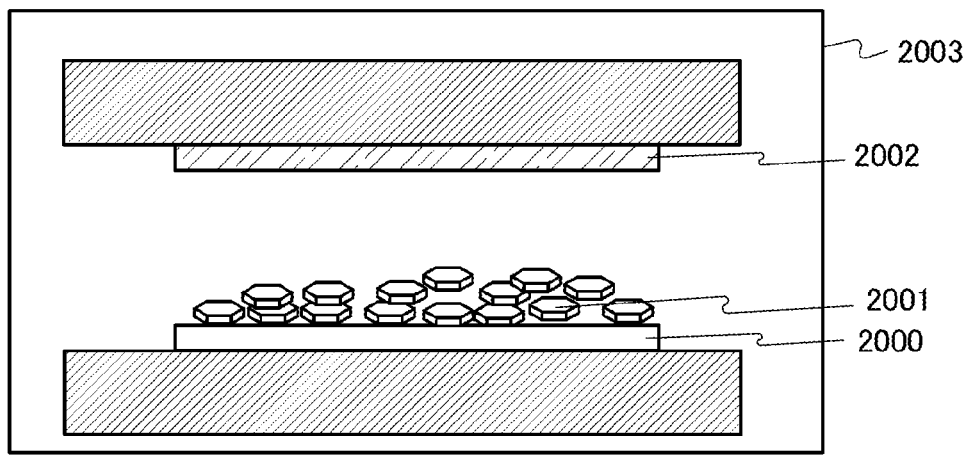
Figure 14C:
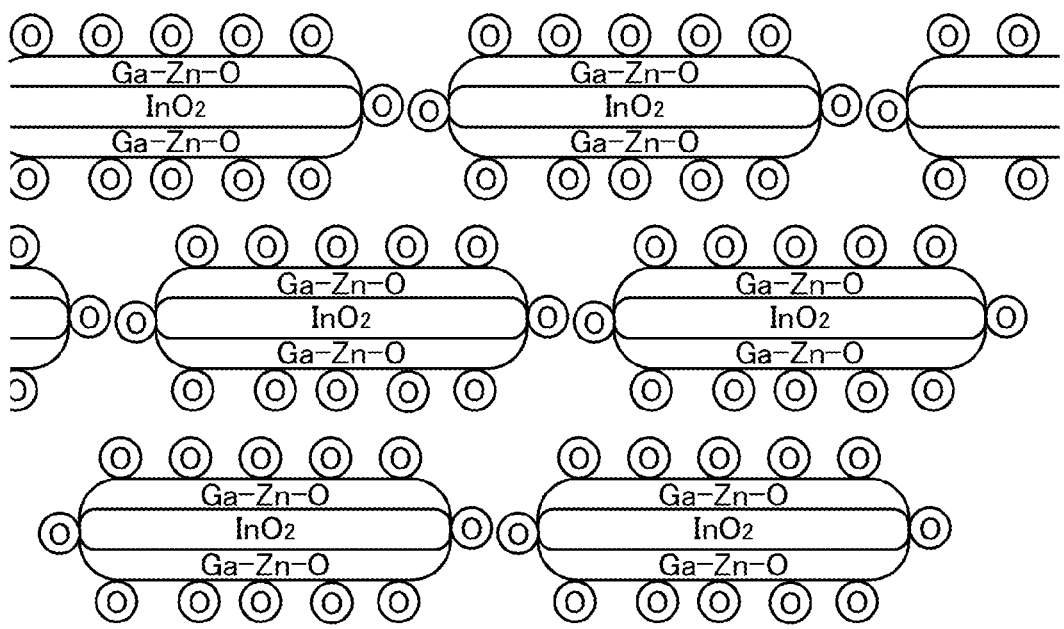

An example of an electric vehicle which is an example of an electric appliance is described in FIG. 11B. An electric vehicle 9700 is equipped with a secondary battery 9701. The output of power of the non-aqueous secondary battery 9701 is adjusted by a control circuit 9702 and the power is supplied to a driving device 9703. The control circuit 9702 is controlled by a processing unit 9704 including a ROM, a RAM, a CPU, or the like which is not illustrated. When the CPU described in Embodiment 5 is used as the CPU in the electric vehicle 9700, power consumption of the electric vehicle 9700 can be reduced.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment can be implemented in combination with any of the other embodiments, as appropriate.

Embodiment 7

In this embodiment, one embodiment of a semiconductor device is described with reference to FIGS. 16A to 16C.

Figure 16A:
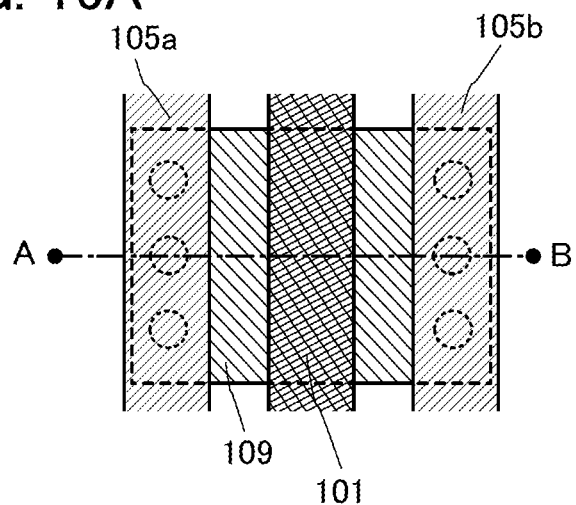
FIGS. 16A to 16C are a top view, a cross-sectional view, and a schematic view illustrating one embodiment of the present invention.
Figure 16B:
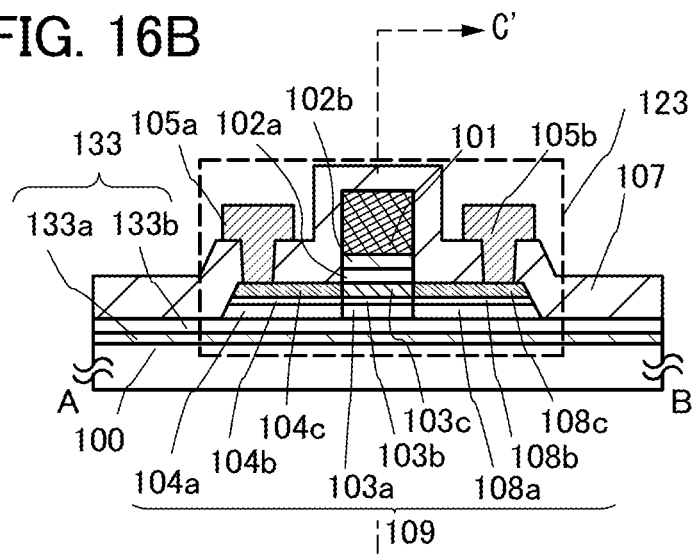

Note that a cross-sectional view of a transistor 123 illustrated in FIG. 16B corresponds to a structural view taken along a chain line A-B in a top view illustrated in FIG. 16A.

Figure 16C:
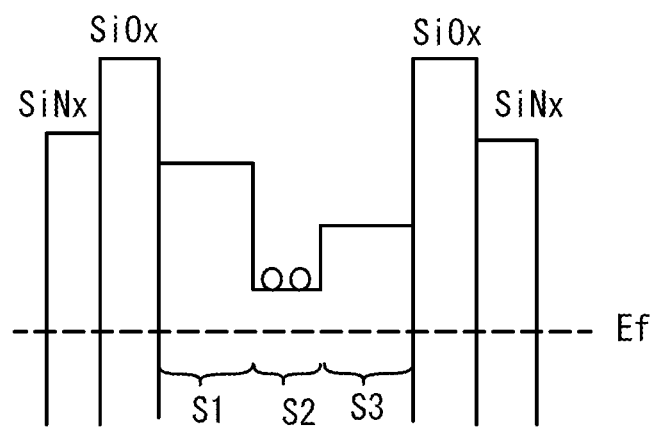

The transistor 123 in FIGS. 16A to 16C includes a base insulating layer 133 which is provided over a substrate 100; an oxide semiconductor stack 109 which is provided over the base insulating layer 133 and includes at least a channel formation region 103b, a low-resistance region 104c, and a low-resistance region 108c; a gate insulating layer 102 and a gate electrode layer 101 which are provided over the channel formation region 103b; a silicon nitride film 107 over the oxide semiconductor stack 109, the gate insulating layer 102, and the gate electrode layer 101; and electrode layers 105a and 105b which are electrically connected to the low-resistance region 104c and the low-resistance region 108c, respectively, through openings provided in the silicon nitride film 107. The electrode layers 105a and 105b function as a source electrode layer and a drain electrode layer.

In the above structure, the base insulating layer 133 is a stack in which a second base insulating layer 133b is provided over a first base insulating layer 133a. A silicon nitride film is used as the first base insulating layer 133a, and a silicon oxide film is used as the second base insulating layer 133b. The gate insulating layer 102 is a stack in which a second gate insulating layer 102b is provided over a first gate insulating layer 102a. A silicon oxide film is used as the first gate insulating layer 102a, and a silicon nitride film is used as the second gate insulating layer 102b. Since the oxide semiconductor stack 109 is covered with the silicon nitride film 107, moisture and hydrogen can be prevented from entering the channel formation region 103b from the outside, so that the reliability of the transistor 123 is improved.

In the above structure, the oxide semiconductor stack 109 is formed of the following three oxide semiconductor layers: the first oxide semiconductor layer S1 which includes a first region 104a, a second region 103a, and a third region 108a; the second oxide semiconductor layer S2 which includes a fourth region 104b, the channel formation region 103b, and a fifth region 108b; and the third oxide semiconductor layer S3 which includes the low-resistance region 104c, a sixth region 103c, and the low-resistance region 108c. The oxide semiconductor layer S1, the oxide semiconductor layer S2, and the oxide semiconductor layer S3 are stacked in this order. The three oxide semiconductor layers may be films having a crystalline structure or films having an amorphous structure.

Of the three oxide semiconductor layers, the second oxide semiconductor has the smallest thickness. The three oxide semiconductor layers each have a thickness greater than or equal to 5 nm and less than or equal to 40 nm. There is no particular limitation on a material of the second oxide semiconductor layer as long as it is an oxide semiconductor which has higher carrier density and larger conductivity σ than those of the other oxide semiconductor layers.

For example, an In—Ga—Zn-based oxide film which is deposited using a sputtering target having an atomic ratio of In:Ga:Zn=1:1:1 may be used as the first oxide semiconductor layer S1, an In—Ga—Zn-based oxide film which is deposited using a sputtering target having an atomic ratio of In:Ga:Zn=3:1:2 may be used as the second oxide semiconductor layer S2, and an In—Ga—Zn-based oxide film which is deposited using a sputtering target having an atomic ratio of In:Ga:Zn=1:1:1 may be used as the third oxide semiconductor layer S3. In the case of forming these three layers, each layer is preferably deposited by a sputtering method in a mixed atmosphere containing more oxygen than a rare gas, preferably in an oxygen atmosphere (oxygen: 100%), and all of the resulting oxide semiconductor layers can also be referred to as I-type oxide semiconductor layers. The I-type oxide semiconductor layer is a highly purified oxide semiconductor layer that contains impurities other than the main components of the oxide semiconductor layer as little as possible and is an I-type (intrinsic) semiconductor or is close thereto. In such an oxide semiconductor layer, the Fermi level (Ef) is at the same level as the intrinsic Fermi level (Ei).

In the case of another combination of the stacked layers, an In—Ga—Zn-based oxide film which is deposited using a sputtering target having an atomic ratio of In:Ga:Zn=1:3:2 may be used as the first oxide semiconductor layer S1, an In—Ga—Zn-based oxide film which is deposited in an nitrogen atmosphere using a sputtering target having an atomic ratio of In:Ga:Zn=3:1:2 may be used as the second oxide semiconductor layer S2, and an In—Ga—Zn-based oxide film which is deposited using a sputtering target having an atomic ratio of In:Ga:Zn=1:1:1 may be used as the third oxide semiconductor layer S3. In forming the second oxide semiconductor layer S2, deposition is preferably performed in an atmosphere containing more nitrogen than oxygen, more preferably in a nitrogen atmosphere (nitrogen: 100%), and the resulting second oxide semiconductor layer can also be referred to as an $N^+$-type oxide semiconductor layer. These three layers can be expressed as "an I-type layer, an $N^+$-type layer and an I-type layer are stacked in this order".

In the case of another combination of the stacked layers, a nitrogen-containing In—Ga—Zn-based oxide film which is deposited in a mixed atmosphere of oxygen and nitrogen using a sputtering target having an atomic ratio of In:Ga:Zn=1:3:2 may be used as the first oxide semiconductor layer S1; a nitrogen-containing In—Ga—Zn-based oxide film which is deposited in a nitrogen atmosphere using a sputtering target having an atomic ratio of In:Ga:Zn=3:1:2 may be used as the second oxide semiconductor layer S2; and a nitrogen-containing In—Ga—Zn-based oxide film which is deposited in a mixed atmosphere of oxygen and nitrogen using a sputtering target having an atomic ratio of In:Ga:Zn=1:1:1 may be used as the third oxide semiconductor layer S3. In forming the first oxide semiconductor layer S1 and the third oxide semiconductor layer S3, deposition is preferably performed by a sputtering method in a mixed atmosphere containing more oxygen than nitrogen, and the resulting first and third oxide semiconductor layers can also be referred to as $N^-$-type oxide semiconductor layers. These three layers can be expressed as "an $N^-$-type layer, an $N^+$-type layer, and an $N^-$-type layer are stacked in this order".

In the case where steps for stacking the three oxide semiconductor layers in this order are performed successively without exposure to the air, a manufacturing apparatus a top view of which is illustrated in FIG. 15 may be used.

As the sputtering devices in the manufacturing apparatus in FIG. 15, a parallel plate sputtering device, an ion beam sputtering device, a facing-target sputtering device, or the like may be used. In a facing-target type sputtering device, an object surface is separated from plasma and thus damage in deposition is small; therefore, a CAAC-OS film having high crystallinity can be formed.

The low-resistance region 104c and the low-resistance region 108c are provided in contact with the silicon nitride film 107 and thus have a higher nitrogen concentration and lower resistance than the sixth region 103c. In addition, in this embodiment, the channel formation region 103b has higher conductivity σ than the low-resistance region 104c and the low-resistance region 108c.

In the above structure, the second region 103a is provided between the channel formation region 103b and the base insulating layer 133, and the channel formation region 103b is separated from the base insulating layer 133 containing silicon. The second region 103a prevents the entry of silicon from the base insulating layer 133. The sixth region 103c is provided between the channel formation region 103b and the gate insulating layer 102, and the channel formation region 103b is separated from the gate insulating layer 102 containing silicon. Accordingly, the transistor 123 has a buried channel structure in which the channel formation region 103b through which carriers flow is separated from the insulating film containing silicon.

FIG. 16C is an energy band taken along a line C-C' in FIG. 16B. As illustrated in FIG. 16C, the energy level of the bottom of the conduction band in the second oxide semiconductor layer S2 are lower than those of the bottoms of the conduction band in the first oxide semiconductor layer S1 and the third oxide semiconductor layer S3.

In the case where the second region 103a is provided, the second region 103a prevents impurities such as silicon from entering the channel formation region 103b, thereby preventing a reduction in the field-effect mobility of the transistor. Further, when the channel formation region 103b is formed using an oxide semiconductor having high conductivity σ, higher field-effect mobility can be achieved. Furthermore, the sixth region 103c provided over the channel formation region 103b is depleted, whereby a sufficiently low off-state current can be obtained.

Figure 17A:
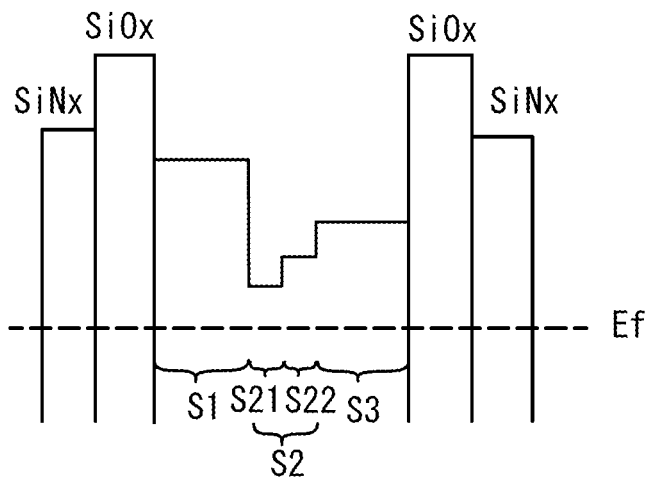
FIGS. 17A to 17C are schematic views each illustrating one embodiment of the present invention.

The energy band diagram in FIG. 16C is merely an example, and thus this embodiment is not limited thereto. For example, the deposition condition or the sputtering target may be changed during the deposition of the second oxide semiconductor layer S2 to form a layer S21 and a layer S22, so that an energy band diagram illustrated in FIG. 17A may be obtained. The total thickness of the layer S21 and the layer S22 is preferably greater than or equal to 15 nm and less than or equal to 30 nm. The length of the third oxide semiconductor layer S3 can be a substantial channel length and thus preferably has a larger thickness than the first oxide semiconductor layer S1 and the second oxide semiconductor layer S2.

Figure 17B:
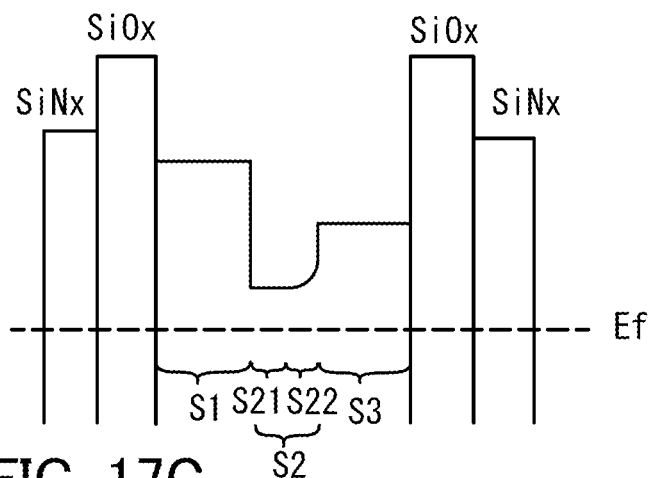

Alternatively, the deposition condition may be changed successively during the deposition of the second oxide semiconductor layer S2 to form the layer S21 and the layer S22, so that an energy band diagram illustrated in FIG. 17B may be obtained.

Figure 17C:
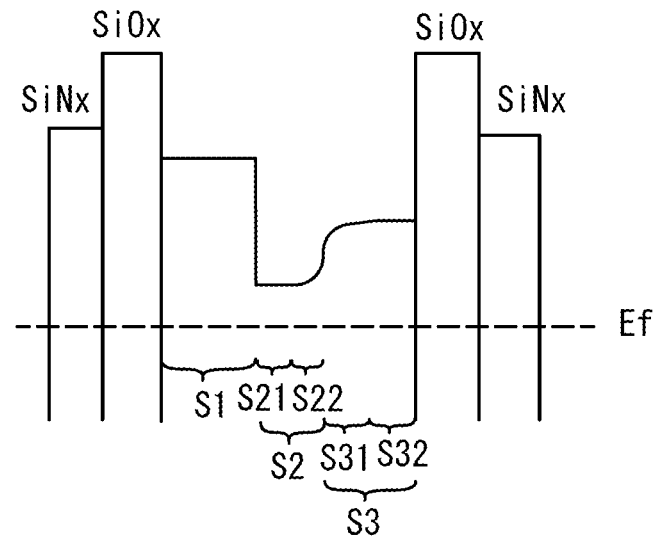

Further alternatively, the deposition condition may be changed successively during the deposition of the third oxide semiconductor layer S3 to form a layer S31 and a layer S32, so that an energy band diagram illustrated in FIG. 17C may be obtained. The total thickness of the layer S31 and the layer S32 is preferably greater than or equal to 15 nm and less than or equal to 30 nm.

Embodiment 8

In this embodiment, one embodiment of a semiconductor device and one embodiment of a method for manufacturing the semiconductor device are described with reference to FIGS. 18A to 18D. In this embodiment, an example of a method for manufacturing the transistor 120 is described, in which the low-resistance regions 104c and 108c are formed by addition of an impurity element (also referred to as a dopant) so as to have lower electrical resistance than the channel formation region 103b.

First, the base insulating layer 133 is formed over the substrate 100.

There is no particular limitation on a substrate that can be used, as long as it has heat resistance high enough to withstand heat treatment performed later. A single crystal semiconductor substrate or a polycrystalline semiconductor substrate of silicon, silicon carbide, or the like or a compound semiconductor substrate of silicon germanium or the like may be used as the substrate 100. Alternatively, an SOI substrate, a substrate over which a semiconductor element is provided, or the like can be used. Further alternatively, a glass substrate of barium borosilicate glass, aluminoborosilicate glass, or the like, a ceramic substrate, a quartz substrate, or a sapphire substrate can be used.

The base insulating layer 133 can be formed using a sputtering method, a molecular beam epitaxy (MBE) method, a chemical vapor deposition (CVD) method, a pulsed laser deposition (PLD) method, an atomic layer deposition (ALD) method, or the like, as appropriate. When the base insulating layer 133 is formed by a sputtering method, an impurity element such as hydrogen can be reduced.

The same material as the insulating film 433 described in Embodiment 1 can be used as a material of the base insulating layer 133.

The base insulating layer 133, which is in contact with a first oxide semiconductor layer which is formed later, preferably contains oxygen which exceeds at least the stoichiometric composition in the layer (the bulk). For example, in the case where a silicon oxide film is used as the base insulating layer 133, the composition is $SiO_{(2+\alpha)}$ ($\alpha>0$).

Next, an oxide semiconductor stack is formed over the base insulating layer 133.

As the first oxide semiconductor layer 51, a material film which can be represented as $M1_aM2_bM3_cO_x$ (a is a real number greater than or equal to 0 and less than or equal to 2, b is a real number greater than 0 and less than or equal to 5, c is a real number greater than or equal to 0 and less than or equal to 5, and x is an arbitrary real number) is used. In this embodiment, an In—Ga—Zn-based oxide film which is deposited using a sputtering target having an atomic ratio of In:Ga:Zn=1:3:2 and has a thickness greater than or equal to 5 nm and less than or equal to 40 nm is used. Further, the first oxide semiconductor layer may have an amorphous structure but is preferably a CAAC-OS film.

As the second oxide semiconductor layer S2, a material film which can be represented as $M4_dM5_eM6_fO_x$ (d is a real number greater than 0 and less than or equal to 5, e is a real number greater than or equal to 0 and less than or equal to 3, f is a real number greater than 0 and less than or equal to 5, and x is an arbitrary positive number) is used. In this embodiment, an In—Ga—Zn-based oxide film is deposited to a thickness greater than or equal to 5 nm and less than or equal to 40 nm by a sputtering method using a sputtering target having an atomic ratio of In:Ga:Zn=3:1:2 in an oxygen atmosphere, a mixed atmosphere containing oxygen and nitrogen, a mixed atmosphere containing a rare gas, oxygen, and nitrogen, or a nitrogen atmosphere. The second oxide semiconductor layer is preferably a CAAC-OS film.

As the third oxide semiconductor layer S3, a material film which can be represented as $M7_gM8_hM9_iO_x$ (g is a real number greater than or equal to 0 and less than or equal to 2, h is a real number greater than 0 and less than or equal to 5, i is a real number greater than or equal to 0 and less than or equal to 5, and x is an arbitrary real number) is used. In this embodiment, an In—Ga—Zn-based oxide semiconductor film which is deposited by a sputtering method using a sputtering target having an atomic ratio of In:Ga:Zn=1:1:1 and has a thickness greater than or equal to 5 nm and less than or equal to 40 nm is used. The third oxide semiconductor layer may be amorphous but is preferably a CAAC-OS film. The third oxide semiconductor layer is in contact with a source electrode layer and a drain electrode layer, whereby the threshold voltage is determined.

With such a stacked-layer structure, the channel formation region that is part of the second oxide semiconductor layer and is to be formed later is not in contact with the insulating film containing silicon.

The three oxide semiconductor layers are formed using polycrystalline targets as sputtering targets to be CAAC-OS films.

Figure 18A:
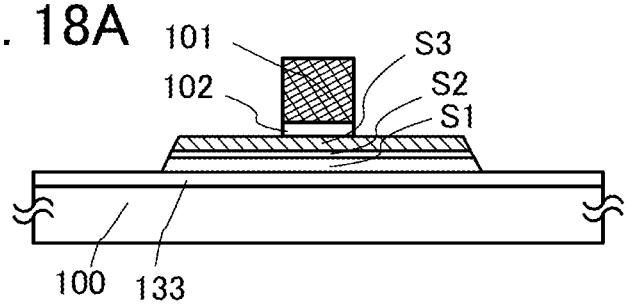
FIGS. 18A to 18D are cross-sectional views illustrating manufacturing steps of one embodiment of the present invention.

Next, a mask is formed over the three oxide semiconductor layers by a photolithography step, and then part of the three oxide semiconductor layers is etched using the mask, so that a stack of oxide semiconductor layers is formed as illustrated in FIG. 18A. After that, the mask is removed. In this stage, to prevent generation of a parasitic channel, a taper angle formed by an end surface of the first oxide semiconductor layer and a surface of the base insulating layer 133 is greater than or equal to 10° and less than or equal to 60°, preferably greater than or equal to 20° and less than or equal to 40°. Further, a taper angle formed by an end surface of the second oxide semiconductor layer and the surface of the base insulating layer 133 is greater than or equal to 10° and less than or equal to 60°, preferably greater than or equal to 20° and less than or equal to 40°. Moreover, a taper angle formed by an end surface of the third oxide semiconductor layer and the surface of the base insulating layer 133 is greater than or equal to 10° and less than or equal to 60°, preferably greater than or equal to 20° and less than or equal to 40°.

Note that heat treatment for supplying oxygen from the base insulating layer 133 to the second oxide semiconductor layer may be performed either before or after the oxide semiconductor layers are processed into an island shape. Note that it is preferable to perform the heat treatment before the oxide semiconductor layers are processed into an island shape because the amount of oxygen released from the base insulating layer 133 to the outside is small and thus the larger amount of oxygen can be supplied to the second oxide semiconductor layer.

Subsequently, the gate insulating layer 102 is formed over the stack of oxide semiconductor layers.

As the gate insulating layer 102, an oxide insulating layer formed of silicon oxide, gallium oxide, aluminum oxide, silicon oxynitride, silicon nitride oxide, hafnium oxide, tantalum oxide, or the like is preferably used. Alternatively, when a high-k material such as hafnium oxide, yttrium oxide, hafnium silicate ($HfSi_xO_y$ (x>0, y>0)), hafnium silicate to which nitrogen is added ($HfSi_xO_y$ (x>0, y>0)), hafnium aluminate ($HfAl_xO_y$ (x>0, y>0)), or lanthanum oxide is used for the gate insulating layer 102, gate leakage current can be reduced. Further, the gate insulating layer 102 may have either a single-layer structure or a stacked-layer structure. In the case where the gate insulating layer 102 has a stacked-layer structure, a silicon nitride film can be used for the gate insulating layer 102 as long as the silicon nitride film not in contact with the third oxide semiconductor layer.

The thickness of the gate insulating layer 102 is greater than or equal to 1 nm and less than or equal to 100 nm, and the gate insulating layer 102 can be formed using a sputtering method, an MBE method, a CVD method, a PLD method, an ALD method, or the like as appropriate. The gate insulating layer may be formed using a sputtering apparatus which performs deposition with surfaces of a plurality of substrates set substantially perpendicular to a surface of a sputtering target.

Like the base insulating layer 133, the gate insulating layer 102 is in contact with the oxide semiconductor layer. Therefore, a large amount of oxygen, which exceeds at least the stoichiometric composition, is preferably contained in the layer (the bulk).

In this embodiment, a 20-nm-thick silicon oxynitride film formed by a CVD method is used as the gate insulating layer 102.

Next, a conductive film is formed over the gate insulating layer 102 and a mask is formed by a photolithography step. Then, part of the conductive film is etched using the mask, whereby the gate electrode layer 101 is formed.

The gate electrode layer 101 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the gate electrode layer 101. The gate electrode layer 101 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode layer 101 has a stacked-layer structure of the above conductive material and the above metal material.

As one layer of the gate electrode layer 101 which is in contact with the gate insulating layer 102, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function of 5 eV or higher, preferably 5.5 eV or higher, which enables the threshold voltage of the transistor to be positive when used as a gate electrode. Accordingly, what is called a normally off switching element can be provided.

The thickness of the gate electrode layer 101 is preferably greater than or equal to 50 nm and less than or equal to 300 nm. In this embodiment, a stack of a 30-nm-thick tantalum nitride and a 200-nm-thick tungsten is formed by a sputtering method.

Then, the gate insulating layer 102 is selectively removed using the gate electrode layer 101 as a mask, whereby part of the three oxide semiconductor layers is exposed. At this stage, a structure illustrated in FIG. 18A can be obtained.

Next, an impurity element for reducing resistance is introduced into the oxide semiconductor layers using the gate electrode layer 101 as a mask, whereby low-resistance regions are formed in regions that do not overlap with the gate electrode layer. As the method for adding the impurity element, an ion implantation method, an ion doping method, a plasma immersion ion implantation method, or the like can be used.

Phosphorus, boron, nitrogen, arsenic, argon, aluminum, a molecular ion containing any of the above element, or the like can be used as the impurity element to be introduced. The dosage of such an element is preferably $1\times10^{13}$ ions/cm$^2$ to $5\times10^{16}$ ions/cm$^2$. When phosphorus is introduced as the impurity element, the acceleration voltage is preferably 0.5 kV to 80 kV.

Note that the treatment for introducing the impurity element into the three oxide semiconductor layers may be performed plural times. In the case where the treatment for introducing the impurity element into the three oxide semiconductor layers is performed plural times, the impurity element may be the same in all of the plural times of treatment or may differ between the plural times of treatment.

Here, since the impurity element is introduced into the three oxide semiconductor layers, the resistance of each of the three oxide semiconductor layers can be reduced and part of the three oxide semiconductor layers can be amorphized, whereby nitrogen easily diffuses into the uppermost oxide semiconductor layer at the time of forming a silicon nitride film to be formed later, and the resistance of the low-resistance regions can be further reduced.

Figure 18B:
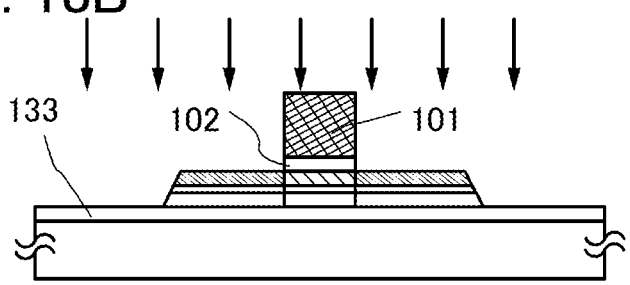
Figure 18C:
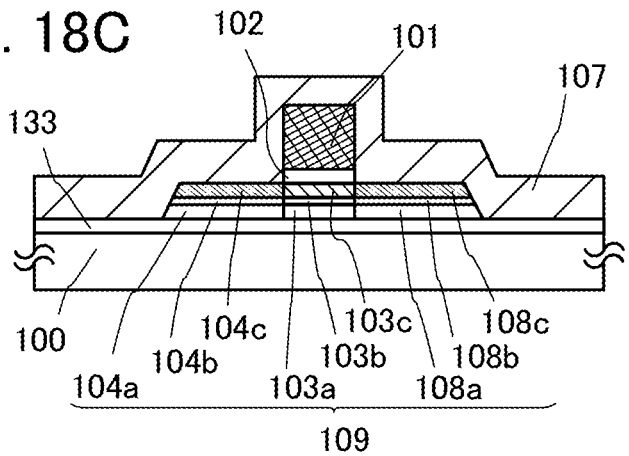

Although depending on conditions at the time of introducing the impurity element or the thickness of each of the three oxide semiconductor layers, the low-resistance regions are formed at least in regions of the third oxide semiconductor layer S3 which do not overlap with the gate electrode layer. Further, the impurity element can be introduced into regions of the second oxide semiconductor layer S2 which do not overlap with the gate electrode layer and can be introduced into regions of the first oxide semiconductor layer S1 which do not overlap with the gate electrode layer. In this embodiment, the impurity element is introduced into the regions of the second oxide semiconductor layer S2 which do not overlap with the gate electrode layer and the regions of the first oxide semiconductor layer S1 which do not overlap with the gate electrode layer. At this stage, a structure illustrated in FIG. 18B is obtained.

Next, the silicon nitride film 107 which covers the gate electrode layer 101 and is on and in contact with the third oxide semiconductor layer is formed. The silicon nitride film 107 is preferably formed using a silicon nitride film which is deposited by a plasma CVD method in which a mixed gas of silane (SiH$_4$) and nitrogen (N$_2$) is supplied. The silicon nitride film also functions as a barrier film and prevents hydrogen or a hydrogen compound from entering an oxide semiconductor layer to be formed later, thereby improving the reliability of the semiconductor device. The silicon nitride film 107 may be formed by a sputtering method in a nitrogen atmosphere. Nitrogen is introduced into regions in the vicinity of the surface of the oxide semiconductor layer in contact with the silicon nitride film 107, whereby the resistance of the regions is reduced.

Through the above process, the oxide semiconductor stack 109 that is formed of the first oxide semiconductor layer S1 including the first region 104a, the second region 103a, and the third region 108a; the second oxide semiconductor layer S2 including the fourth region 104b, the channel formation region 103b, and the fifth region 108b; and the third oxide semiconductor layer S3 including the low-resistance region 104c, the sixth region 103c, and the low-resistance region 108c can be formed.

Since the impurity element is added, the low-resistance region 104c and the low-resistance region 108c have an amorphous structure. In addition, since nitrogen diffuses into the low-resistance region 104c and the low-resistance region 108c, the low-resistance region 104c and the low-resistance region 108c contain a larger amount of nitrogen than the sixth region 103c. Furthermore, the first region 104a and the third region 108a, which are the regions of the first oxide semiconductor layer S1 that do not overlap with the gate electrode layer, have an amorphous structure because the impurity element is added thereto.

Next, regions of the silicon nitride film 107 which overlap with the low-resistance region 104c and the low-resistance region 108c are partly etched, so that openings which reach the low-resistance region 104c and the low-resistance region 108c are formed. The openings are formed by selective etching using a mask or the like. Dry etching, wet etching, or both wet etching and dry etching can be used to form the openings. There is no particular limitation on the shapes of the openings as long as the openings reach the low-resistance region 104c and the low-resistance region 108c.

Then, a conductive film is formed in and over the openings. After that, a mask is formed by a photolithography step and the conductive film is partly etched using the mask, so that the electrode layers 105a and 105b are formed (see FIG. 18D). The electrode layers 105a and 105b can be formed using a material and a method similar to those used for the gate electrode layer 401. In this embodiment, a tungsten film is used as the conductive film.

Through the above process, the transistor 120 can be manufactured. A top view of the transistor 120 is to the same as FIG. 16A and a cross-sectional view taken along a chain line A-B in FIG. 16A corresponds to FIG. 18D.

The channel formation region 103b, the second region 103a, and the sixth region 103c of the transistor 120 remain CAAC-OS films because nitrogen is not added thereto; accordingly, a highly reliable semiconductor device can be obtained.

Figure 18D:
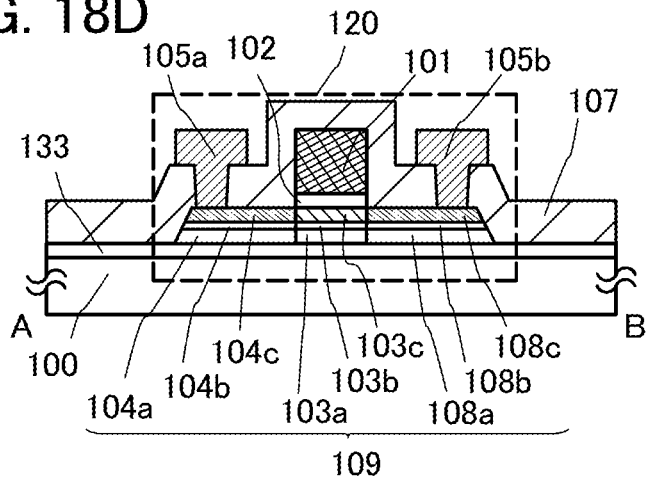

The structure of the semiconductor device of this embodiment is not limited to the one illustrated in FIG. 18D. Alternatively, a structure of a transistor illustrated in FIG. 19D, FIG. 20E, FIG. 21A, or FIG. 21B may be employed.

Figure 19A:
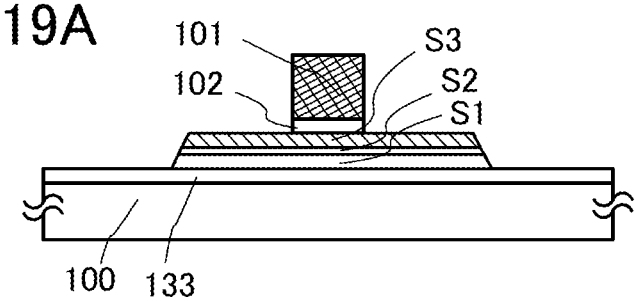
FIGS. 19A to 19D are cross-sectional views illustrating manufacturing steps of one embodiment of the present invention.
Figure 19B:
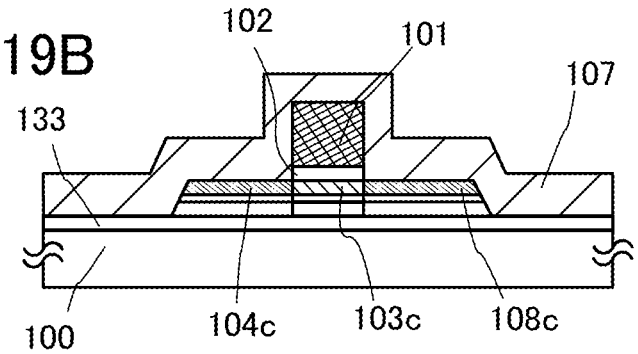
Figure 19C:
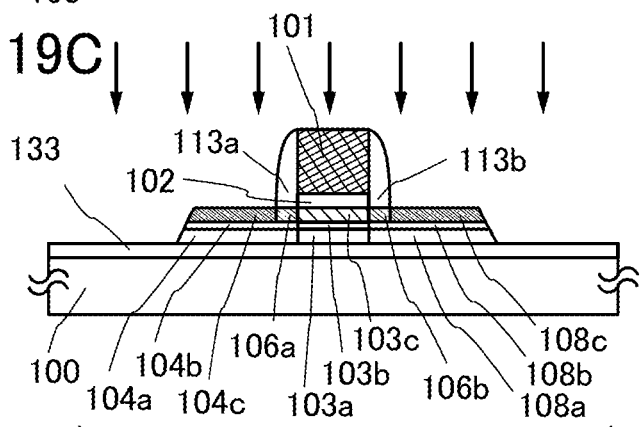
Figure 19D:
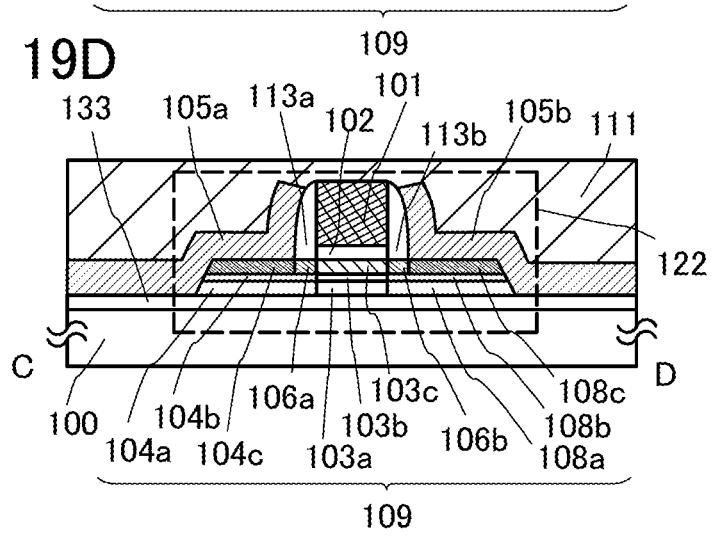

The transistor 122 illustrated in FIG. 19D has a structure in which sidewall insulating layers (also referred to as sidewalls) are provided on the side surface of the gate electrode layer 101. A method for manufacturing the transistor 122 is described below.

The process up to the step in FIG. 18A is the same in the method; therefore, the description thereof is omitted here. FIG. 19A has the same structure as FIG. 18A.

After the same state as FIG. 19A is obtained, the silicon nitride film 107 is formed. By forming the silicon nitride film 107, the low-resistance region 104c and the low-resistance region 108c are formed. A state at this stage corresponds to FIG. 19B.

Next, the silicon nitride film 107 is partly etched, so that sidewall insulating layers 113a and 113b are formed.

Then, the impurity element for reducing resistance is introduced into the oxide semiconductor layer using the gate electrode layer 101 and the sidewall insulating layers 113a and 113b as masks. A state at this stage corresponds to FIG. 19C.

Note that a seventh region 106a which overlaps with the sidewall insulating layer 113a and an eighth region 106b which overlaps with the sidewall insulating layer 113b are formed in the third oxide semiconductor layer. The seventh region 106a and the eighth region 106b contain a larger amount of nitrogen than the sixth region 103c. Further, since phosphorus or boron is added to the low-resistance region 104c and the low-resistance region 108c after the formation of the sidewall insulating layers 113a and 113b, the low-resistance region 104c and the low-resistance region 108c have lower resistance than the seventh region 106a and the eighth region 106b to which phosphorus or boron is not added.

Next, a conductive film is formed and then a mask is formed by a photolithography step. After that, the conductive film is partly etched using the mask, whereby the electrode layers 105a and 105b are formed. Areas where the electrode layers 105a and 105b are in contact with the oxide semiconductor layer are large; therefore, the resistance can be reduced, so that the operation speed of the semiconductor device can be increased.

Then, to reduce surface roughness due to the transistor 122, an interlayer insulating layer 111 serving as a planarization film is provided. The interlayer insulating layer 111 can be formed using an organic material such as a polyimide resin or an acrylic resin. Other than such an organic material, it is also possible to use a low dielectric constant material (low-k material) or the like. Note that the planarization insulating film may be formed by stacking a plurality of insulating films formed from these materials.

Through the above process, the transistor 122 illustrated in FIG. 19D can be manufactured.

Figure 20A:
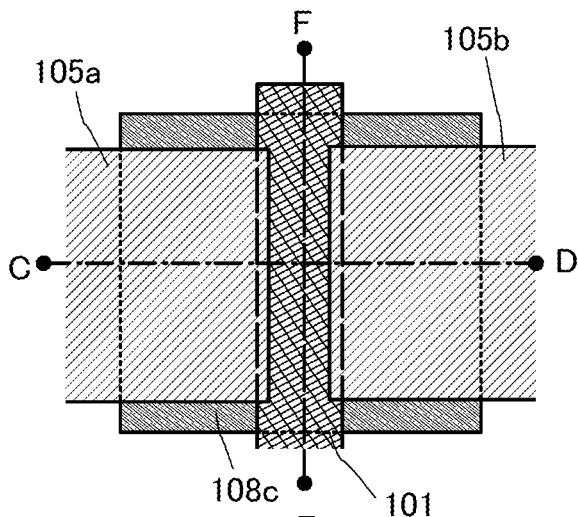
FIGS. 20A to 20E are top views and cross-sectional views illustrating one embodiment of the present invention.

A top view of the transistor 122 is illustrated in FIG. 20A. A cross section taken along a chain line C-D in FIG. 20A corresponds to FIG. 19D. In addition, a cross section taken along a chain line E-F in FIG. 20A is illustrated in FIG. 20B.

Figure 20B:
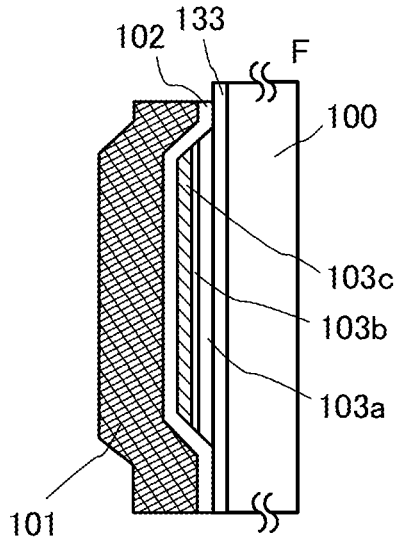

As illustrated in FIG. 20B, an end surface of the second region 103a is covered with the gate insulating layer 102. A taper angle formed by the end surface of the second region 103a and a surface of the base insulating layer 133 is greater than or equal to 10° and less than or equal to 60° and preferably greater than or equal to 20° and less than or equal to 40°. Similarly, an end surface of the channel formation region 103b is covered with the gate insulating layer 102. A taper angle formed by the end surface of the channel formation region 103b and the surface of the base insulating layer 133 is greater than or equal to 10° and less than or equal to 60° and preferably greater than or equal to 20° and less than or equal to 40°. Similarly, an end surface of the sixth region 103c is covered with the gate insulating layer 102. A taper angle formed by the end surface of the sixth region 103c and the surface of the base insulating layer 133 is greater than or equal to 10° and less than or equal to 60° and preferably greater than or equal to 20° and less than or equal to 40°. In this manner, the use of the structure in which at least the end surface of the channel formation region 103b is covered with the gate insulating layer 102 and the taper angle formed by the end surface of each oxide semiconductor layer and the surface of the base insulating layer 133 is greater than or equal to 20° and less than or equal to 40° can prevent generation of a parasitic channel.

Figure 20C:
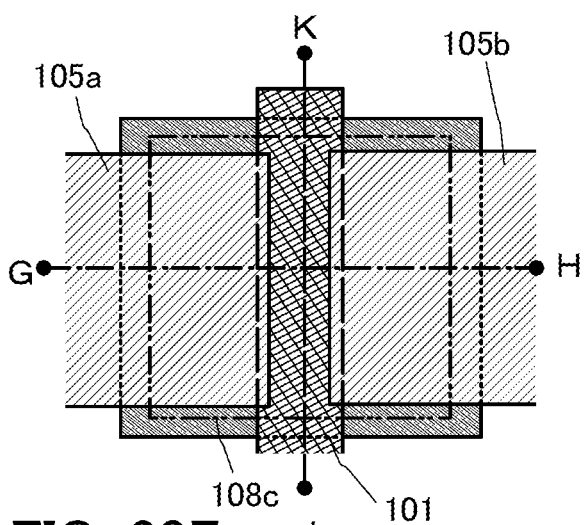
Figure 20D:
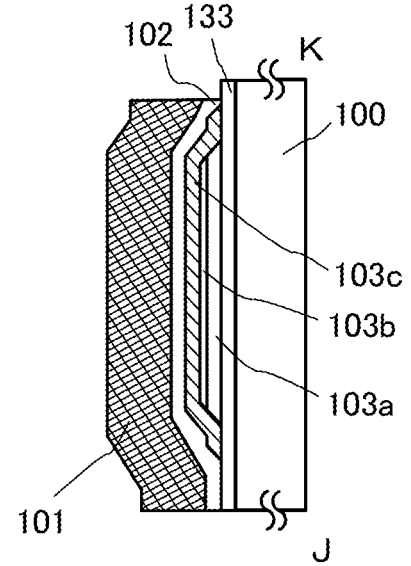
Figure 20E:
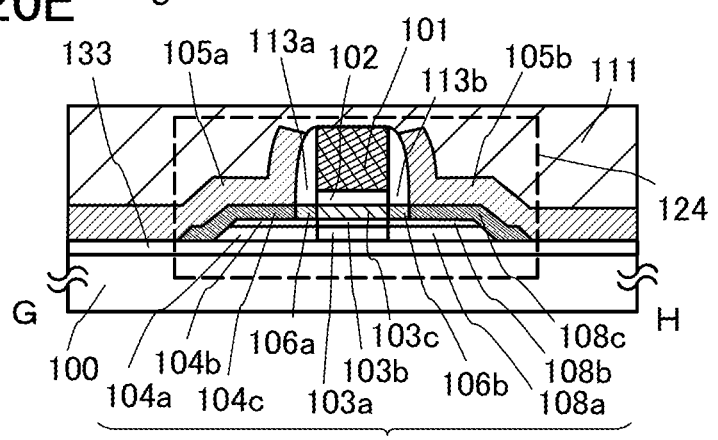

To reduce leakage, a structure of a transistor illustrated in FIG. 20E may be employed. A transistor 124 illustrated in FIG. 20E is a structural example partly different from the structure in FIG. 19D. The transistor 124 in FIG. 20E has a structure in which the side surface of the first oxide semiconductor layer and the side and top surfaces of the second oxide semiconductor layer are covered with the third oxide semiconductor layer. The third oxide semiconductor layer has a larger planar area than the second oxide semiconductor layer and the first oxide semiconductor layer. FIG. 20C is a top view of the transistor 124, in which the peripheries of the second and first oxide semiconductor layers are represented by a chain line inside the periphery of the third oxide semiconductor layer. A cross section taken along a chain line G-H and a cross section taken along a dotted line K-J in FIG. 20C correspond to FIG. 20E and FIG. 20D, respectively.

The transistor 124 in FIG. 20D is formed in such a manner that the base insulating layer 133 is formed over the substrate 100, the first oxide semiconductor layer and the second oxide semiconductor layer are formed by patterning using one mask, and then the third oxide semiconductor layer is formed. By forming the first and second oxide semiconductor layers using a different mask from the third oxide semiconductor layer, the structure in which the side surface of the first oxide semiconductor layer and the side and top surfaces of the second oxide semiconductor layer are covered with the third oxide semiconductor layer can be obtained as illustrated in FIG. 20D. Such a structure enables a reduction in leakage current which is generated between the electrode layer 105a and the electrode layer 105b.

Also in the transistor 124, a taper angle formed by an end surface of the second region 103a and the surface of the base insulating layer 133 is greater than or equal to 10° and less than or equal to 60° and preferably greater than or equal to 20° and less than or equal to 40°. Similarly, a taper angle formed by an end surface of the channel formation region 103b and the surface of the base insulating layer 133 is greater than or equal to 10° and less than or equal to 60° and preferably greater than or equal to 20° and less than or equal to 40°. Further, a taper angle formed by an end surface of the sixth region 103c and the surface of the base insulating layer 133 is greater than or equal to 10° and less than or equal to 60° and preferably greater than or equal to 20° and less than or equal to 40°.

Figure 21A:
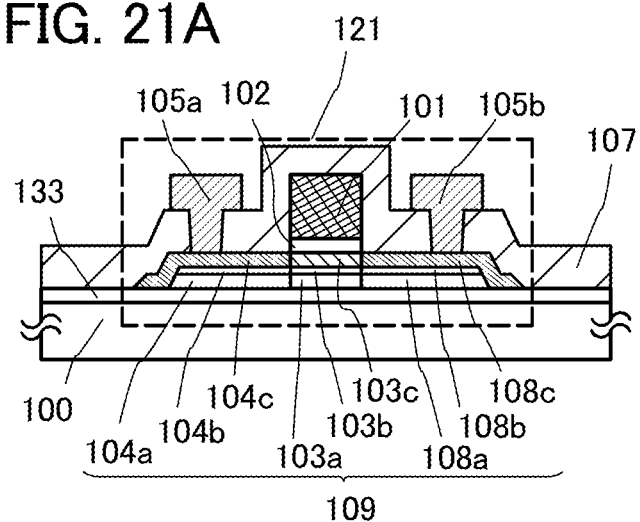
FIGS. 21A and 21B are cross-sectional views each illustrating one embodiment of the present invention.

The transistor 121 illustrated in FIG. 21A is a structural example partly different from the structure in FIG. 18D. The transistor 121 in FIG. 21A has a structure in which the side surface of the first oxide semiconductor layer and the side and top surfaces of the second oxide semiconductor layer are covered with the third oxide semiconductor layer.

The transistor 121 in FIG. 21A is formed in such a manner that the base insulating layer 133 is formed over the substrate 100, the first oxide semiconductor layer and the second oxide semiconductor layer are formed by patterning using one mask, and then the third oxide semiconductor layer is formed. By forming the first and second oxide semiconductor layers using a different mask from the third oxide semiconductor layer, the structure in which the side surface of the first oxide semiconductor layer and the side and top surfaces of the second oxide semiconductor layer are covered with the third oxide semiconductor layer can be obtained as illustrated in FIG. 21A.

Then, the gate insulating layer 102 is formed, and the gate electrode layer 101 is formed. After an impurity element is added, the silicon nitride film 107 is formed. Subsequently, openings are formed in the silicon nitride film and a conductive film is formed. After the conductive film is formed in and over the openings, a mask is formed by a photolithography step. Then, the conductive film is partly etched using the mask, so that the electrode layers 105a and 105b functioning as a source electrode layer and a drain electrode layer are formed.

Through the above process, the transistor 121 illustrated in FIG. 21A can be manufactured.

Figure 21B:
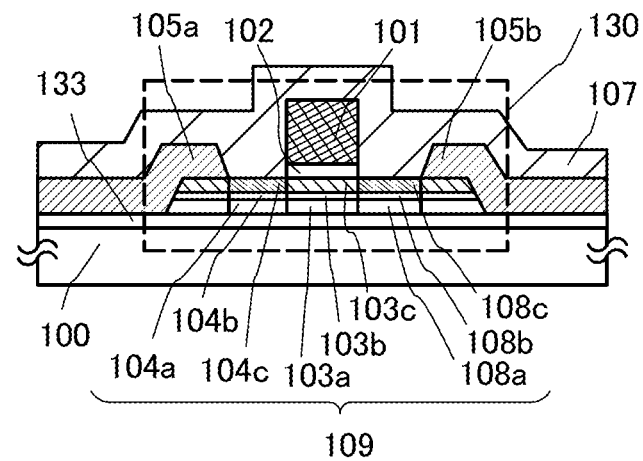

A transistor 130 illustrated in FIG. 21B is formed in such a manner that after the three oxide semiconductor layers are formed, the electrode layers 105a and 105b are formed; the gate electrode layer 101 is formed; and then the impurity element is added using the electrode layers 105a and 105b and the gate electrode layer 101 as masks. The transistor 130 has substantially the same structure as the transistor in FIG. 18D except for formation order of the electrode layers 105a and 105b and the gate electrode layer 101.

A method for manufacturing the transistor 130 is described below.

First, the base insulating layer 133 is formed over the substrate 100. Next, the first oxide semiconductor layer S1, the second oxide semiconductor layer S2, and the third oxide semiconductor layer S3 are formed in this order.

As the first oxide semiconductor layer S1, an In—Ga—Zn-based oxide film which is deposited in an oxygen atmosphere (oxygen: 100%) by a sputtering method using a sputtering target having an atomic ratio of In:Ga:Zn=1:1:1 is used.

As the second oxide semiconductor layer S2, an In—Ga—Zn-based oxide film which is formed in an oxygen atmosphere (oxygen: 100%) by a sputtering method using a sputtering target having an atomic ratio of In:Ga:Zn=3:1:2 is used.

As the third oxide semiconductor layer S3, an In—Ga—Zn-based oxide film which is formed in an oxygen atmosphere (oxygen: 100%) by a sputtering method using a sputtering target having an atomic ratio of In:Ga:Zn=1:3:2 is used.

Next, a mask is formed by a photolithography step, and then the three oxide semiconductor layers are partly etched using the mask, whereby a stack of oxide semiconductor layers is formed.

Then, a conductive film covering the stack of oxide semiconductor layers is formed. After that, a mask is formed by a photolithography step and the conductive film is partly etched using the mask, so that the electrode layers 105a and 105b are formed.

Subsequently, an insulating film is formed to cover the electrode layers 105a and 105b, and then a conductive film is formed. After a mask is formed by a photolithography step, the conductive film is partly etched using the mask, whereby the gate electrode layer 101 is formed. Then, regions of the insulating film which do not overlap with the gate electrode layer 101 are etched using the same mask, so that the gate insulating layer 102 is formed.

Next, the impurity element for reducing resistance is introduced into at least the third oxide semiconductor layer using the gate electrode layer 101 and the electrode layers 105a and 105b as masks, whereby the low-resistance regions 104c and 108c are formed in regions which do not overlap with the gate electrode layer and the electrode layers 105a and 105b.

Then, the silicon nitride film 107 which covers the gate electrode layer 101 and is on and in contact with the low-resistance regions 104c and 108c is formed.

Through the above process, the transistor 130 which includes the oxide semiconductor stack 109 that is formed of the first oxide semiconductor layer 51 including the first region 104a, the second region 103a, and the third region 108a; the second oxide semiconductor layer S2 including the fourth region 104b, the channel formation region 103b, and the fifth region 108b; and the third oxide semiconductor layer S3 including the low-resistance region 104c, the sixth region 103c, and the low-resistance region 108c can be formed.

Note that in the case where a conductive film which can function as a back gate is provided below the oxide semiconductor stack 109 of the transistor 130, the conductive film may be provided between the substrate 100 and the base insulating layer 133. In such a case, the base insulating layer 133 is preferably subjected to planarization treatment by chemical mechanical polishing (CMP).

This embodiment can be freely combined with any of other embodiments.

Embodiment 9

Figure 23A:
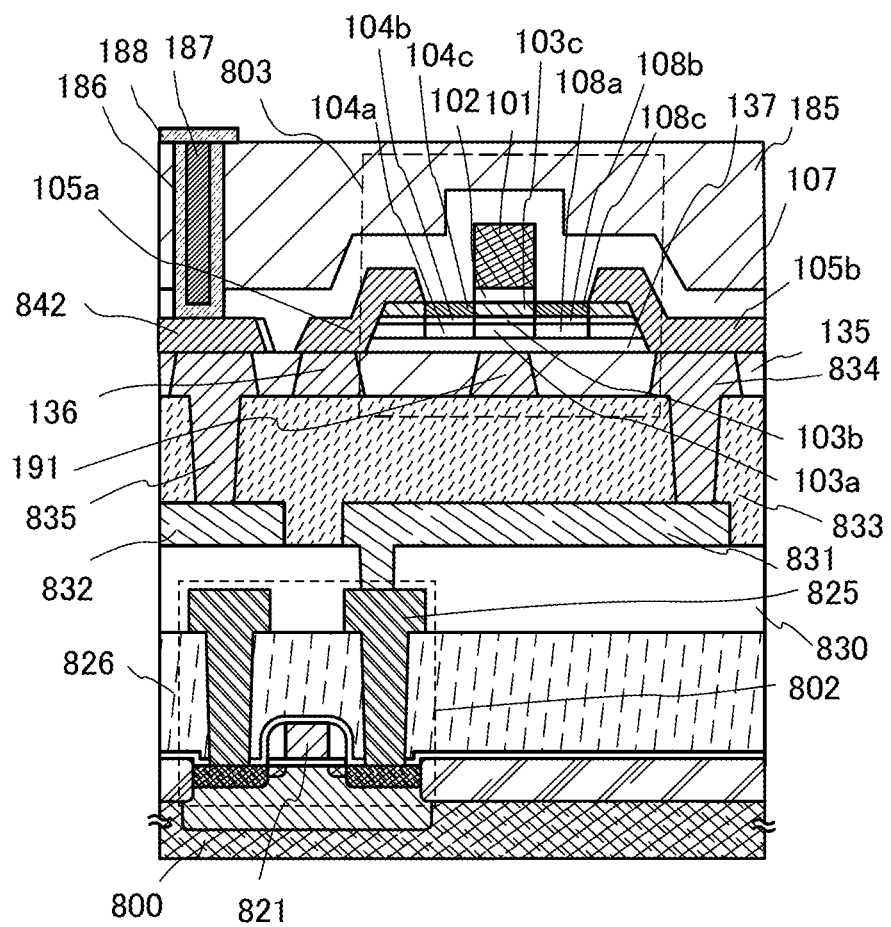
FIGS. 23A to 23C are a cross-sectional view and circuit diagrams illustrating one embodiment of a semiconductor device.
Figure 23B:
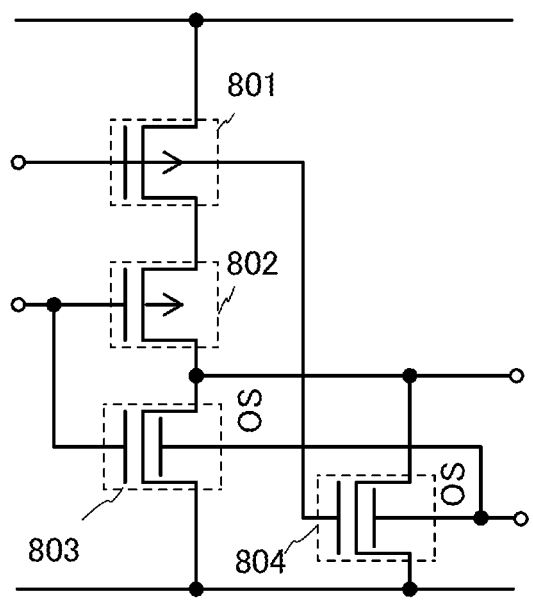
Figure 23C:
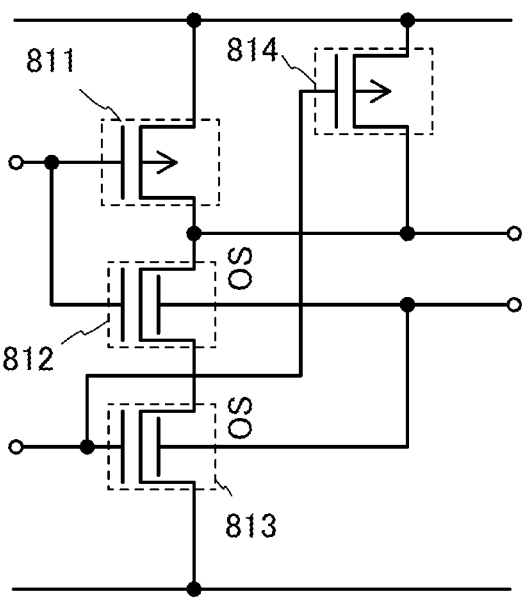

As another example of a semiconductor device including the transistor described in Embodiment 7, a cross-sectional view of a NOR circuit, which is a logic circuit, is illustrated in FIG. 23A. FIG. 23B is a circuit diagram of the NOR circuit in FIG. 23A, and FIG. 23C is a circuit diagram of a NAND circuit.

Figure 22A:
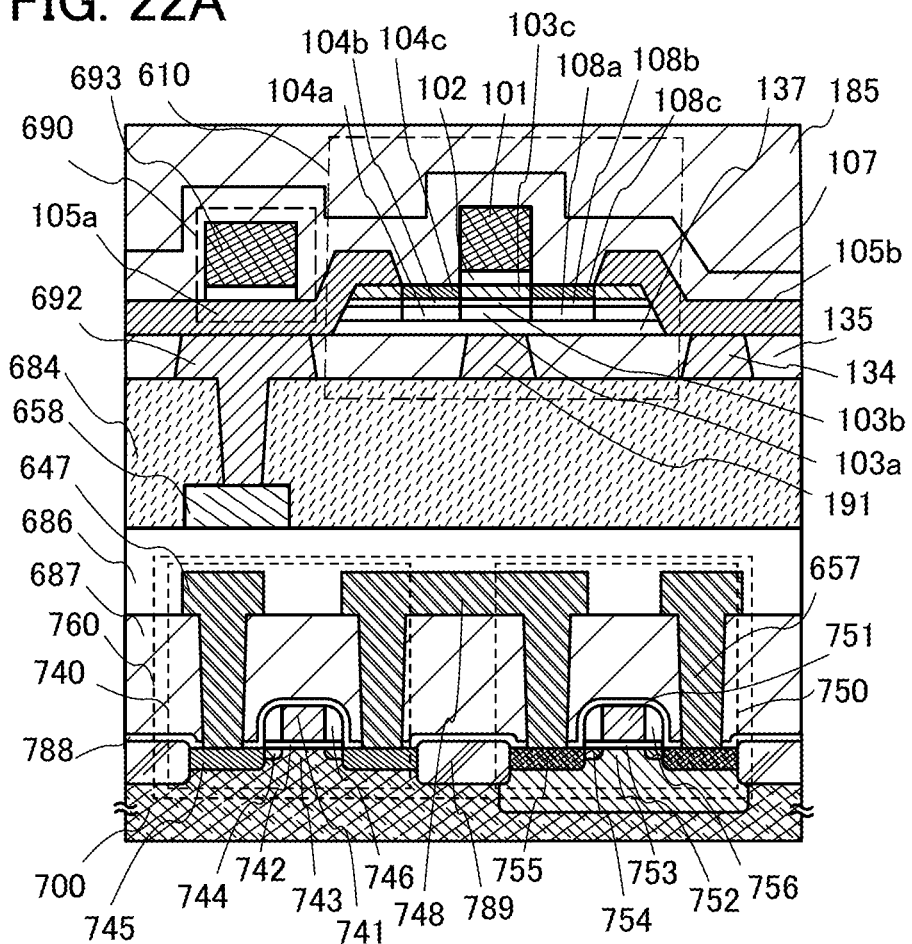
FIGS. 22A and 22B are a cross-sectional view and a circuit diagram illustrating one embodiment of a semiconductor device.
Figure 22B:
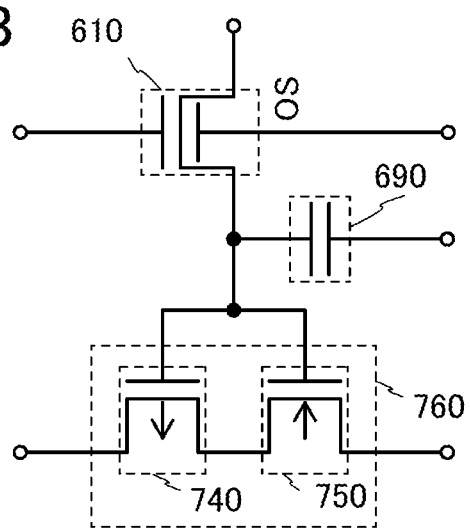

In the NOR circuit illustrated in FIGS. 23A and 23B, the p-channel transistors 801 and 802 each have a structure similar to that of the transistor 750 in FIGS. 22A and 22B in that a single crystal silicon substrate is used for a channel formation region, and the n-channel transistors 803 and 804 each have a structure similar to that of the transistor 610 in FIGS. 22A and 22B and that of the transistor 130 in Embodiment 7 in that an oxide semiconductor film is used for a channel formation region.

In the NOR circuit and the NAND circuit illustrated in FIGS. 23A and 23B, a conductive layer 191 for controlling electrical characteristics of the transistors is provided to overlap with gate electrode layers with oxide semiconductor films provided therebetween in the transistors 803 and 804. By controlling the potential of the conductive layer to GND, for example, the threshold voltages of the transistors 803 and 804 are increased, so that the transistors can be normally off. In the NOR circuit in this embodiment, conductive layers which are provided in the transistors 803 and 804 and can function as back gates are electrically connected to each other. However, the present invention is not limited to the structure, and the conductive layers functioning as back gates may be electrically controlled independently.

In the semiconductor device illustrated in FIG. 23A, a single crystal silicon substrate is used as the substrate 800, the transistor 802 is formed using the single crystal silicon substrate, and the transistor 803 in which stacked oxide semiconductor films are used for a channel formation region is formed over the transistor 802.

The gate electrode layer 101 of the transistor 803 is electrically connected to the wiring layer 832. The wiring layer 832 is electrically connected to the wiring layer 835. The gate electrode layer 101 of the transistor 803 is electrically connected to an embedded wiring, and the embedded wiring is electrically connected to the electrode layer 842. Note that the embedded wiring includes a first barrier metal film 186, a second barrier metal film 188, and a low-resistance conductive layer 187 surrounded by the first barrier metal film 186 and the second barrier metal film 188.

The embedded wiring is formed in such a manner that a contact hole reaching the electrode layer 842 is formed in an interlayer insulating film 185, the first barrier metal film 186 is formed, and a copper film or a copper alloy film is formed thereover so as to form the low-resistance conductive layer 187. Then, polishing is performed for planarization, and the second barrier metal film 188 is formed so as to protect the exposed low-resistance conductive layer 187.

Each of the first barrier metal film 186 and the second barrier metal film 188 may be formed using a conductive material which suppresses diffusion of copper contained in the low-resistance conductive layer 187. Examples of the conductive material are a tantalum nitride film, a molybdenum nitride film, and a tungsten nitride film.

The wiring layer 832 is provided in an opening formed in an insulating film 826 and an insulating film 830. The wiring layer 835 is provided in an opening formed in an insulating film 833. The electrode layer 842 is formed over the wiring layer 835.

The electrode layer 825 of the transistor 802 is electrically connected the electrode layer 105b of the transistor 803 through the wiring layers 831 and 834. The wiring layer 831 is formed in an opening in the insulating film 830, and the wiring layer 834 is formed in an opening in the insulating film 833. The electrode layer 105a and the electrode layer 105b function as source and drain electrode layers of the transistor 803.

Three oxide semiconductor layers are formed on and in contact with the insulating film 137. With the insulating film 137 and the gate insulating layer 102, unnecessary release of oxygen can be suppressed, and the channel formation region 103b can be kept in an oxygen excess state. Thus, in the transistor 803, oxygen vacancies in the channel formation region and at the interface thereof can be filled efficiently. The transistor 804 has a structure and an effect which are similar to those of the transistor 803.

In the NAND circuit in FIG. 23C, the p-channel transistors 811 and 814 each have a structure similar to that of the transistor 750 in FIGS. 22A and 22B, and the n-channel transistors 812 and 813 each have a structure similar to that of the transistor 610 in FIGS. 22A and 22B in that an oxide semiconductor film is used for a channel formation region.

In the NAND circuit illustrated in FIG. 23C, conductive layers controlling electrical characteristics of the transistors are provided to overlap with gate electrode layers with oxide semiconductor films provided therebetween in the transistors 812 and 813. By controlling the potential of the conductive layer to GND, for example, the threshold voltages of the transistors 812 and 813 are increased, so that the transistors can be normally off. In the NAND circuit in this embodiment, the conductive layers which are provided in the transistors 812 and 813 and function as back gates are electrically connected to each other. However, the present invention is not limited to the structure, and the conductive layers functioning as back gates may be electrically controlled independently.

By applying a transistor including an oxide semiconductor for a channel formation region and having extremely small off-state current to the semiconductor device in this embodiment, power consumption of the semiconductor device can be sufficiently reduced.

A semiconductor device which is miniaturized, is highly integrated, and has stable and excellent electrical characteristics by stacking semiconductor elements including different semiconductor materials and a method for manufacturing the semiconductor device can be provided.

The NOR circuit and the NAND circuit including the transistors described in Embodiment 7 are described as examples in this embodiment; however, the present invention is not limited to the circuits, and an AND circuit, an OR circuit, or the like can be formed using the transistors described in Embodiment 7 or 8. For example, a semiconductor device (storage device) in which stored data can be held even when power is not supplied and which has an unlimited number of times of writing with the transistors described in Embodiment 7 or 8 can be manufactured.

This application is based on Japanese Patent Application serial no. 2012-136438 filed with Japan Patent Office on Jun. 15, 2012 and Japanese Patent Application serial no. 2012-141373 filed with Japan Patent Office on Jun. 22, 2012, the entire contents of which are hereby incorporated by reference.

What is claimed is:

1. A semiconductor device comprising:
an insulating layer over an insulating surface;
a first oxide semiconductor layer over the insulating layer;
a second oxide semiconductor layer over the first oxide semiconductor layer;
a third oxide semiconductor layer over the second oxide semiconductor layer;
a gate insulating layer over the third oxide semiconductor layer; and
a gate electrode layer over the gate insulating layer,
wherein the second oxide semiconductor layer has higher conductivity than the third oxide semiconductor layer and the first oxide semiconductor layer, and
wherein the first oxide semiconductor layer has a larger thickness than the second oxide semiconductor layer and the third oxide semiconductor layer.

2. The semiconductor device according to claim 1, wherein the second oxide semiconductor layer has a higher nitrogen concentration than the third oxide semiconductor layer and the first oxide semiconductor layer.

3. The semiconductor device according to claim 1, wherein the second oxide semiconductor layer has a higher boron concentration than the third oxide semiconductor layer and the first oxide semiconductor layer.

4. The semiconductor device according to claim 1, wherein the second oxide semiconductor layer has a higher phosphorus concentration than the third oxide semiconductor layer and the first oxide semiconductor layer.

5. The semiconductor device according to claim 1, wherein a side surface of the second oxide semiconductor layer is covered with the third oxide semiconductor layer.

6. The semiconductor device according to claim 1, further comprising;
a source electrode layer in contact with the second oxide semiconductor layer; and
a drain electrode layer in contact with the second oxide semiconductor layer.

7. A semiconductor device comprising:
a first gate electrode layer over an insulating surface;
an insulating layer over the first gate electrode layer;
a first oxide semiconductor layer over the insulating layer;

a second oxide semiconductor layer over the first oxide semiconductor layer;

a third oxide semiconductor layer over the second oxide semiconductor layer;

a source electrode layer in contact with the second oxide semiconductor layer;

a drain electrode layer in contact with the second oxide semiconductor layer;

a gate insulating layer over the third oxide semiconductor layer; and a second gate electrode layer over the gate insulating layer, wherein the second oxide semiconductor layer has higher conductivity than the third oxide semiconductor layer and the first oxide semiconductor layer, and wherein the first oxide semiconductor layer has a larger thickness than the second oxide semiconductor layer and the third oxide semiconductor layer.

8. The semiconductor device according to claim 7, wherein the second oxide semiconductor layer has a higher nitrogen concentration than the third oxide semiconductor layer and the first oxide semiconductor layer.

9. The semiconductor device according to claim 7, wherein the second oxide semiconductor layer has a higher boron concentration than the third oxide semiconductor layer and the first oxide semiconductor layer.

10. The semiconductor device according to claim 7, wherein the second oxide semiconductor layer has a higher phosphorus concentration than the third oxide semiconductor layer and the first oxide semiconductor layer.

11. The semiconductor device according to claim 7, wherein a side surface of the second oxide semiconductor layer is covered with the third oxide semiconductor layer.

12. A semiconductor device comprising:

a first insulating layer over an insulating surface;

a first oxide semiconductor layer over the first insulating layer;

a second oxide semiconductor layer over the first oxide semiconductor layer;

a third oxide semiconductor layer over the second oxide semiconductor layer;

a second insulating layer on and in contact with the third oxide semiconductor layer;

a gate electrode layer over the second insulating layer; and a third insulating layer on and in contact with the third oxide semiconductor layer, wherein the second oxide semiconductor layer has a smaller thickness than the first oxide semiconductor layer and the third oxide semiconductor layer.

13. The semiconductor device according to claim 12, wherein a region of the third oxide semiconductor layer which is in contact with the third insulating layer has low crystallinity and has a higher nitrogen concentration than a region of the third oxide semiconductor layer which is in contact with the second insulating layer, and wherein the region of the third oxide semiconductor layer which is in contact with the second insulating layer overlaps with a channel formation region of the second oxide semiconductor layer.

14. The semiconductor device according to claim 12, wherein the third insulating layer is a silicon nitride film.

15. The semiconductor device according to claim 12, wherein the third insulating layer is a sidewall that is provided on a side surface of the gate electrode layer.

16. The semiconductor device according to claim 12, wherein a taper angle formed by an end surface of the first oxide semiconductor layer and a surface of the first insulating layer is greater than or equal to 10° and less than or equal to 60°.

17. The semiconductor device according to claim 12, wherein a taper angle formed by an end surface of the second oxide semiconductor layer and a surface of the first insulating layer is greater than or equal to 10° and less than or equal to 60°.

18. The semiconductor device according to claim 12, wherein a taper angle formed by an end surface of the third oxide semiconductor layer and a surface of the first insulating layer is greater than or equal to 10° and less than or equal to 60°.

19. The semiconductor device according to claim 12, wherein an end surface of the first oxide semiconductor layer and an end surface of the second oxide semiconductor layer are covered with the third oxide semiconductor layer.

20. The semiconductor device according to claim 12, further comprising a second gate electrode layer between the insulating surface and the first insulating layer.

* * * * *